(12) United States Patent
Nam

(10) Patent No.: US 8,399,975 B2
(45) Date of Patent: Mar. 19, 2013

(54) STACKED SEMICONDUCTOR PACKAGE

(75) Inventor: Jong Hyun Nam, Icheon-si (KR)

(73) Assignee: SK Hynix Inc., Gyeonggi-do (KR ( * ) Notice: Subject to any disclaimer, the term of this patent is extended or adjusted under 35 U.S.C. 154(b) by 0 days.

(21) Appl. No.: 13/334,366

(22) Filed: Dec. 22, 2011

(65) Prior Publication Data

US 2012/0292787 A1    Nov. 22, 2012

(30) Foreign Application Priority Data

May 19, 2011    (KR) .................. 10-2011-0047448

(51) Int. Cl.
    *H01L 23/02*      (2006.01)
(52) U.S. Cl. ....................... 257/686; 257/777
(58) Field of Classification Search ............. 257/686, 257/777, 723, 724, 778
See application file for complete search history.

(56) References Cited

U.S. PATENT DOCUMENTS

| | | | |
|---|---|---|---|
| 6,528,870 B2* | 3/2003 | Fukatsu et al. ............. 257/685 |
| 2009/0134506 A1* | 5/2009 | Yamaguchi et al. ......... 257/686 |
| 2009/0166839 A1* | 7/2009 | Suzuki et al. ............... 257/686 |
| 2010/0181661 A1* | 7/2010 | Takemoto et al. ........... 257/686 |
| 2010/0200976 A1* | 8/2010 | Nishiyama et al. ......... 257/686 |
| 2010/0265751 A1* | 10/2010 | Hong ............................ 365/51 |
| 2010/0283140 A1* | 11/2010 | Kim et al. .................... 257/686 |
| 2010/0314740 A1* | 12/2010 | Choi et al. ................... 257/686 |

* cited by examiner

*Primary Examiner* — Sheila V. Clark
(74) *Attorney, Agent, or Firm* — William Park & Associates Ltd.

(57) ABSTRACT

A stacked semiconductor package includes a substrate having an upper surface and a lower surface, and divided into a first region and a second region that adjoins the first region; a support member formed in the second region on the upper surface of the substrate; and a semiconductor chip module including a plurality of semiconductor chips each of which is bent and has bonding pads near one lower edge of a declining slope of a first surface thereof and which are stacked on the support member in a step-like shape such that their bonding pads face the first region and are electrically connected with the substrate.

17 Claims, 46 Drawing Sheets

STACKED SEMICONDUCTOR PACKAGE

CROSS-REFERENCE TO RELATED APPLICATIONS

The present application claims priority to Korean patent application number 10-2011-47448 filed on May 19, 2011 which is incorporated herein by reference in its entirety.

BACKGROUND OF THE INVENTION

The present invention relates generally to a stacked semiconductor package.

Semiconductor chips that can quickly store and process a large volume of data can be included in a semiconductor package. A stacked semiconductor package having at least two stacked semiconductor chips on a substrate can improve not only the data storage capacity but also the data processing speed. The stacked semiconductor chips in a package need to be electrically connected to the substrate. Wire bonding method using wires and a flip-chip bonding method using bumps are two well known methods to accomplish the intended electrical connections.

Although the wire bonding method using wires for electrical connection is frequently used in a stack structure, it has a drawback in that the length of each wire electrically connecting each additional stacked chip is inevitably lengthened. This causes the signal transfer lengths to increase, which in turn deteriorates the electrical characteristics of the package and causes enlargement of the package size. Also, defects known as "sweeping of wires" can occur due to the increasingly lengthened wires. The flip-chip bonding method provides shorter signal transfer lengths than the wire bonding method, but it has been generally regarded as a difficult method achieving high integration due to certain limitations that hinder stacking.

BRIEF SUMMARY OF THE INVENTION

Embodiments of the present invention are directed to a stacked semiconductor package that is light, thin, compact, and miniaturized, with excellent electrical characteristics and high degree of integration capabilities.

In an embodiment of the present invention, a stacked semiconductor package includes a substrate having an upper surface and a lower surface. The substrate may comprise a first region adjoining a second region. A support member may be formed in the second region on the upper surface of the substrate. A semiconductor chip module including a plurality of semiconductor chips, each of which is bent and has bonding pads near one lower edge of a declining slope of a first surface thereof and which are stacked on the support member in a step-like shape such that their bonding pads face the first region and are electrically connected with the substrate.

The substrate may have a plurality of connection pads formed on the upper surface in the first region in such a manner that the connection pads are respectively connected with the bonding pads of the semiconductor chips.

The substrate may have a plurality of grooves defined on the upper surface in the first region in such a manner that the grooves respectively correspond to the connection pads, and the respective connection pads may be disposed on bottoms of corresponding grooves. Alternatively, the substrate may have a plurality of grooves defined on the upper surface in the first region in such a manner that each groove corresponds to several connection pads, and the respective connection pads may be disposed on bottoms of the grooves to be separated from one another.

The stacked semiconductor package may include connection members electrically connecting the bonding pads of the semiconductor chips and the connection pads of the substrate. The connection members may include, for example, bumps or solder balls.

The substrate may have a plurality of connection pads formed on the upper surface in the first region in such a manner that each connection pad is connected with bonding pads of the respective semiconductor chips.

The substrate may have a plurality of grooves defined on the upper surface in the first region in such a manner that the grooves correspond to the connection pads, and the connection pads may be disposed on bottoms of the grooves.

The stacked semiconductor package may include connection members electrically connecting the bonding pads of the semiconductor chips and the connection pads of the substrate.

The connection members may be formed to be separated from one another in such a manner that the connection members respectively correspond to the bonding pads of the semiconductor chips. Alternatively, the connection members may be continuously formed in such a manner that each connection member corresponds to bonding pads of the respective semiconductor chips.

The stacked semiconductor package may include fixing members formed on second surfaces of the respective semiconductor chips that face the first surfaces of the respective semiconductor chips, to fix the bent semiconductor chips. The fixing members may include, for example, a thermosetting resin.

The support member may include, for example, any one of a dummy wafer, a glass substrate, a spacer tape, an insulation substrate, and a solder resist. Unlike this, the support member may include, for example, an additional semiconductor chip. The additional semiconductor chip may have a thickness different from that of the semiconductor chips.

The substrate may have connection pads formed on the upper surface in the second region and electrically connected with the additional semiconductor chip.

The substrate may have a protruding part that supports the additional semiconductor chip on the upper surface in the second region outside the connection pads. Alternatively, the stacked semiconductor package may include an additional support member formed on the upper surface in the second region of the substrate outside the connection pads, and supporting the additional semiconductor chip.

In another embodiment of the present invention, a stacked semiconductor package includes a substrate having an upper surface and a lower surface, and divided into a first region, a second region, and a third region in which the second region is defined between the first and third regions. A support member may have a first support part formed in the second region and a second support part formed in the third region and has a thickness larger than the first support part. A semiconductor chip module may include a plurality of first semiconductor chips that have first bonding pads formed near one edge of first surfaces thereof and redistribution lines redistributing the first bonding pads to second surfaces facing away from the first surfaces. The plurality of first semiconductor chips may be stacked on the first support part in a step-like shape such that the first bonding pads face the declining slope of a first region of the substrate such that the first bonding pads are electrically connected with the substrate. An additional semiconductor chip module including a plurality of second semiconductor chips that have second bonding pads formed near one edges of the first surfaces thereof and are stacked on the second support part in a step-like shape such that the second bonding pads are electrically connected with the redistribution lines of the first semiconductor chips.

The substrate may have a plurality of connection pads formed on the upper surface in the first region in such a manner that the connection pads are respectively connected with the first bonding pads of the first semiconductor chips.

The substrate may have a plurality of grooves defined on the upper surface in the first region in such a manner that the grooves respectively correspond to the connection pads. The respective connection pads may be disposed on bottoms of corresponding grooves. Alternatively, the substrate may have a plurality of grooves defined on the upper surface in the first region in such a manner that each groove corresponds to several connection pads, and the respective connection pads may be disposed on bottoms of the grooves to be separated from one another.

The stacked semiconductor package may include connection members that electrically connect the first bonding pads of the first semiconductor chips and the connection pads of the substrate. The connection members may include, for example, bumps or solder balls.

The substrate may have a plurality of connection pads formed on the upper surface in the first region in such a manner that each connection pad is connected with first bonding pads of the respective first semiconductor chips.

The substrate may have a plurality of grooves defined on the upper surface in the first region in such a manner that the grooves correspond to the connection pads, and the connection pads may be disposed on bottoms of the grooves.

The stacked semiconductor package may include connection members that electrically connect the first bonding pads of the first semiconductor chips and the connection pads of the substrate.

The connection members may be formed to be separated from one another in such a manner that the connection members respectively correspond to the first bonding pads of the first semiconductor chips. Alternatively, the connection members may be continuously formed in such a manner that each connection member corresponds to first bonding pads of the respective first semiconductor chips.

The stacked semiconductor package may include fixing members formed on second surfaces of the respective first semiconductor chips facing the first surfaces of the respective first semiconductor chips, to fix the bent first semiconductor chips. The fixing members may include, for example, a thermosetting resin.

The support member may include, for example, any one of a dummy wafer, a glass substrate, a spacer tape, an insulation substrate, and a solder resist. Unlike this, the support member may include, for example, an additional semiconductor chip.

The first support part and the second support part of the support member may be formed separately from each other. The second support part may include, for example, any one of a dummy wafer, a glass substrate, a spacer tape, an insulation substrate and a solder resist, and the first support part may include, for example, an additional semiconductor chip. The additional semiconductor chip used as the first support part may have a different thickness from the first semiconductor chips.

The substrate may have connection pads formed on the upper surface in the second region that are electrically connected with the additional semiconductor chip. The substrate may have a protruding part that supports the additional semiconductor chip on the upper surface in the second region outside the connection pads. Alternatively, the stacked semiconductor package may include an additional support member formed on the upper surface in the second region of the substrate outside the connection pads, and supporting the additional semiconductor chip.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
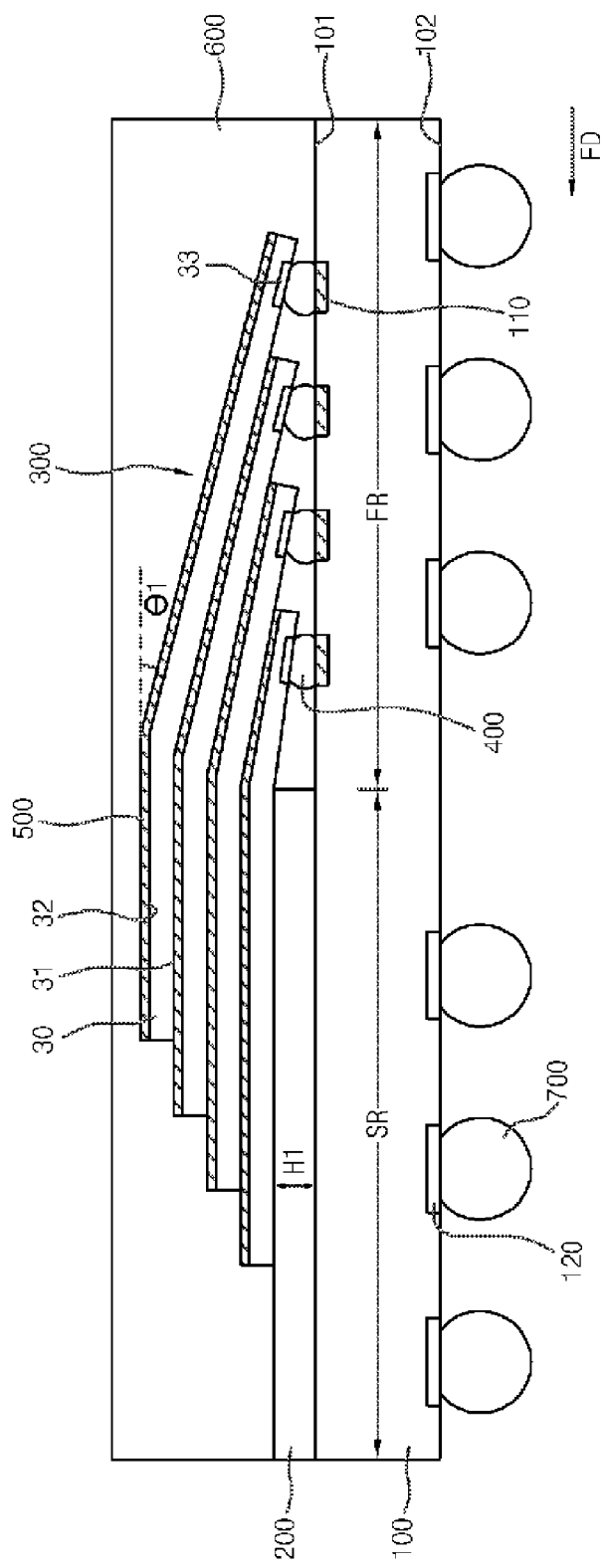
FIG. 1 is a cross-sectional view illustrating a stacked semiconductor package in accordance with a first embodiment of the present invention.
Figure 2:
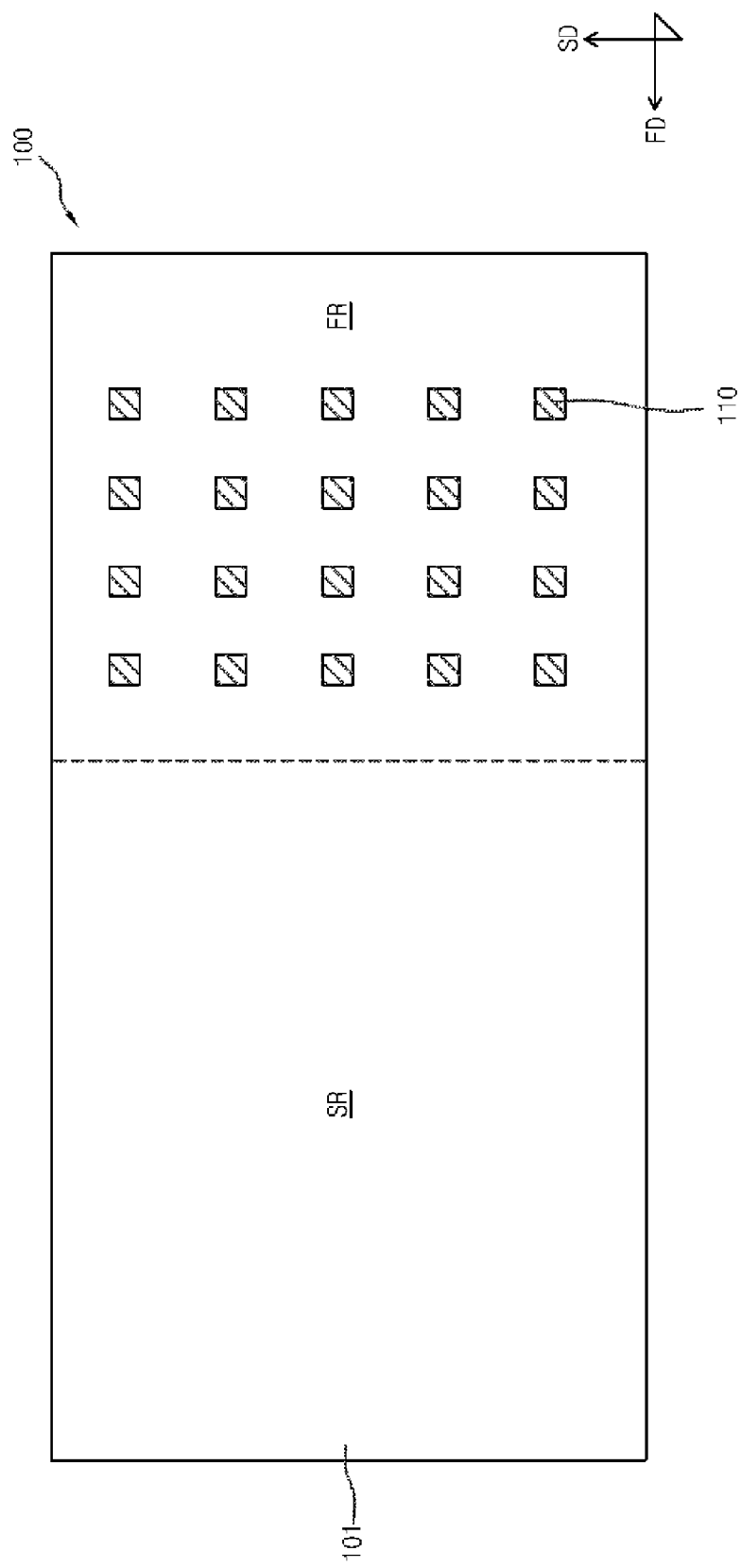
FIG. 2 is a plan view illustrating the substrate shown in FIG. 1.

FIG. 1 is a cross-sectional view illustrating a stacked semiconductor package in accordance with a first embodiment of the present invention, and FIG. 2 is a plan view illustrating the substrate shown in FIG. 1.

Referring to FIG. 1, the stacked semiconductor package in accordance with an embodiment of the present invention includes a substrate 100, a support member 200, and a semiconductor chip module 300. In addition, the stacked semiconductor package may further include connection members 400, fixing members 500, a molding part 600, and external connection terminals 700.

Referring to FIGS. 1 and 2, the substrate 100 may be, for example, a printed circuit board (PCB). The substrate 100 is divided into a first region FR and a second region SR, and has an upper surface 101, a lower surface 102, a plurality of connection pads 110, ball lands 120, and circuit wiring lines (not shown). The first region FR and the second region SR are defined along a first direction FD shown in FIGS. 1 and 2. The plurality of connection pads 110 are formed in the first region FR on the upper surface 101 of the substrate 100, and the ball lands 120 are formed on the lower surface 102 of the substrate 100. The circuit wiring lines are formed in the substrate 100 and are electrically connected with the connection pads 110 and the ball lands 120.

Referring to FIG. 1, the support member 200 is placed in the second region SR on the upper surface 101 of the substrate 100 and has a first height H1. In an embodiment of the present embodiment, the support member 200 is attached to the substrate 100 by the medium of an adhesive member (not shown), and may have been manufactured separately from the substrate 100. Alternatively, the support member 200 may be formed integrally with the substrate 100 when manufacturing the substrate 100, without being manufactured separately from the substrate 100. The support member 200 may be any one of a dummy wafer, a glass substrate, a spacer tape, and a solder resist. Alternatively, the support member 200 may be an additional semiconductor chip. The case in which an additional semiconductor chip is used as the support member 200 will be described later in detail with respect to the embodiments shown in FIGS. 12 to 22.

The semiconductor chip module 300 includes a plurality of semiconductor chips 30. Each semiconductor chip 30 has a first surface 31, a second surface 32, and bonding pads 33. The first surface 31 faces away from the second surface 32, and the bonding pads 33 are formed near an edge of the first surface 31. The semiconductor chips 30 are stacked on the support member 200 in a step-like shape such that the bonding pads 33 of the respective semiconductor chips 30 face the declining slope of a first region FR of the substrate 100, such that the bonding pads 33 of the respective semiconductor chips 30 are electrically connected with the connection pads 110 of the substrate 100. The connection pads 110 may be described as being a dot type.

An angle θ1 at which the semiconductor chips 30 are bent is determined depending upon the height H1 of the support member 200. If the height H1 increases, the bending angle θ1 of the semiconductor chips 30 increases, and the area occupied by the semiconductor chip module 300 decreases. Accordingly, it is possible to modify the area of the stacked semiconductor package. However, if the height H1 increases, the thickness of the stacked semiconductor package increases. Conversely, if the height H1 of the support member 200 decreases, the bending angle θ1 decreases, and the area occupied by the semiconductor chip module 300 increases. Therefore, it may be desirable to appropriately adjust the height H1 of the support member 200 in consideration of these factors.

The connection members 400 electrically connect the connection pads 110 of the substrate 100 and the bonding pads 33 of the semiconductor chips 30. Each connection member 400 may include, for example, a bump or a solder ball.

While not shown in a drawing, adhesive members are formed between the support member 200 and the semiconductor chip module 300 and between the semiconductor chips 30. The adhesive members include adhesive tape or adhesive paste.

The fixing members 500 are formed on the second surfaces 32 of the respective semiconductor chips 30, and fix the bent semiconductor chips 30 such that the shapes of the bent semiconductor chips 30 are maintained. The fixing members 500 may include, for example, a thermosetting resin. The fixing members 500, which are formed, for example, of a thermosetting resin, are set hard by heat applied when bending the semiconductor chips 30. Due to this fact, the bent semiconductor chips 30 are fixed in their bent shape by the fixing members 500.

The molding part 600 seals the upper surface 101 of the substrate 100 including the semiconductor chip module 300. The molding part 600 may include, for example, an epoxy molding compound (EMC).

The external connection terminals 700 are mounted to the ball lands 120 of the substrate 100. The external connection terminals 700 may include, for example, solder balls.

Figure 3:
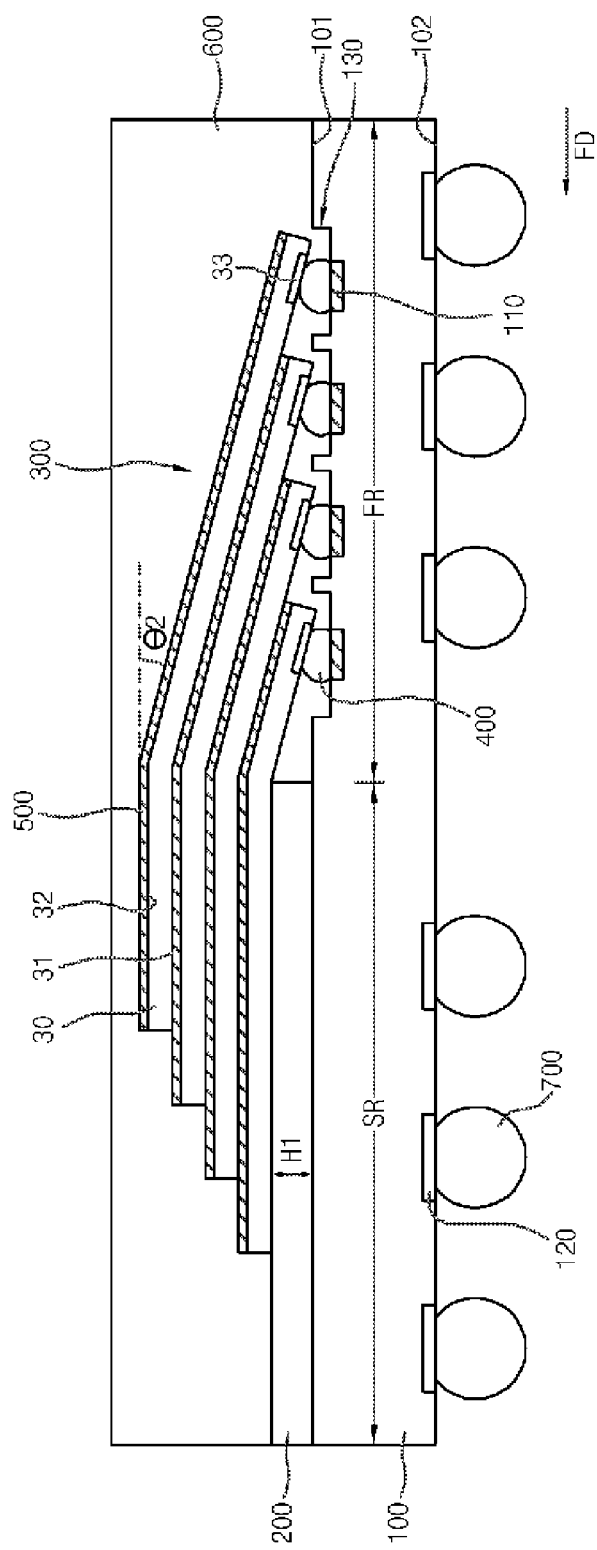
FIG. 3 is a cross-sectional view illustrating a stacked semiconductor package in accordance with a second embodiment of the present invention.
Figure 4:
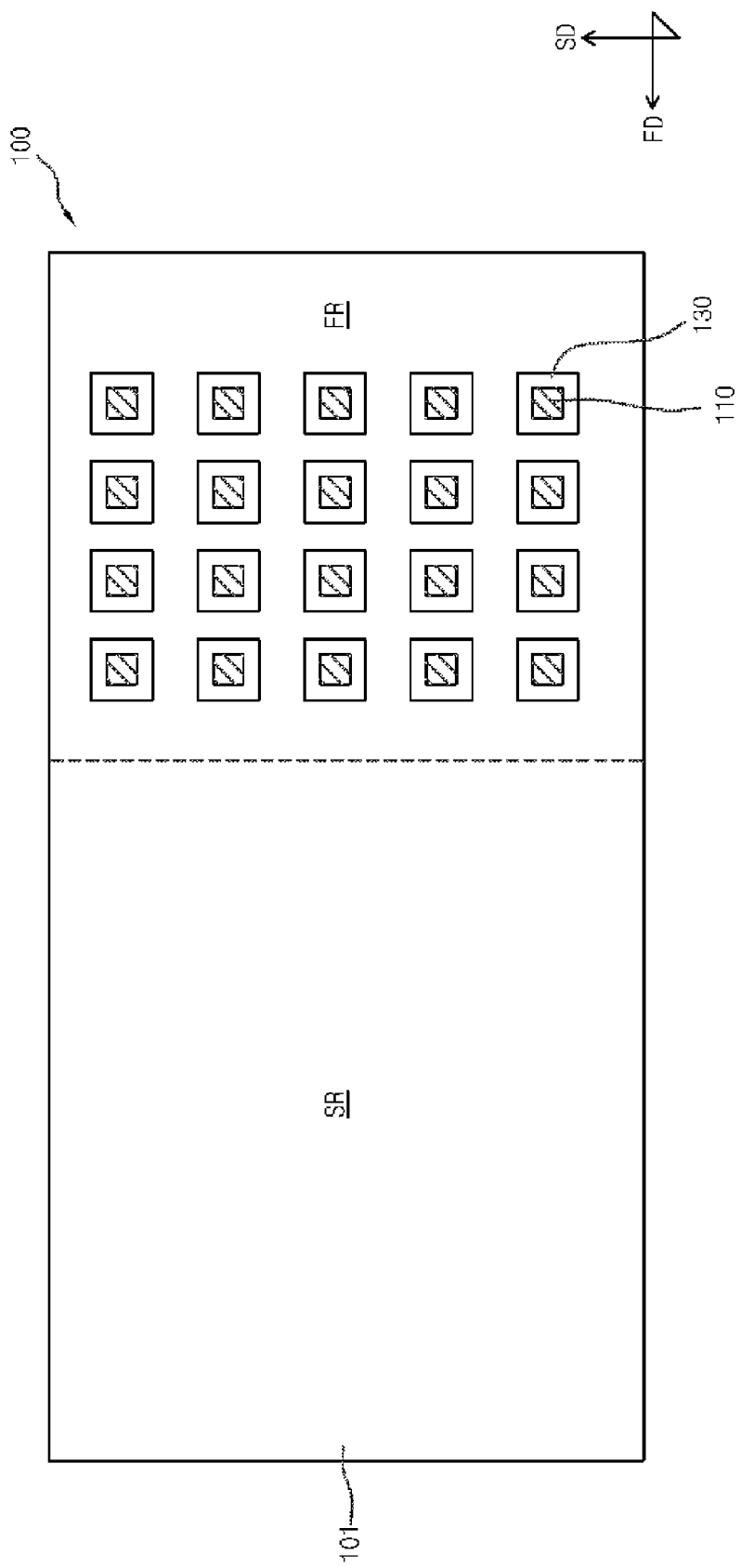
FIG. 4 is a plan view illustrating the substrate shown in FIG. 3.

FIG. 3 is a cross-sectional view illustrating a stacked semiconductor package in accordance with a second embodiment of the present invention, and FIG. 4 is a plan view illustrating the substrate shown in FIG. 3.

The stacked semiconductor package in accordance with the second embodiment of the present invention has a configuration in which grooves 130 are additionally defined in the substrate 100 of the stacked semiconductor package according to the first embodiment of the present invention described above with reference to FIGS. 1 and 2. Hence, the stacked semiconductor package according to the second embodiment of the present invention has substantially the same configuration with respect to the stacked semiconductor package according to the first embodiment except for the substrate 100. Therefore, repeated descriptions for the same component elements will be omitted herein, and the same terms and the same reference numerals will be used to refer to the same component parts.

Referring to FIGS. 3 and 4, in the present embodiment, a substrate 100 is divided into a first region FR and a second region SR, and has an upper surface 101, a lower surface 102, a plurality of connection pads 110, ball lands 120, a plurality of grooves 130, and circuit wiring lines (not shown).

The plurality of grooves 130 are defined on the upper surface 101 of the substrate 100 in such a way as to respectively correspond to the connection pads 110. The connection pads 110 are correspondingly disposed on the bottoms of the respective grooves 130. Each connection pad 110 may be described as being a dot type.

In the present embodiment, the connection pads 110 are formed at lower positions than in the first embodiment. Thus, when a height H1 of a support member 200 is constant, a bending angle θ2 of semiconductor chips 30 in the present embodiment is larger than the bending angle θ1 of the semiconductor chips 30 in the first embodiment. As a consequence, in the present embodiment, the area occupied by a semiconductor chip module 300 may be reduced without increasing the height H1 of the support member 200.

Figure 5:
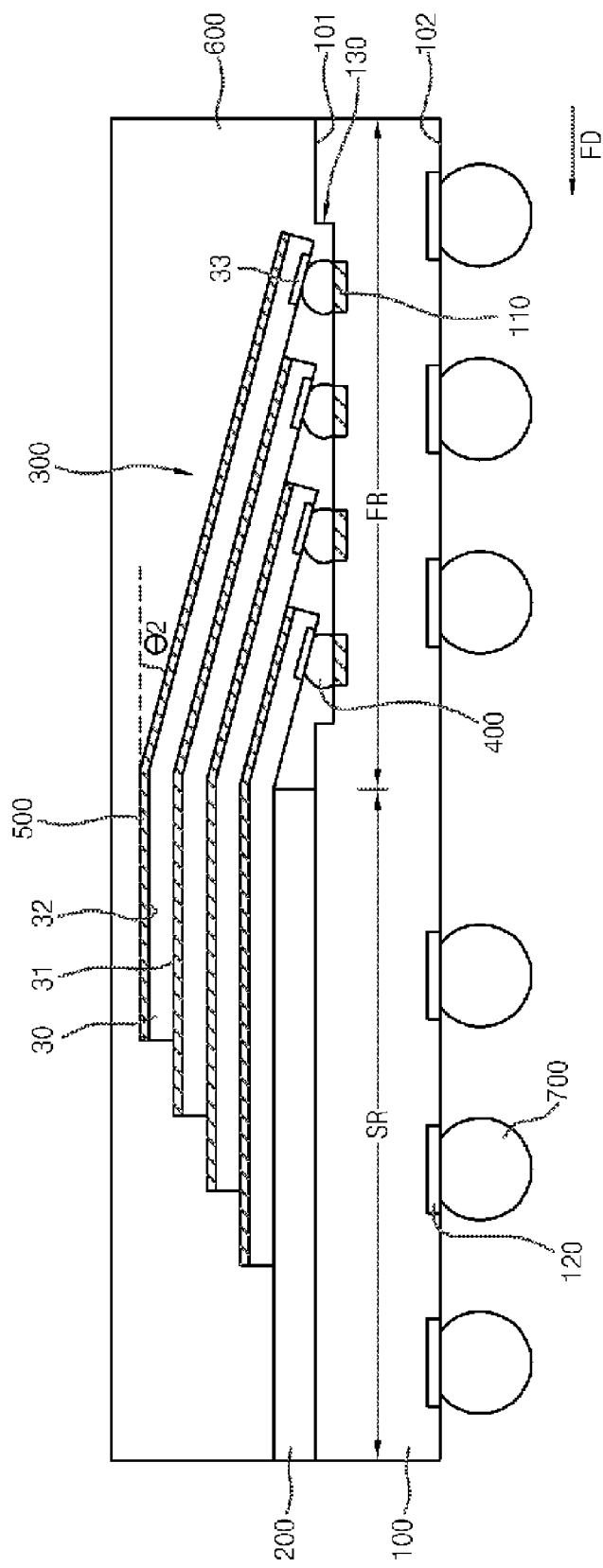
FIG. 5 is a cross-sectional view illustrating a stacked semiconductor package in accordance with a third embodiment of the present invention.
Figure 6:
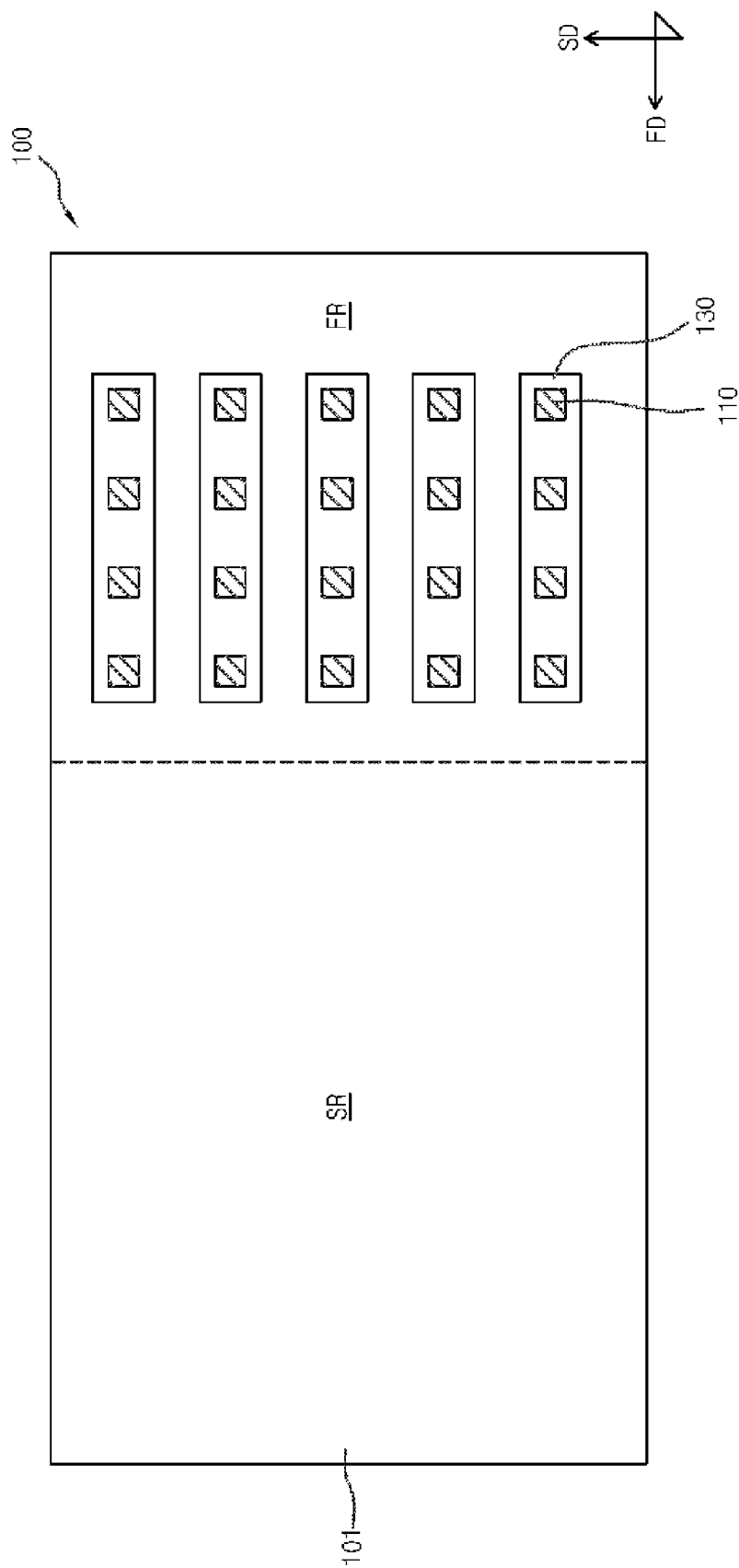
FIG. 6 is a plan view illustrating the substrate shown in FIG. 5.

FIG. 5 is a cross-sectional view illustrating a stacked semiconductor package in accordance with a third embodiment of the present invention, and FIG. 6 is a plan view illustrating the substrate shown in FIG. 5.

The stacked semiconductor package in accordance with the third embodiment of the present invention has a structure in which the shapes of the grooves 130 are changed with respect to the stacked semiconductor package according to the second embodiment of the present invention described above with reference to FIGS. 3 and 4. Hence, the stacked semiconductor package according to the third embodiment of the present invention has substantially the same configuration as the stacked semiconductor package according to the second embodiment except for the grooves 130. Therefore, repeated descriptions for the same component elements will be omitted herein, and the same terms and the same reference numerals will be used to refer to the same component parts.

Referring to FIGS. 5 and 6, in the present embodiment, grooves 130 are defined in the shapes of lines extending in a first direction FD in such a manner that each groove 130 corresponds to a plurality of connection pads 110 arranged along the first direction FD. Connection pads 110 are correspondingly disposed on the bottoms of the grooves 130 in such a way as to be separated from one another. Each connection pad 110 may be described as being a dot type.

In the case where a gap between the connection pads 110 is narrow, it is difficult to define the grooves 130 as in the second embodiment in such a way as to respectively correspond to the connection pads 110. The present embodiment may be applied even when a gap between the connection pads 110 is narrow, since each groove 130 has the shape of a line to correspond to the plurality of connection pads 110.

Figure 7:
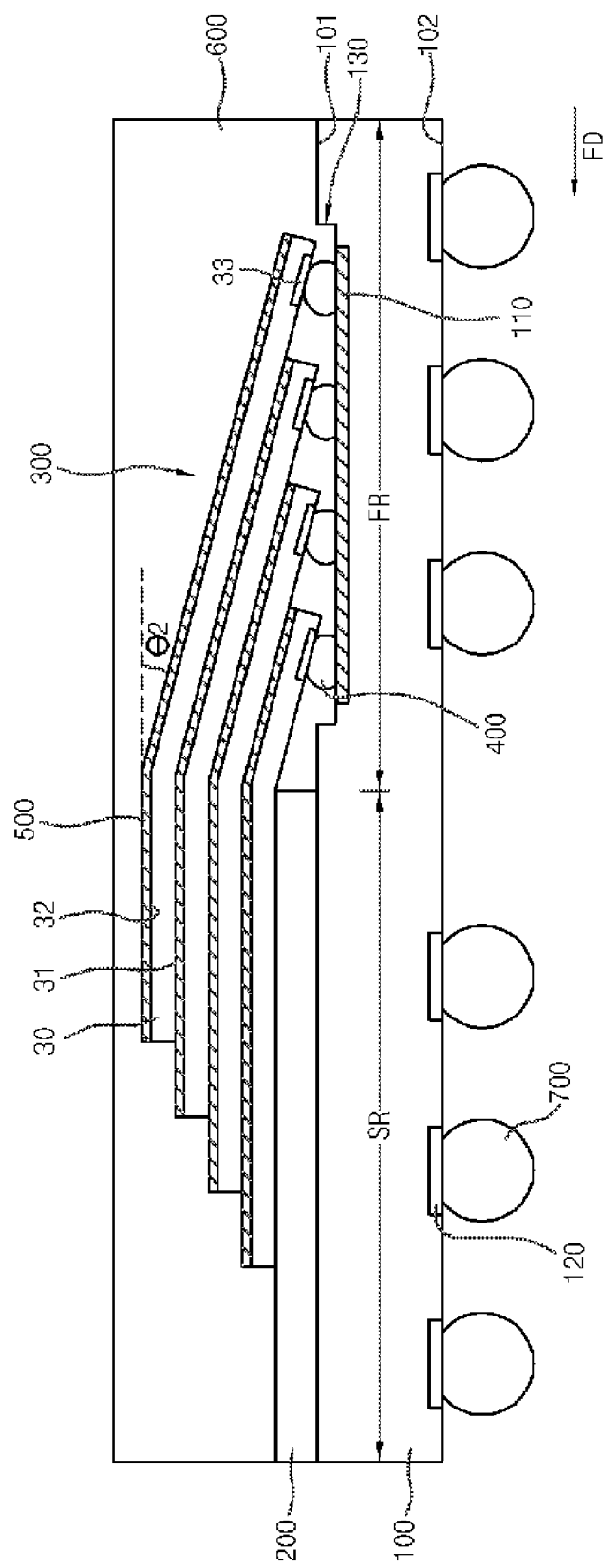
FIG. 7 is a cross-sectional view illustrating a stacked semiconductor package in accordance with a fourth embodiment of the present invention.
Figure 8:
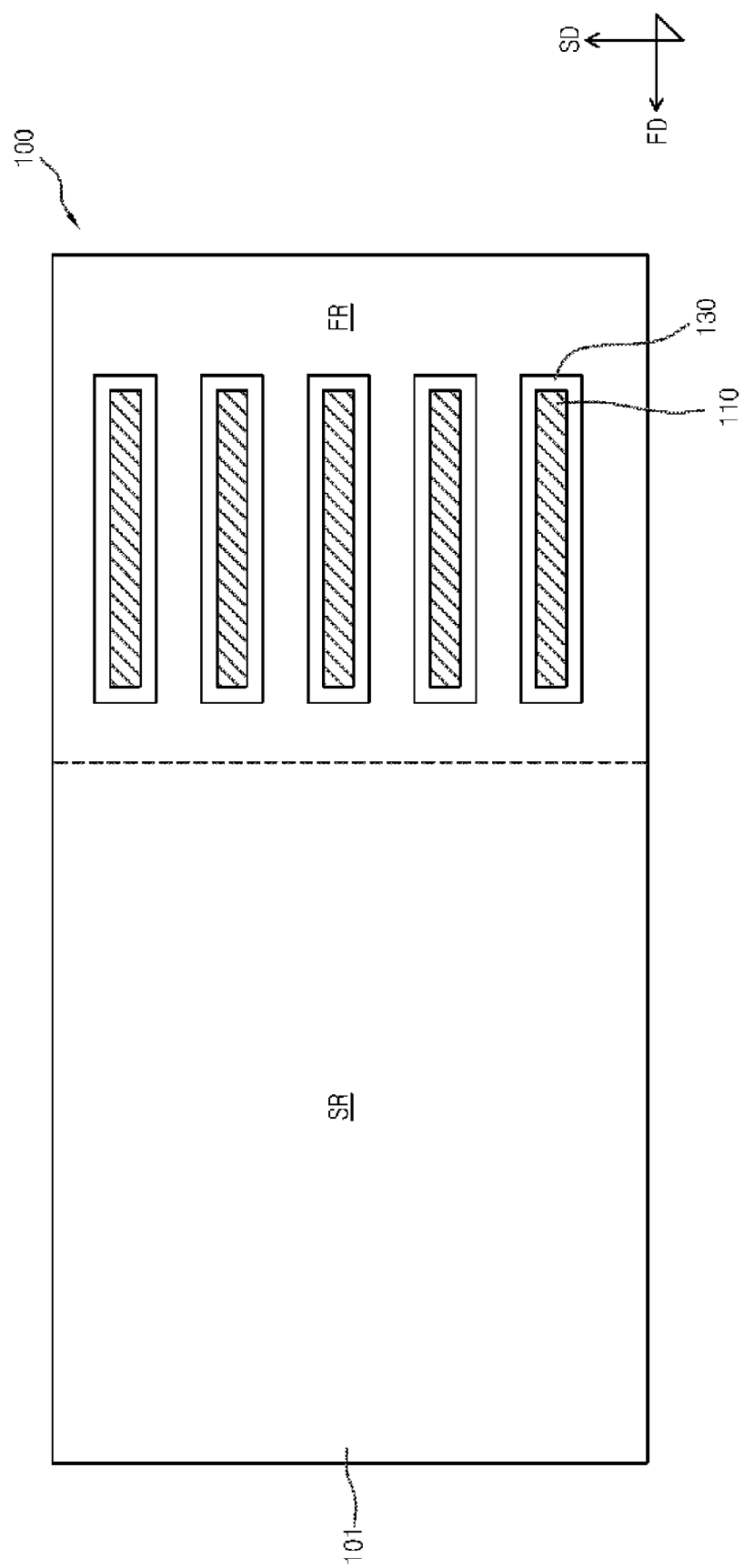
FIG. 8 is a plan view illustrating the substrate shown in FIG. 7.

FIG. 7 is a cross-sectional view illustrating a stacked semiconductor package in accordance with a fourth embodiment of the present invention, and FIG. 8 is a plan view illustrating the substrate shown in FIG. 7.

The stacked semiconductor package in accordance with the fourth embodiment of the present invention has a structure in which the shapes of the connection pads 110 are changed with respect to the stacked semiconductor package according to the third embodiment of the present invention described above with reference to FIGS. 5 and 6. Hence, the stacked semiconductor package according to the fourth embodiment of the present invention has substantially the same configuration as the stacked semiconductor package according to the third embodiment except for the connection pads 110. Therefore, repeated descriptions for the same component elements will be omitted herein, and the same terms and the same reference numerals will be used to refer to the same component parts.

Referring to FIGS. 7 and 8, connection pads 110 are formed in a first region FR of a substrate 100 in the shapes of lines extending in a first direction FD. Each connection pad 110 is electrically connected with bonding pads 33 of semiconductor chips 30.

Grooves 130 are defined in the first region FR on an upper surface 101 of the substrate 100, in the shapes of lines which respectively correspond to the connection pads 110. The connection pads 110 are correspondingly disposed on the bottoms of the respective grooves 130. Connection members 400 electrically connect bonding pads 33 of the semiconductor chips 30 and the connection pads 110 of the substrate 100. In the present embodiment, the connection members 400 are separately formed to respectively correspond to the bonding pads 33 of the semiconductor chips 30. For example, the connection members 400 may include bumps or solder balls.

In the third embodiment of the present invention described above with reference to FIGS. 5 and 6, since the connection pads 110 are formed as dot types, if the bending angle $\theta 2$ of the semiconductor chips 30 is out of a predetermined range, the bonding pads 33 of the semiconductor chips 30 and the connection pads 110 of the substrate 100 are unlikely to be electrically connected with each other. Hence, the bending angle $\theta 2$ of the semiconductor chips 30 should be appropriately controlled. In the present embodiment, since the connection pads 110 are formed in the shapes of lines, even when the bending angle $\theta 2$ of the semiconductor chips 30 is not precisely controlled, the bonding pads 33 of the semiconductor chips 30 and the connection pads 110 of the substrate 100 can be electrically connected with each other.

Figure 9:
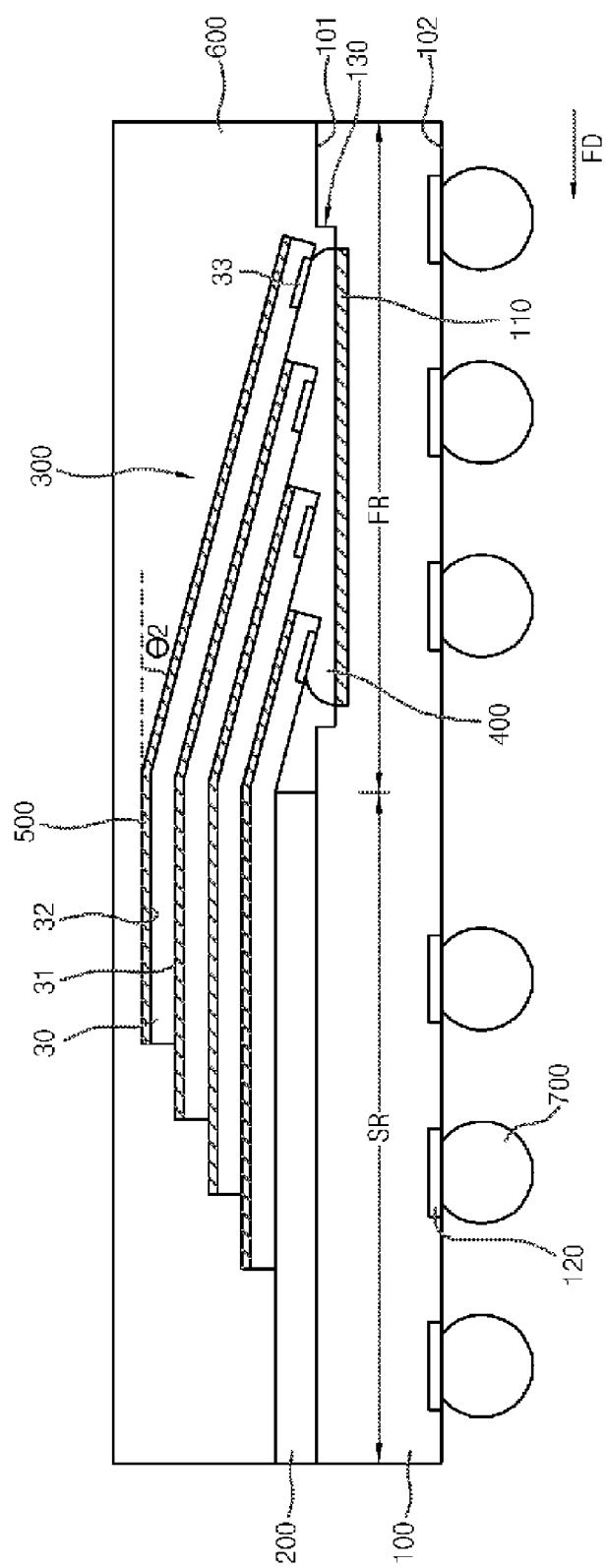
FIG. 9 is a cross-sectional view illustrating a stacked semiconductor package in accordance with a fifth embodiment of the present invention.

FIG. 9 is a cross-sectional view illustrating a stacked semiconductor package in accordance with a fifth embodiment of the present invention.

The stacked semiconductor package in accordance with the fifth embodiment of the present invention has a structure in which the shapes of the connection members 400 are changed with respect to the stacked semiconductor package according to the fourth embodiment of the present invention described above with reference to FIGS. 7 and 8. Hence, the stacked semiconductor package according to the fifth embodiment of the present invention has substantially the same configuration as the stacked semiconductor package according to the fourth embodiment except for the connection members 400. Therefore, repeated descriptions for the same component elements will be omitted herein, and the same terms and the same reference numerals will be used to refer to the same component parts.

Referring to FIG. 9, in the present embodiment, connection members 400 electrically connect bonding pads 33 of semiconductor chips 30 and connection pads 110 of a substrate 100, and are continuously formed on the connection pads 110 to correspond to the bonding pads 33 of the semiconductor chips 30. For example, the connection members 400 may include conductive paste or conductive tape.

In the present embodiment, when compared to the fourth embodiment, since the areas of the connection members 400 to contact the substrate 100 and the semiconductor chips 30 are increased, the junction strengths of the connection members 400 can be improved.

Figure 10:
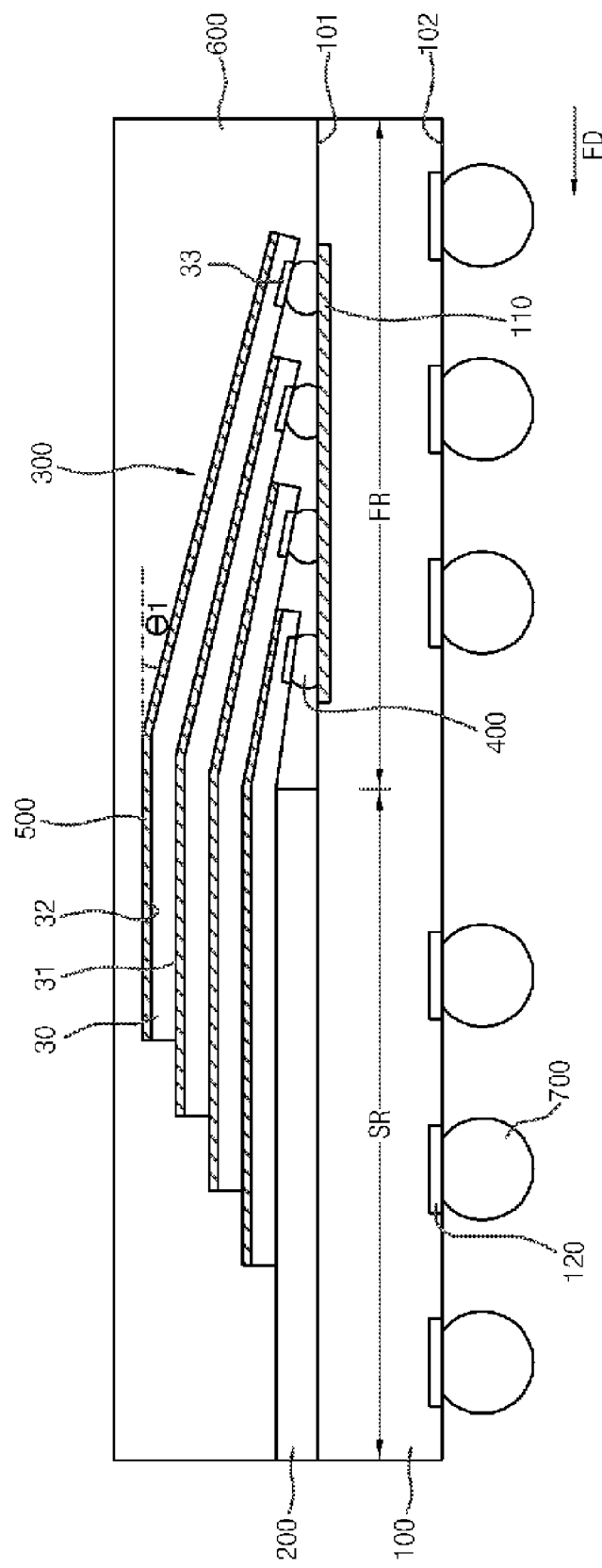
FIG. 10 is a cross-sectional view illustrating a stacked semiconductor package in accordance with a sixth embodiment of the present invention.

FIG. 10 is a cross-sectional view illustrating a stacked semiconductor package in accordance with a sixth embodiment of the present invention.

The stacked semiconductor package in accordance with the sixth embodiment of the present invention has a structure in which the shapes of the connection pads 110 are changed with respect to the stacked semiconductor package according to the first embodiment of the present invention described above with reference to FIGS. 1 and 2. Hence, the stacked semiconductor package according to the sixth embodiment of the present invention has substantially the same configuration as the stacked semiconductor package according to the first embodiment except for the connection pads 110. Therefore, repeated descriptions for the same component elements will be omitted herein, and the same terms and the same reference numerals will be used to refer to the same component parts.

Referring to FIG. 10, in the present embodiment, connection pads 110 are formed in a first region FR of a substrate 100 in the shapes of lines extending in a first direction FD, and are electrically connected with bonding pads 33 of a plurality of semiconductor chips 30 that constitute a semiconductor chip module 300.

Connection members 400 electrically connect the bonding pads 33 of the semiconductor chips 30 and the connection pads 110 of the substrate 100. In the present embodiment, the connection members 400 are separately formed to respectively correspond to the bonding pads 33 of the semiconductor chips 30. For example, the connection members 400 may include bumps or solder balls.

In the first embodiment of the present invention described above with reference to FIGS. 1 and 2, since the connection pads 110 are formed as dot types, if the bending angle $\theta 1$ of the semiconductor chips 30 is out of a predetermined range, a fail may be caused in that the bonding pads 33 of the semiconductor chips 30 and the connection pads 110 of the substrate 100 are unlikely to be electrically connected with each other. Hence, the bending angle $\theta 1$ of the semiconductor chips 30 should be appropriately controlled. In the present embodiment, since the connection pads 110 are formed in the shapes of lines, even when the bending angle $\theta 1$ of the semiconductor chips 30 is not precisely controlled, the bonding pads 33 of the semiconductor chips 30 and the connection pads 110 of the substrate 100 can be electrically connected with each other.

Figure 11:
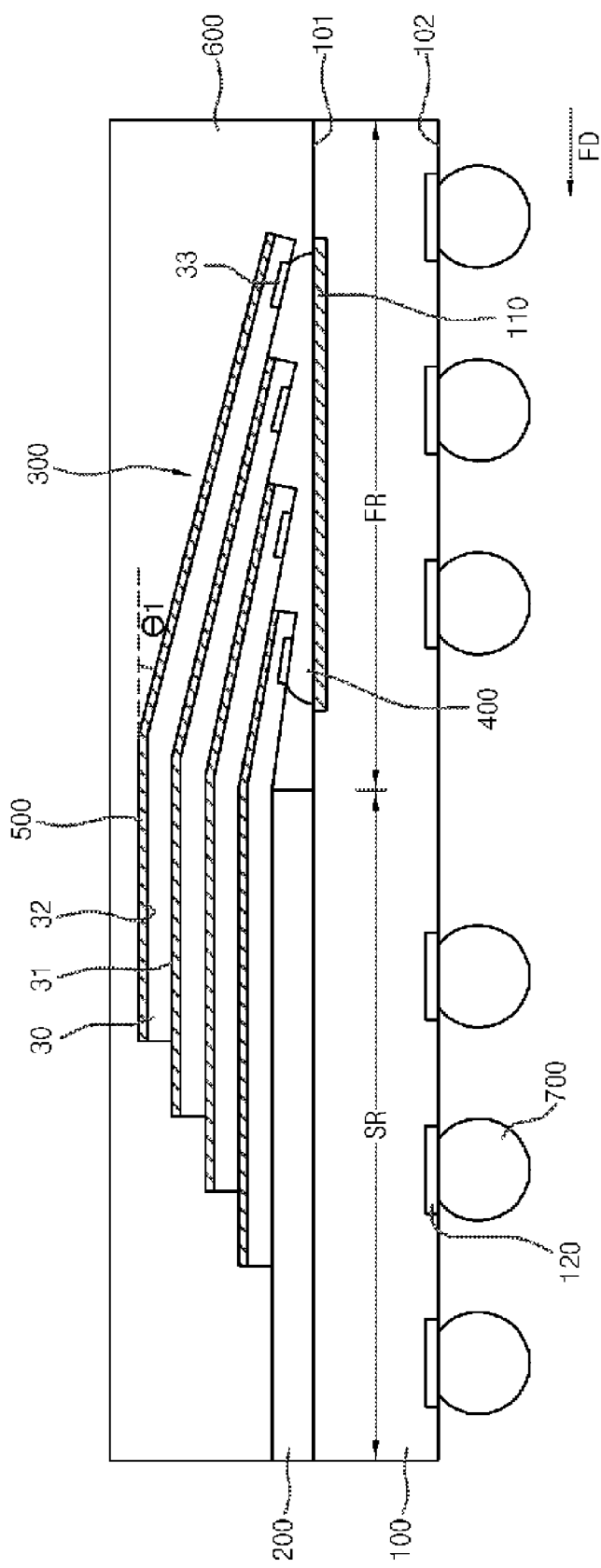
FIG. 11 is a cross-sectional view illustrating a stacked semiconductor package in accordance with a seventh embodiment of the present invention.

FIG. 11 is a cross-sectional view illustrating a stacked semiconductor package in accordance with a seventh embodiment of the present invention.

The stacked semiconductor package in accordance with the seventh embodiment of the present invention has a structure in which the shapes of the connection members 400 are changed with respect to the stacked semiconductor package according to the sixth embodiment of the present invention described above with reference to FIG. 10. Hence, the stacked semiconductor package according to the seventh embodiment of the present invention has substantially the same configuration as the stacked semiconductor package according to the sixth embodiment except the connection members 400. Therefore, repeated descriptions for the same component elements will be omitted herein, and the same terms and the same reference numerals will be used to refer to the same component parts.

Referring to FIG. 11, in the present embodiment, connection members 400 electrically connect bonding pads 33 of semiconductor chips 30 and connection pads 110 of a substrate 100, and are continuously formed on the connection pads 110 to correspond to the bonding pads 33 of the semiconductor chips 30. For example, the connection members 400 may include conductive paste or conductive tape.

In the present embodiment, when compared to the sixth embodiment, since the areas of the connection members 400 to contact the substrate 100 and the semiconductor chips 30 are increased, the junction strengths of the connection members 400 can be improved.

Figure 12:
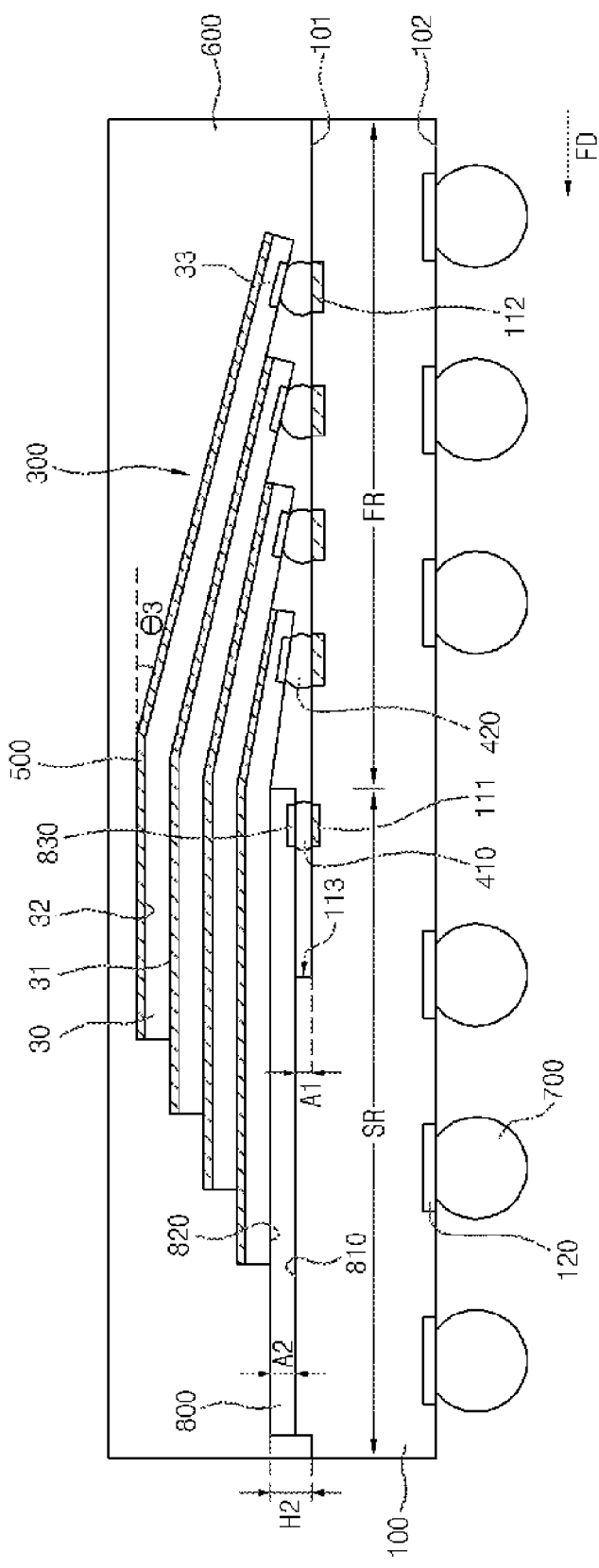
FIG. 12 is a cross-sectional view illustrating a stacked semiconductor package in accordance with an eighth embodiment of the present invention.
Figure 13:
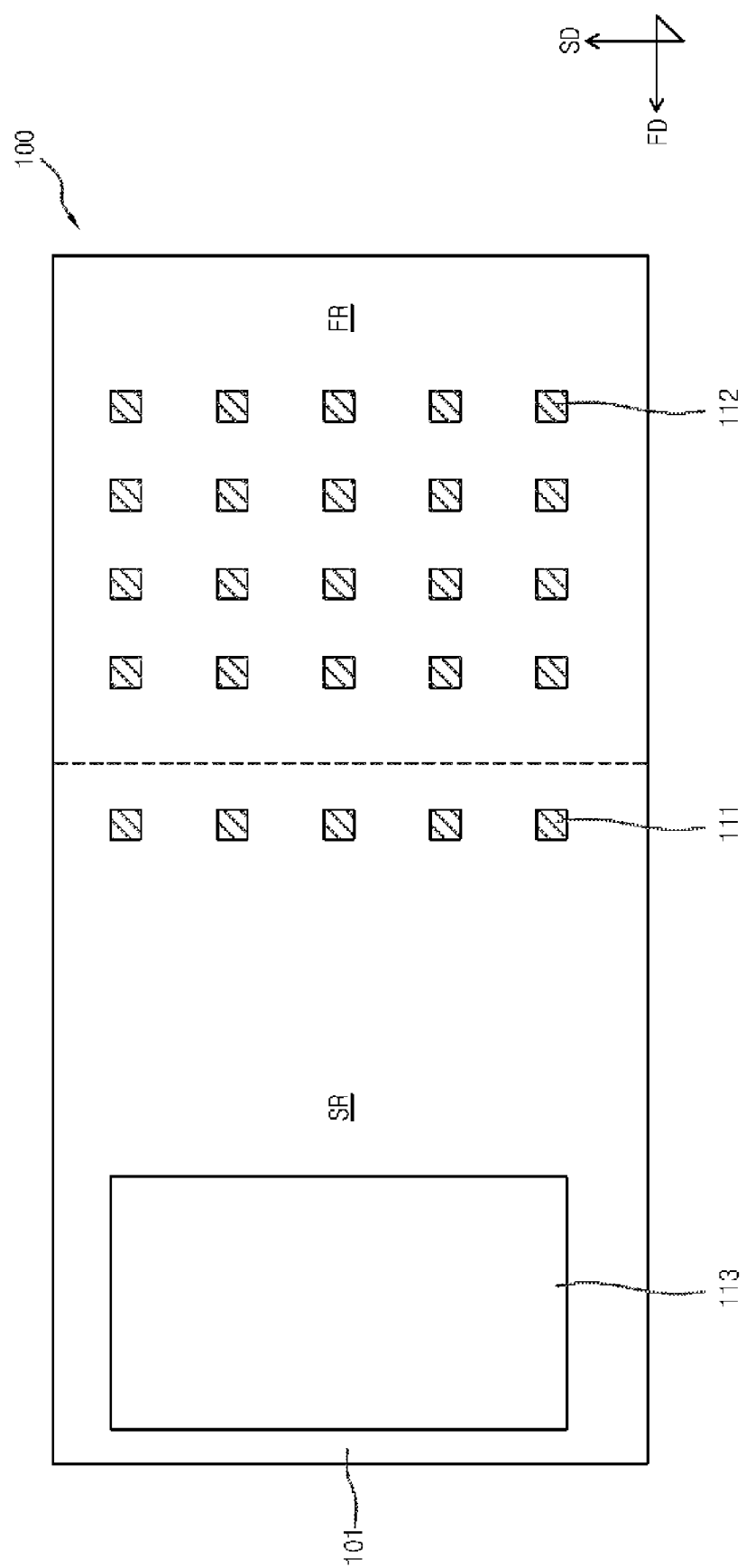
FIG. 13 is a plan view illustrating the substrate shown in FIG. 12.

FIG. 12 is a cross-sectional view illustrating a stacked semiconductor package in accordance with an eighth embodiment of the present invention, and FIG. 13 is a plan view illustrating the substrate shown in FIG. 12.

Referring to FIG. 12, the stacked semiconductor package in accordance with the eighth embodiment of the present invention includes a substrate 100, an additional semiconductor chip 800, and a semiconductor chip module 300. In addition, the stacked semiconductor package further includes first and second connection members 410 and 420, fixing members 500, a molding part 600, and external connection terminals 700.

Referring to FIGS. 12 and 13, the substrate 100 may be, for example, a printed circuit board (PCB). In the present embodiment, the substrate 100 is divided into a first region FR and a second region SR, and has an upper surface 101, a lower surface 102, first connection pads 111, second connection pads 112, a protruding part 113, ball lands 120, and circuit wiring lines (not shown).

The first region FR and the second region SR are sequentially defined along a first direction FD shown in FIGS. 12 and 13.

The first connection pads 111 are formed near an edge of the second region SR adjacent to the first region FR, on the upper surface 101 of the substrate 100. The second connection pads 112 are formed in the first region FR on the upper surface 101 of the substrate 100, and the protruding part 113 is formed in the second region SR on the upper surface 101 of the substrate 100 outside the first connection pads 111. The ball lands 120 are formed on the lower surface 102 of the substrate 100. The circuit wiring lines are formed in the substrate 100 and are electrically connected with the first connection pads 111, the second connection pads 112, and the ball lands 120.

Referring to FIG. 12, the additional semiconductor chip 800 has a first surface 810, a second surface 820, and bonding pads 830. The first surface 810 faces away from the second surface 820, and the bonding pads 830 are formed near an edge of the first surface 810.

The additional semiconductor chip 800 is mounted in the second region SR on the upper surface 101 of the substrate 100. In detail, the additional semiconductor chip 800 is supported by the protruding part 113 and is disposed on the protruding part 113 in such a way as to define the shape of a step in such a manner that the bonding pads 830 face the first connection pads 111 of the substrate 100.

The additional semiconductor chip 800 is disposed in the shape of a step on the protruding part 113 such that the bonding pads 830 face the first connection pads 111 of the substrate 100 with the additional semiconductor chip 800 supported by the protruding part 113 of the substrate 100.

In the present embodiment, the additional semiconductor chip 800 embodies the case in which it is used similarly as the support member 200 of the first to seventh embodiments described above with reference to FIGS. 1 to 11.

The first connection members 410 electrically connect the first connection pads 111 of the substrate 100 with the bonding pads 830 of the additional semiconductor chip 800. The first connection members 410 may include, for example, bumps or solder balls.

The semiconductor chip module 300 includes a plurality of semiconductor chips 30. Each semiconductor chip 30 has a first surface 31, a second surface 32, and bonding pads 33. The first surface 31 faces away from the second surface 32, and the bonding pads 33 are formed near one edge of the first surface 31.

The semiconductor chips 30 are stacked on the additional semiconductor chip 800 in a step-like shape such that bonding pads 33 of the respective semiconductor chips 30 face the declining slope of a first region FR of the substrate 100, such that the bonding pads 33 of the respective semiconductor chips 30 are electrically connected with the second connection pads 112 of the substrate 100.

An angle θ3 at which the semiconductor chips 30 are bent is determined depending upon a height H2 from the upper surface 101 of the substrate 100 to the second surface 820 of the additional semiconductor chip 800.

If the height H2 increases, the bending angle θ3 increases, the area occupied by the semiconductor chip module 300 decreases, hence reducing the area of the stacked semiconductor package. However, if the height H2 increases, the thickness of the stacked semiconductor package increases. If the height H2 decreases, although the thickness of the stacked semiconductor package can be reduced, the bending angle θ3 decreases, and the area occupied by the semiconductor chip module 300 increases. Therefore, it may be desirable to appropriately adjust the height H2 in consideration of these factors.

The height H2 corresponds to the sum of a height A1 of the protruding part 113 of the substrate 100 and a thickness A2 of the additional semiconductor chip 800. Thus, in order to adjust the height H2, A1 or A2 should be adjusted. The pitch of the first connection members 410 changes depending upon the magnitude of A1. If A1 decreases and the pitch of the first connection members 410 decreases, the junction strength of the first connection members 410 deteriorates. Conversely, if A1 increases and the pitch of the first connection members 410 increases, a fail may occur due to a bridge phenomenon in which adjoining first connection members 410 short-circuit to each other. Therefore, limitations exist in adjusting the value of A1. Hence, it may be preferred that the height H2 be adjusted through adjusting the thickness A2 of the additional semiconductor chip 800. For this reason, the additional semiconductor chip 800 may have a thickness different from that of the semiconductor chips 30.

The second connection members 420 electrically connect the bonding pads 33 of the semiconductor chips 30 and the second connection pads 112 of the substrate 100.

While not shown, adhesive members are formed between the additional semiconductor chip 800 and the semiconductor chip module 300 and between the semiconductor chips 30. The adhesive members may include, for example, adhesive tape or adhesive paste.

The fixing members 500 are formed on the second surfaces 32 of the respective semiconductor chips 30, and fix the bent semiconductor chips 30 such that the shapes of the bent semiconductor chips 30 are maintained. The fixing members 500 may include, for example, a thermosetting resin. That is to say, the fixing members 500, may set hard by the heat applied when bending the semiconductor chips 30. Accordingly, the bent semiconductor chips 30 may be fixed by the fixing members 500 and may be prevented from returning to their original shapes.

The molding part 600 seals the upper surface 101 of the substrate 100 including the additional semiconductor chip 800 and the semiconductor chip module 300. The molding part 600 may include an epoxy molding compound (EMC).

The external connection terminals 700 are mounted to the ball lands 120 of the substrate 100. The external connection terminals 700 may include solder balls.

Figure 14:
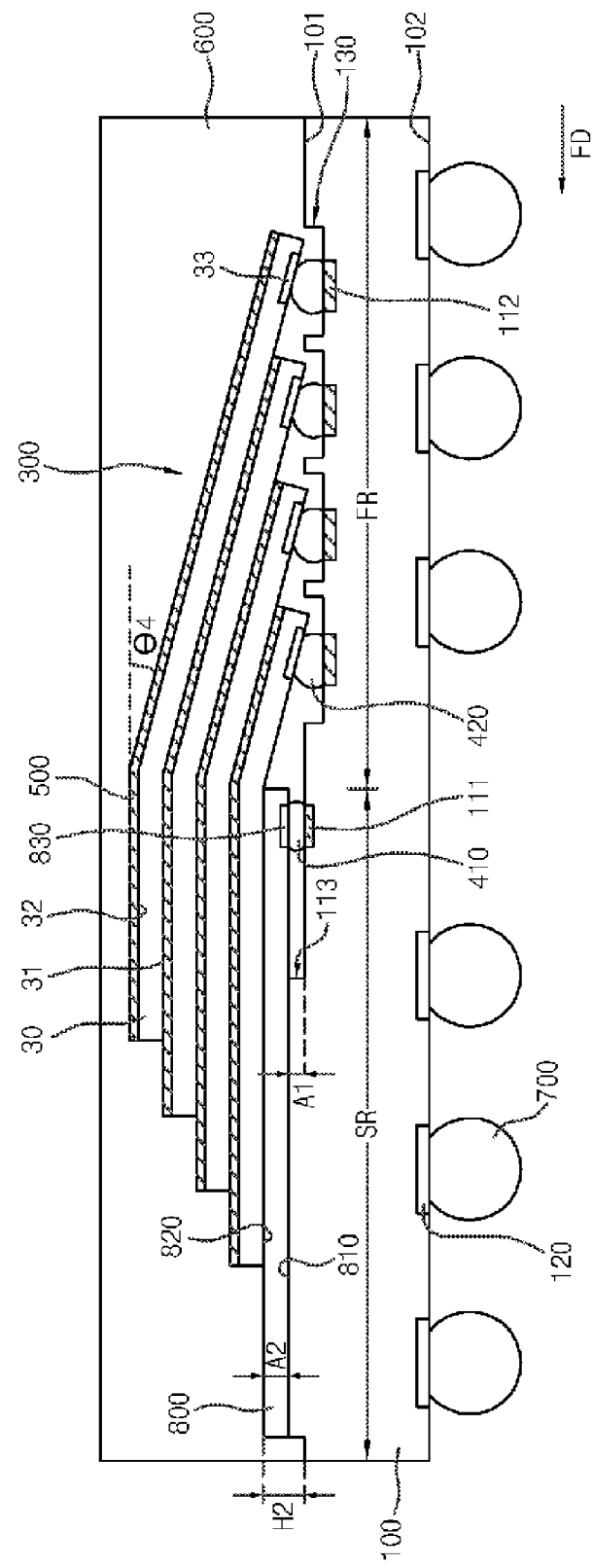
FIG. 14 is a cross-sectional view illustrating a stacked semiconductor package in accordance with a ninth embodiment of the present invention.
Figure 15:
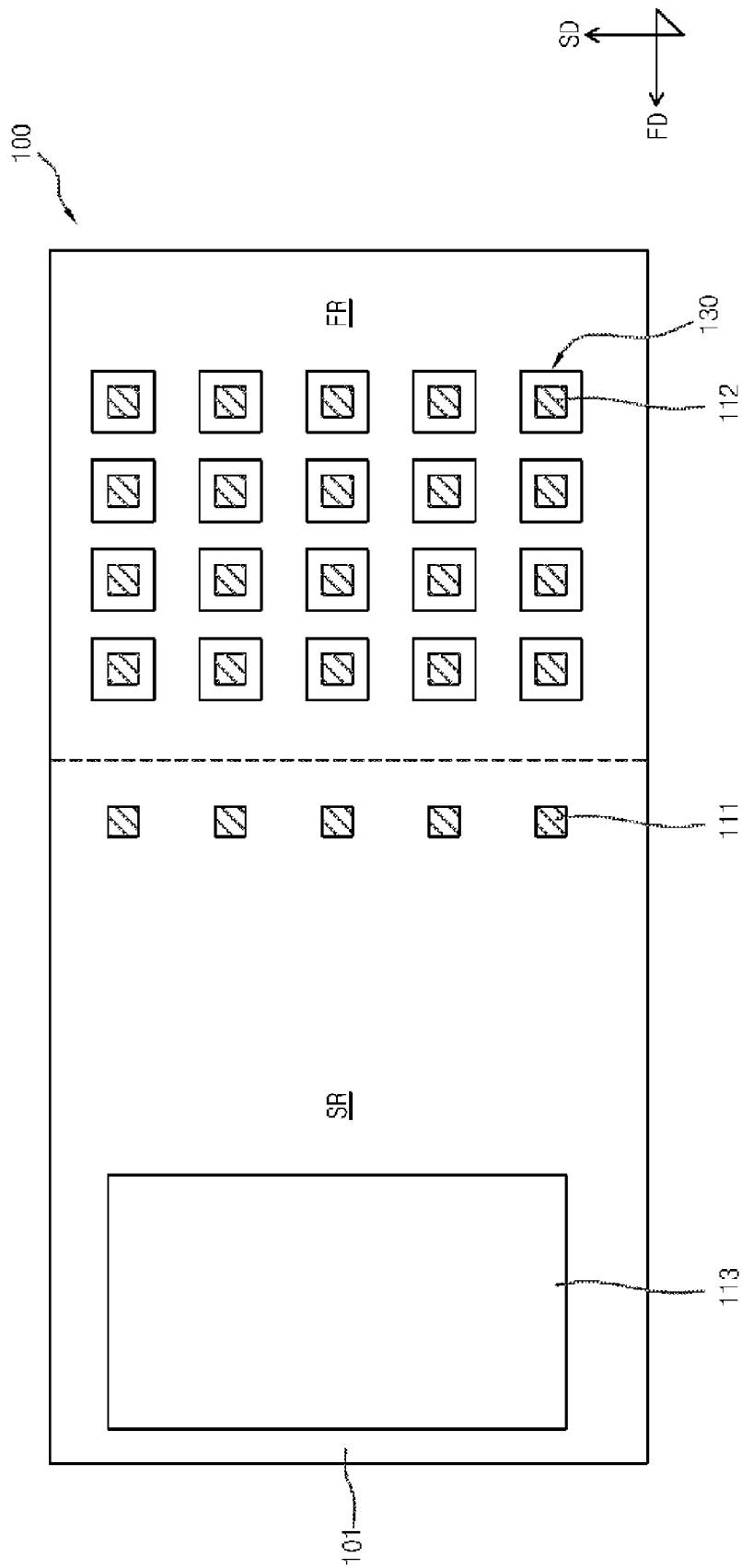
FIG. 15 is a plan view illustrating the substrate shown in FIG. 14.

FIG. 14 is a cross-sectional view illustrating a stacked semiconductor package in accordance with a ninth embodiment of the present invention, and FIG. 15 is a plan view illustrating the substrate shown in FIG. 14.

The stacked semiconductor package in accordance with the ninth embodiment of the present invention has a configuration in which grooves 130 are additionally defined in the substrate 100 with respect to the stacked semiconductor package according to the eighth embodiment of the present invention described above with reference to FIGS. 12 and 13. Hence, the stacked semiconductor package according to the ninth embodiment of the present invention has substantially the same configuration as the stacked semiconductor package according to the eighth embodiment except for the substrate 100. Therefore, repeated descriptions for the same component elements will be omitted herein, and the same terms and the same reference numerals will be used to refer to the same component parts.

Referring to FIGS. 14 and 15, in the present embodiment, a substrate 100 is divided into a first region FR and a second region SR, and has an upper surface 101, a lower surface 102, first connection pads 111, a plurality of second connection pads 112, a protruding part 113, ball lands 120, a plurality of grooves 130, and circuit wiring lines (not shown).

The plurality of grooves 130 are defined in the first region FR on the upper surface 101 of the substrate 100 in such a way as to respectively correspond to the second connection pads 112. The second connection pads 112 are correspondingly disposed on the bottoms of the respective grooves 130.

In the present embodiment, the second connection pads 112 are formed at lower positions than in the eighth embodiment. Thus, when assuming that a height H2 is constant, a bending angle θ4 of semiconductor chips 30 in the present embodiment is larger than the bending angle θ3 of the semiconductor chips 30 in the eighth embodiment. As a consequence, in the present embodiment, the area occupied by a semiconductor chip module 300 may be reduced without increasing the height H2.

Figure 16:
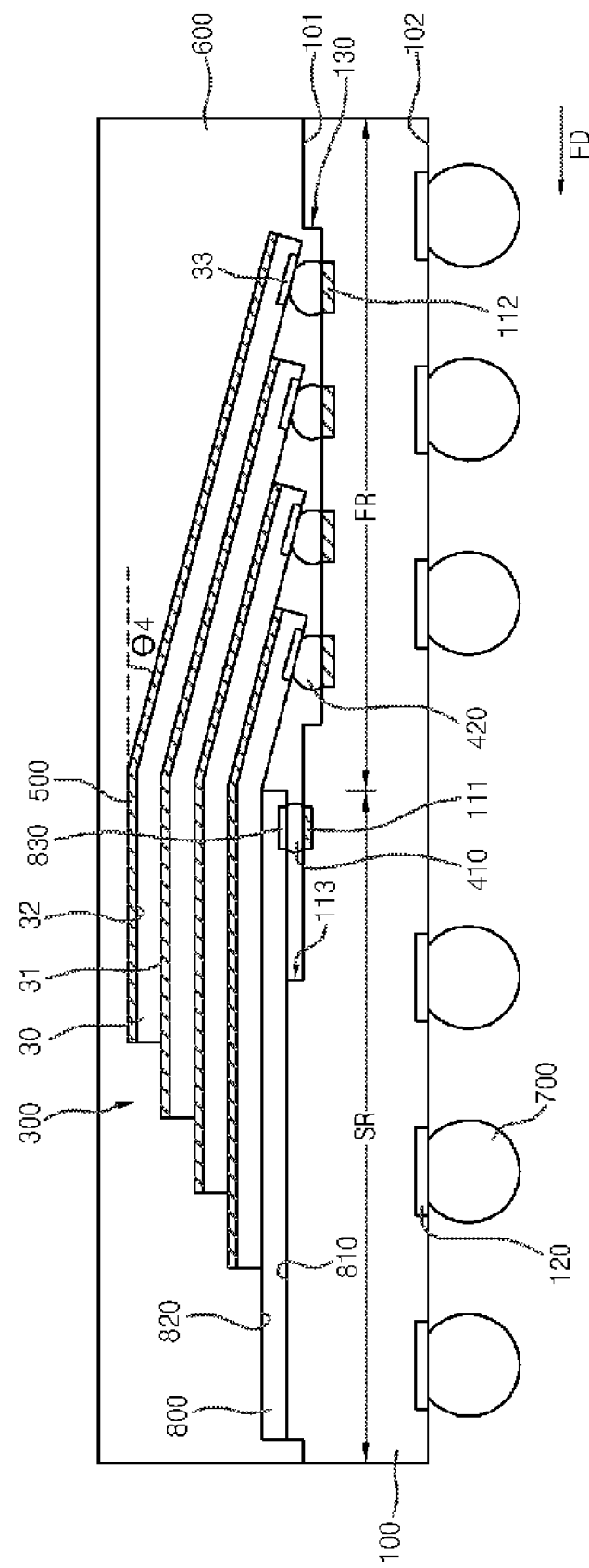
FIG. 16 is a cross-sectional view illustrating a stacked semiconductor package in accordance with a tenth embodiment of the present invention.
Figure 17:
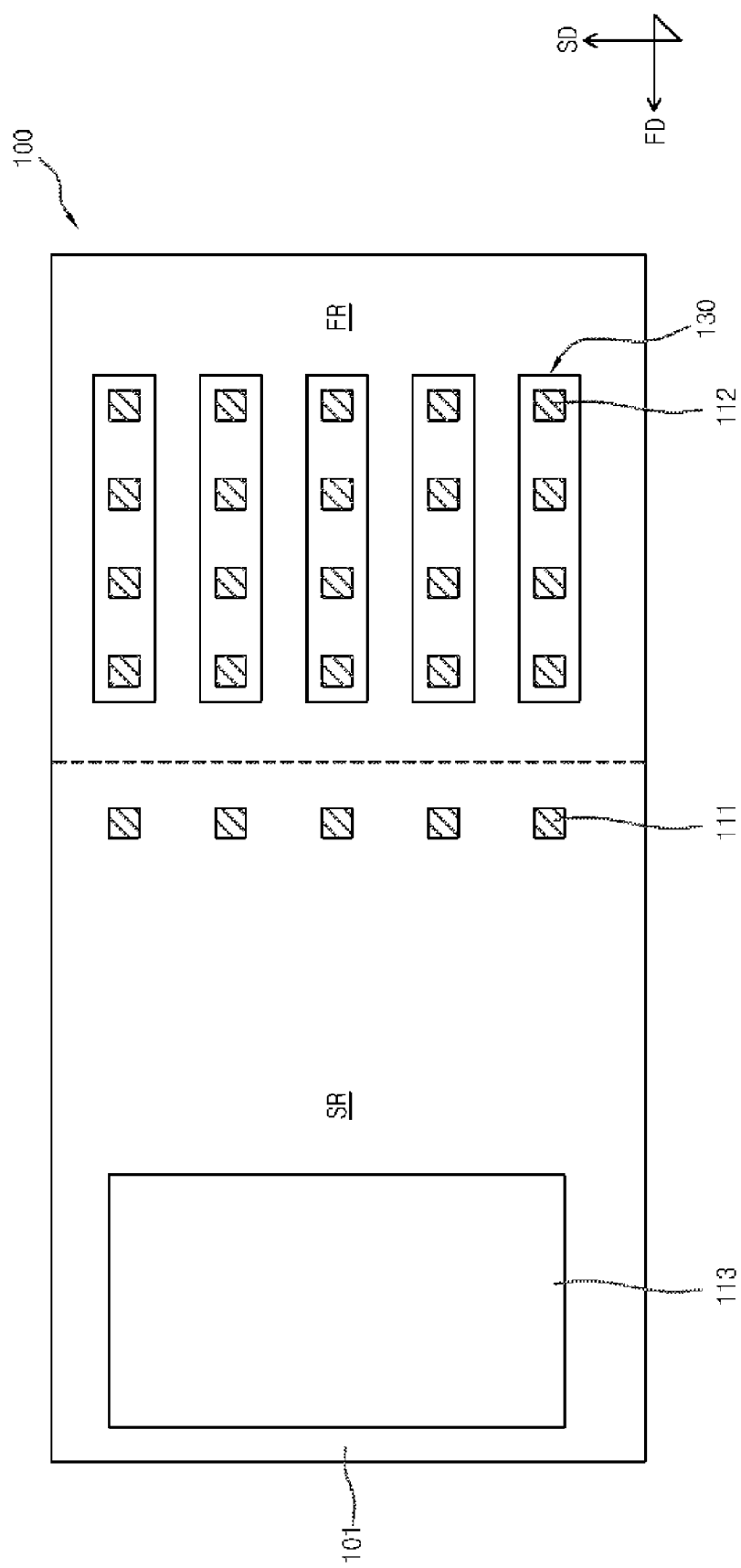
FIG. 17 is a plan view illustrating the substrate shown in FIG. 16.

FIG. 16 is a cross-sectional view illustrating a stacked semiconductor package in accordance with a tenth embodiment of the present invention, and FIG. 17 is a plan view illustrating the substrate shown in FIG. 16.

The stacked semiconductor package in accordance with the tenth embodiment of the present invention has a structure in which the shapes of the grooves 130 are changed with respect to the stacked semiconductor package according to the ninth embodiment of the present invention described above with reference to FIGS. 14 and 15. Hence, the stacked semiconductor package according to the tenth embodiment of the present invention has substantially the same configuration as the stacked semiconductor package according to the ninth embodiment except for the grooves 130. Therefore, repeated descriptions for the same component elements will be omitted herein, and the same terms and the same reference numerals will be used to refer to the same component parts.

Referring to FIGS. 16 and 17, in the present embodiment, grooves 130 are defined in the shapes of lines extending in a first direction FD, in such a manner that each groove 130 corresponds to a plurality of second connection pads 112 arranged along the first direction FD. Second connection pads 112 are correspondingly disposed on the bottoms of the grooves 130 in such a way as to be separated from one another.

In the case where a gap between the second connection pads 112 is narrow, it is difficult to define the grooves 130 as in the ninth embodiment in such a way as to respectively correspond to the second connection pads 112. In this regard, unlike the ninth embodiment, the present embodiment may be applied even when a gap between the second connection pads 112 is narrow, since each groove 130 has the shape of a line to correspond to the plurality of second connection pads 112.

Figure 18:
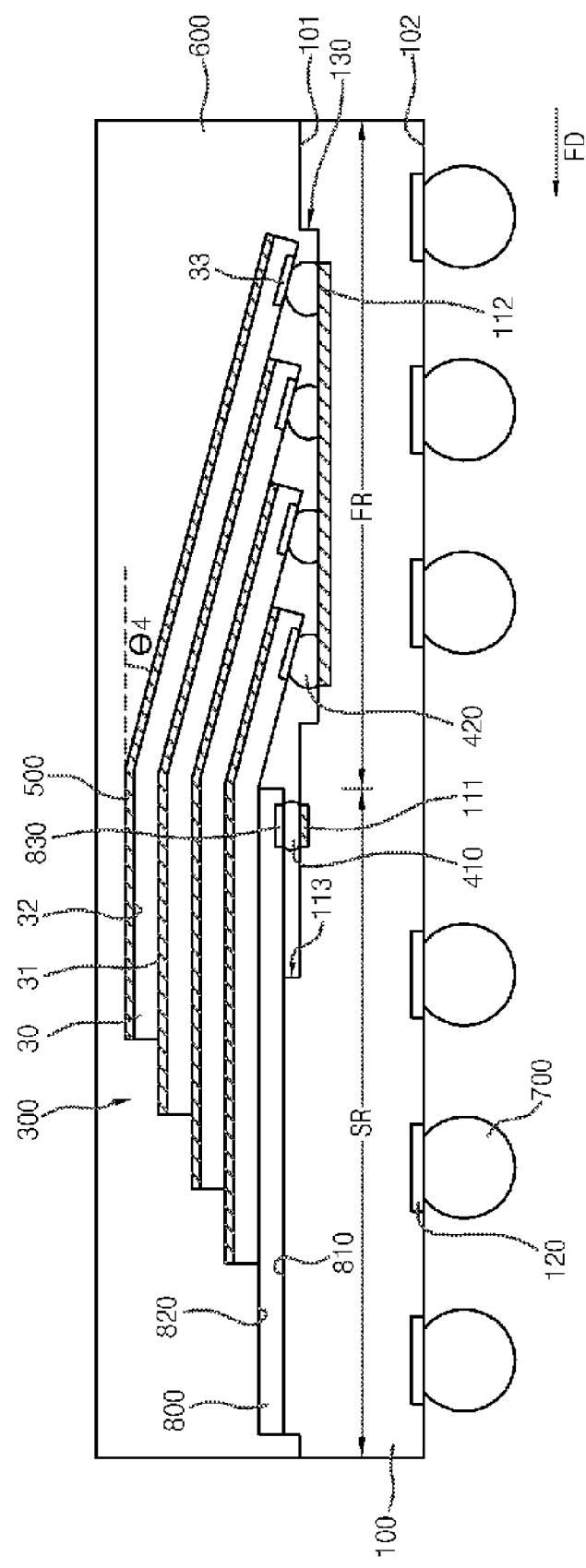
FIG. 18 is a cross-sectional view illustrating a stacked semiconductor package in accordance with an eleventh embodiment of the present invention.
Figure 19:
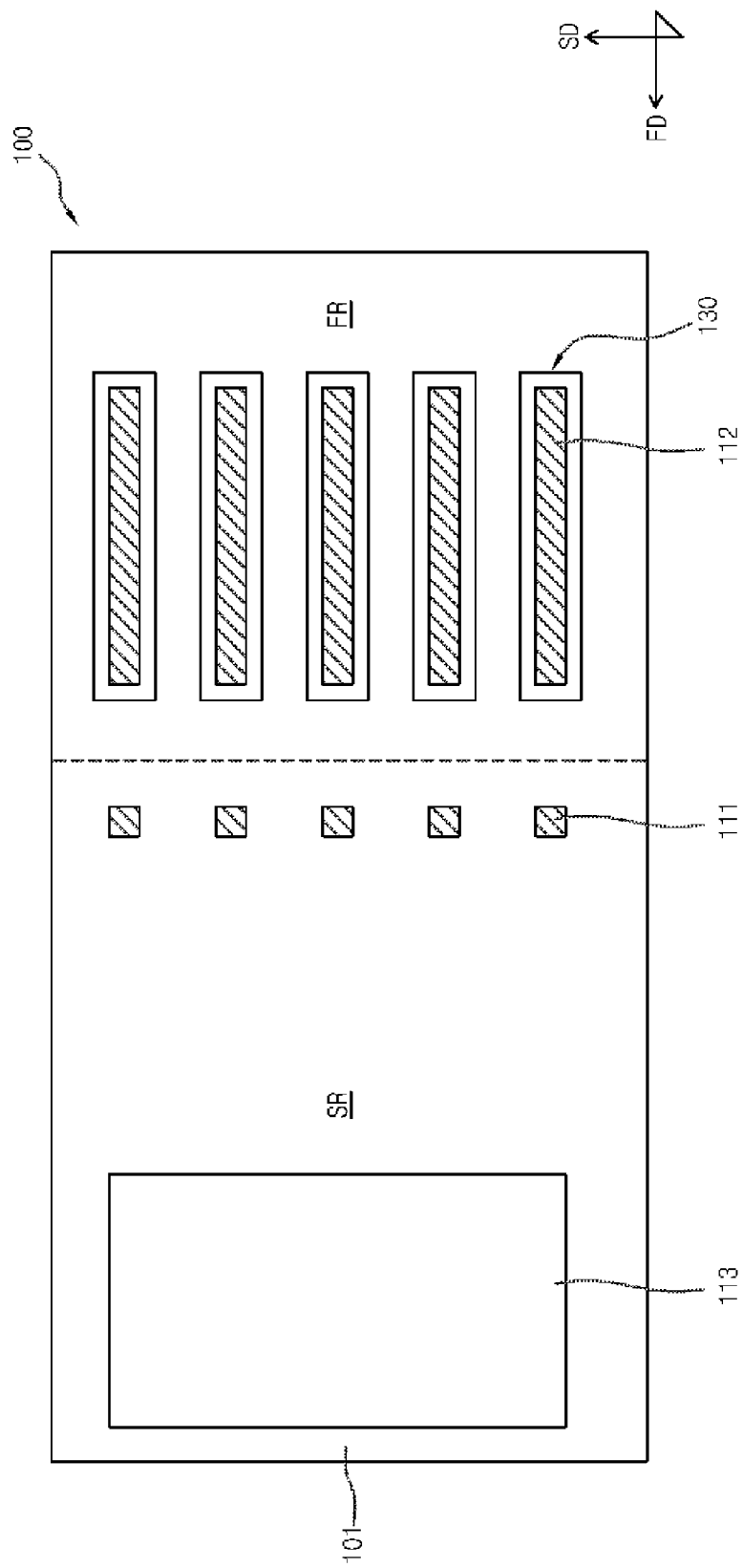
FIG. 19 is a plan view illustrating the substrate shown in FIG. 18.

FIG. 18 is a cross-sectional view illustrating a stacked semiconductor package in accordance with an eleventh embodiment of the present invention, and FIG. 19 is a plan view illustrating the substrate shown in FIG. 18.

The stacked semiconductor package in accordance with the eleventh embodiment of the present invention has a structure in which the shapes of the second connection pads 112 are changed with respect to the stacked semiconductor package according to the tenth embodiment of the present invention described above with reference to FIGS. 16 and 17. Hence, the stacked semiconductor package according to the eleventh embodiment of the present invention has substantially the same configuration as the stacked semiconductor package according to the tenth embodiment except for the second connection pads 112. Therefore, repeated descriptions for the same component elements will be omitted herein, and the same terms and the same reference numerals will be used to refer to the same component parts.

Referring to FIGS. 18 and 19, in the present embodiment, second connection pads 112 are formed in a first region FR of a substrate 100 in the shapes of lines extending in a first direction FD. Each second connection pad 112 is electrically connected with bonding pads 33 of semiconductor chips 30 which constitute a semiconductor chip module 300.

Grooves 130 are defined in the first region FR on an upper surface 101 of the substrate 100, in the shapes of lines which respectively correspond to the second connection pads 112. The second connection pads 112 are correspondingly disposed on the bottoms of the respective grooves 130. Second connection members 420 electrically connect bonding pads 33 of the semiconductor chips 30 and the second connection pads 112 of the substrate 100. In the present embodiment, the second connection members 420 are separately formed to respectively correspond to the bonding pads 33 of the semiconductor chips 30. For example, the second connection members 420 may include bumps or solder balls.

In the tenth embodiment of the present invention described above with reference to FIGS. 16 and 17, since the second connection pads 112 are formed as dot types, if the bending angle θ4 of the semiconductor chips 30 is out of a predetermined range, a failure may be caused in that the bonding pads 33 of the semiconductor chips 30 and the second connection pads 112 of the substrate 100 are unlikely to be electrically connected with each other. Hence, the bending angle θ4 of the semiconductor chips 30 should be appropriately controlled. In the present embodiment, since the second connection pads 112 are formed in the shapes of lines, even when a bending angle θ4 of the semiconductor chips 30 is not precisely controlled, the bonding pads 33 of the semiconductor chips 30 and the second connection pads 112 of the substrate 100 can be electrically connected with each other in a stable manner.

Figure 20:
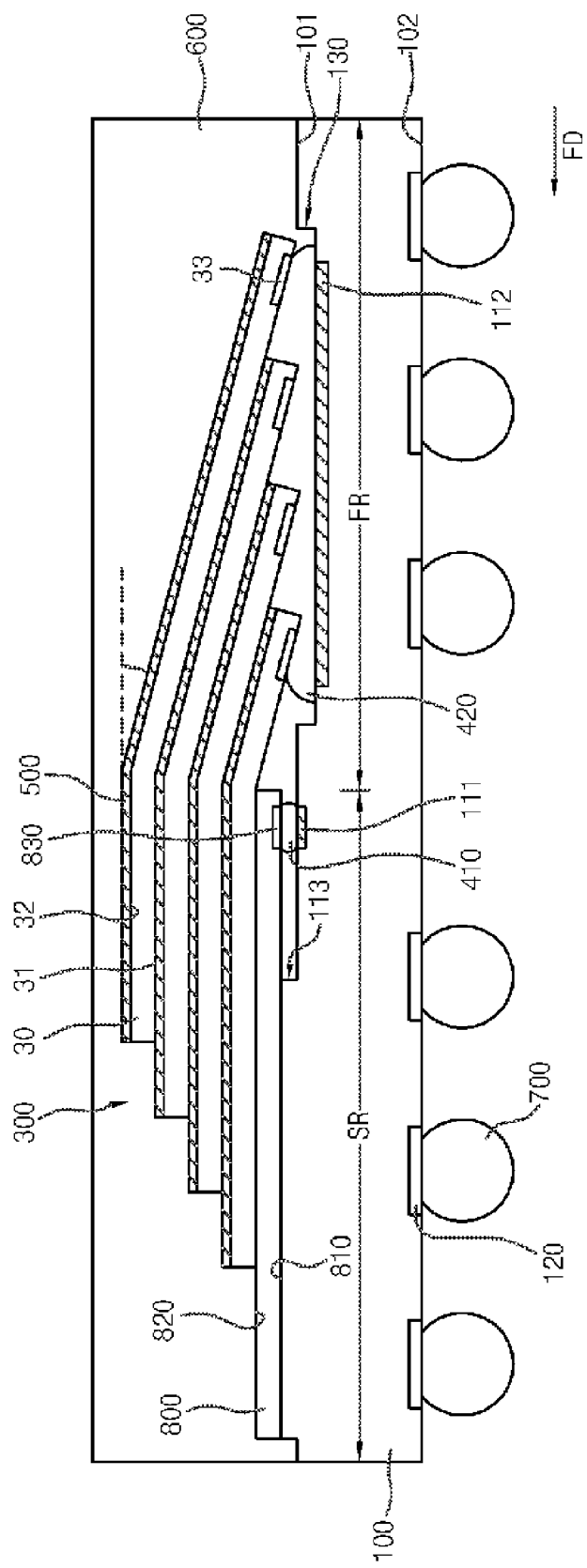
FIG. 20 is a cross-sectional view illustrating a stacked semiconductor package in accordance with a twelfth embodiment of the present invention.

FIG. 20 is a cross-sectional view illustrating a stacked semiconductor package in accordance with a twelfth embodiment of the present invention.

The stacked semiconductor package in accordance with the twelfth embodiment of the present invention has a structure in which the shapes of the second connection members 420 are changed with respect to the stacked semiconductor package according to the eleventh embodiment of the present invention described above with reference to FIGS. 18 and 19. Hence, the stacked semiconductor package according to the twelfth embodiment of the present invention has substantially the same configuration as the stacked semiconductor package according to the eleventh embodiment except for the second connection members 420. Therefore, repeated descriptions for the same component elements will be omitted herein, and the same terms and the same reference numerals will be used to refer to the same component parts.

Referring to FIG. 20, in the present embodiment, second connection members 420 electrically connect bonding pads 33 of semiconductor chips 30 and second connection pads 112 of a substrate 100, and are continuously formed on the second connection pads 112 to correspond to the bonding pads 33 of the semiconductor chips 30. For example, the second connection members 420 may include conductive paste or conductive tape.

In the present embodiment, when compared to the eleventh embodiment, since the areas of the second connection members 420 to contact the substrate 100 and the semiconductor chips 30 are increased, the junction strengths of the second connection members 420 can be improved.

Figure 21:
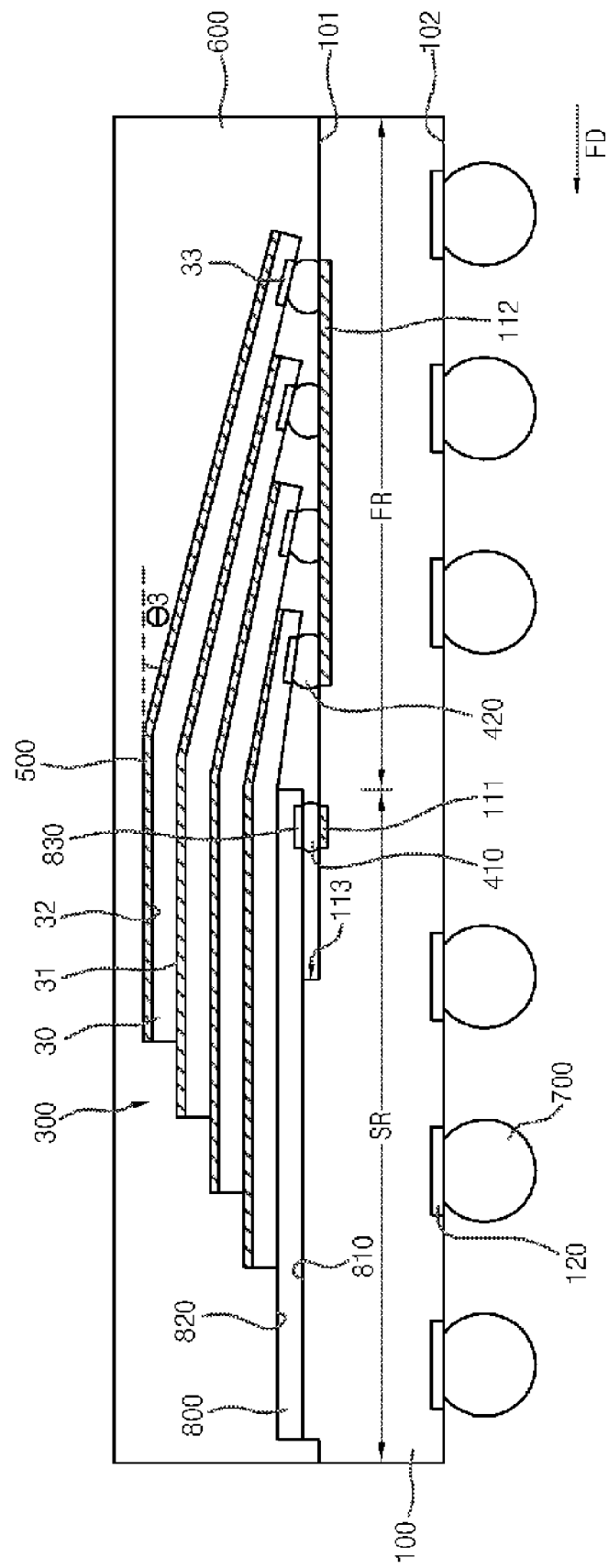
FIG. 21 is a cross-sectional view illustrating a stacked semiconductor package in accordance with a thirteenth embodiment of the present invention.

FIG. 21 is a cross-sectional view illustrating a stacked semiconductor package in accordance with a thirteenth embodiment of the present invention.

The stacked semiconductor package in accordance with the thirteenth embodiment of the present invention has a structure in which the shapes of the second connection pads 112 are changed with respect to the stacked semiconductor package according to the eighth embodiment of the present invention described above with reference to FIGS. 12 and 13. Hence, the stacked semiconductor package according to the thirteenth embodiment of the present invention has substantially the same configuration as the stacked semiconductor package according to the eighth embodiment except for the second connection pads 112. Therefore, repeated descriptions for the same component elements will be omitted herein, and the same terms and the same reference numerals will be used to refer to the same component parts.

Referring to FIG. 21, in the present embodiment, second connection pads 112 are formed in a first region FR of a substrate 100 in the shapes of lines extending in a first direction FD, and are electrically connected with bonding pads 33 of a plurality of semiconductor chips 30.

Second connection members 420 electrically connect the bonding pads 33 of the semiconductor chips 30 and the second connection pads 112 of the substrate 100. In the present embodiment, the second connection members 420 may be separately formed to respectively correspond to the bonding pads 33 of the semiconductor chips 30. For example, the second connection members 420 may include bumps or solder balls.

In the eighth embodiment of the present invention described above with reference to FIGS. 12 and 13, since the second connection pads 112 are formed as dot types, if the bending angle θ3 of the semiconductor chips 30 is out of a predetermined range, a failure may be caused in that the bonding pads 33 of the semiconductor chips 30 and the second connection pads 112 of the substrate 100 are unlikely to be electrically connected with each other. Hence, the bending angle θ3 of the semiconductor chips 30 should be appropriately controlled. In the present embodiment, since the second connection pads 112 are formed in the shapes of lines, even when a bending angle θ3 of the semiconductor chips 30 is not precisely controlled, the bonding pads 33 of the semiconductor chips 30 and the second connection pads 112 of the substrate 100 can be electrically connected with each other.

Figure 22:
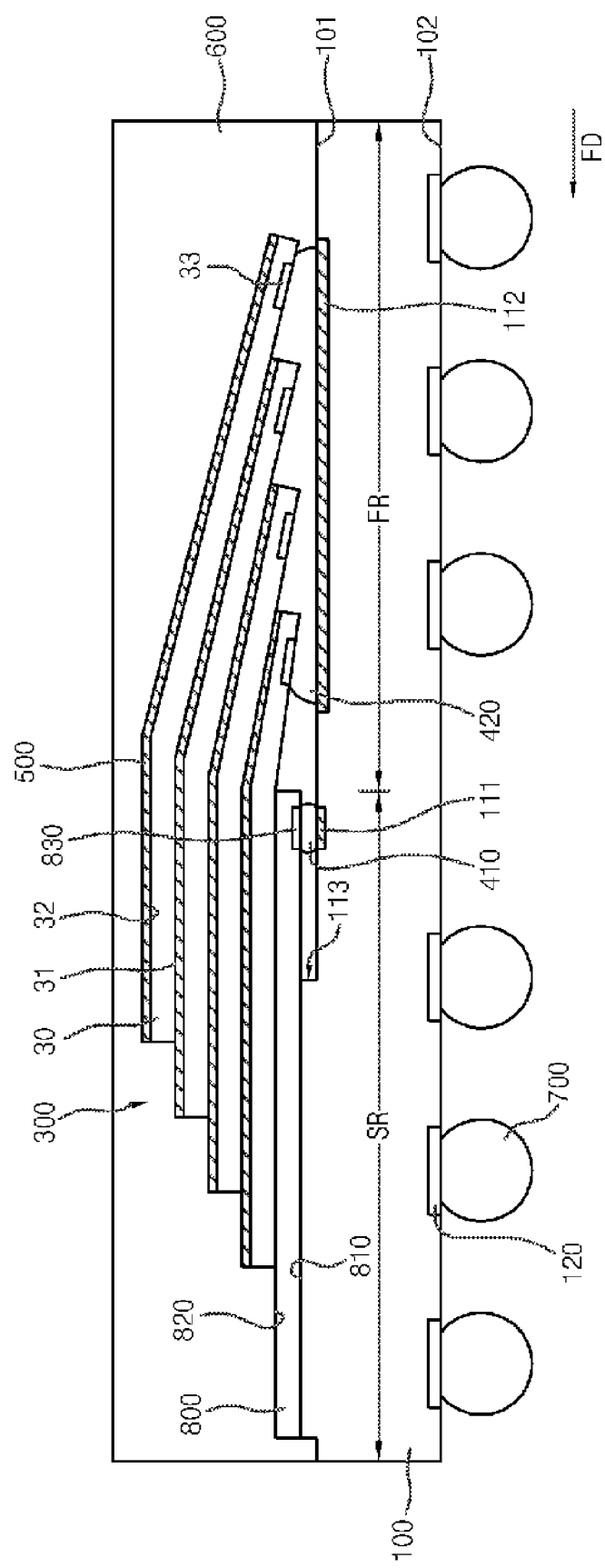
FIG. 22 is a cross-sectional view illustrating a stacked semiconductor package in accordance with a fourteenth embodiment of the present invention.

FIG. 22 is a cross-sectional view illustrating a stacked semiconductor package in accordance with a fourteenth embodiment of the present invention.

The stacked semiconductor package in accordance with the fourteenth embodiment of the present invention has a structure in which the shapes of the second connection members 420 are changed with respect to the stacked semiconductor package according to the thirteenth embodiment of the present invention described above with reference to FIG. 21. Hence, the stacked semiconductor package according to the fourteenth embodiment of the present invention has substantially the same configuration as the stacked semiconductor package according to the thirteenth embodiment except for the second connection members 420. Therefore, repeated descriptions for the same component elements will be omitted herein, and the same terms and the same reference numerals will be used to refer to the same component parts.

Referring to FIG. 22, in the present embodiment, second connection members 420 electrically connect bonding pads 33 of semiconductor chips 30 and second connection pads 112 of a substrate 100, and are continuously formed on the second connection pads 112 to correspond to the bonding pads 33 of the semiconductor chips 30. For example, the second connection members 420 may include conductive paste or conductive tape.

In the present embodiment, when compared to the thirteenth embodiment, since the areas of the second connection members 420 to contact the substrate 100 and the semiconductor chips 30 are increased, the junction strengths of the second connection members 420 can be improved.

Although it was explained and illustrated in the eighth to fourteenth embodiments of the present invention described above with reference to FIGS. 12 to 22 that the substrate 100 includes the protruding part 113, it is conceivable that the substrate 100 may not include the protruding part 113 and an additional support member may be used in place of the protruding part 113.

Figure 23:
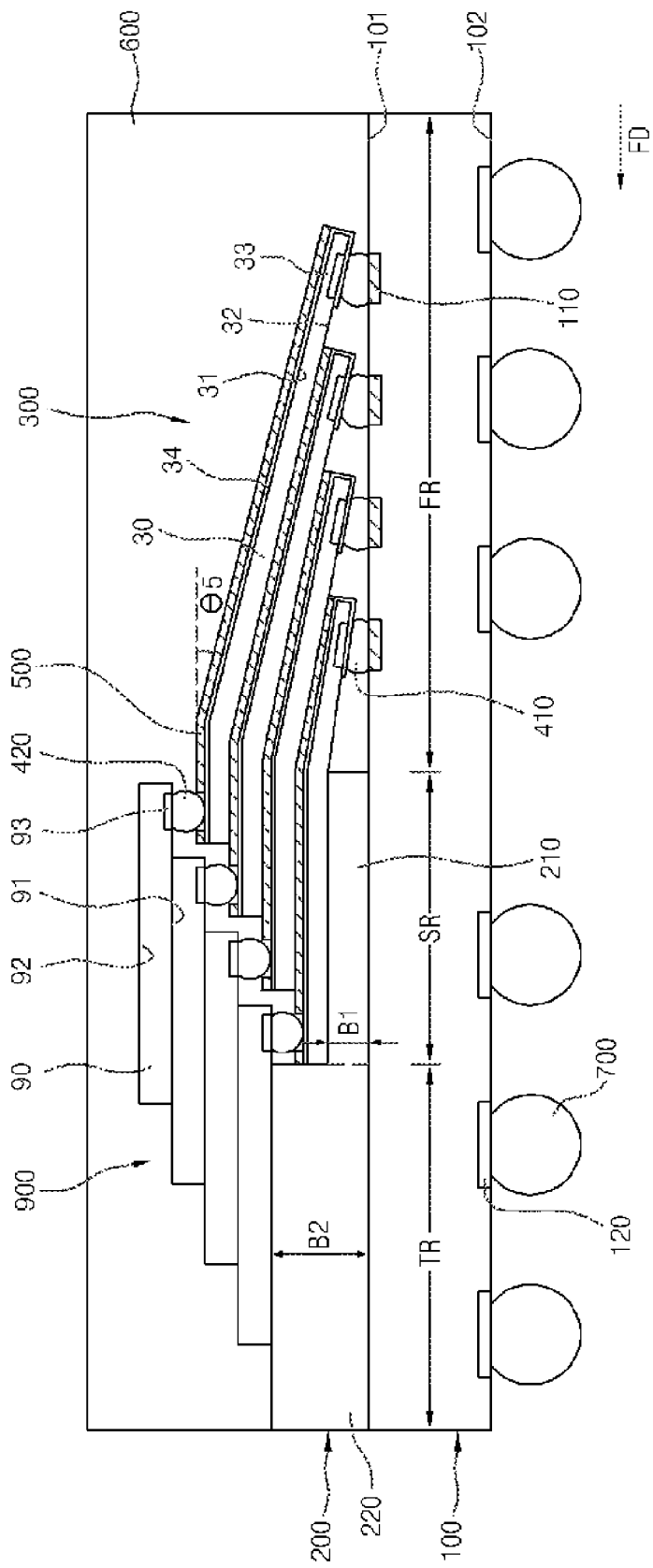
FIG. 23 is a cross-sectional view illustrating a stacked semiconductor package in accordance with a fifteenth embodiment of the present invention.
Figure 24:
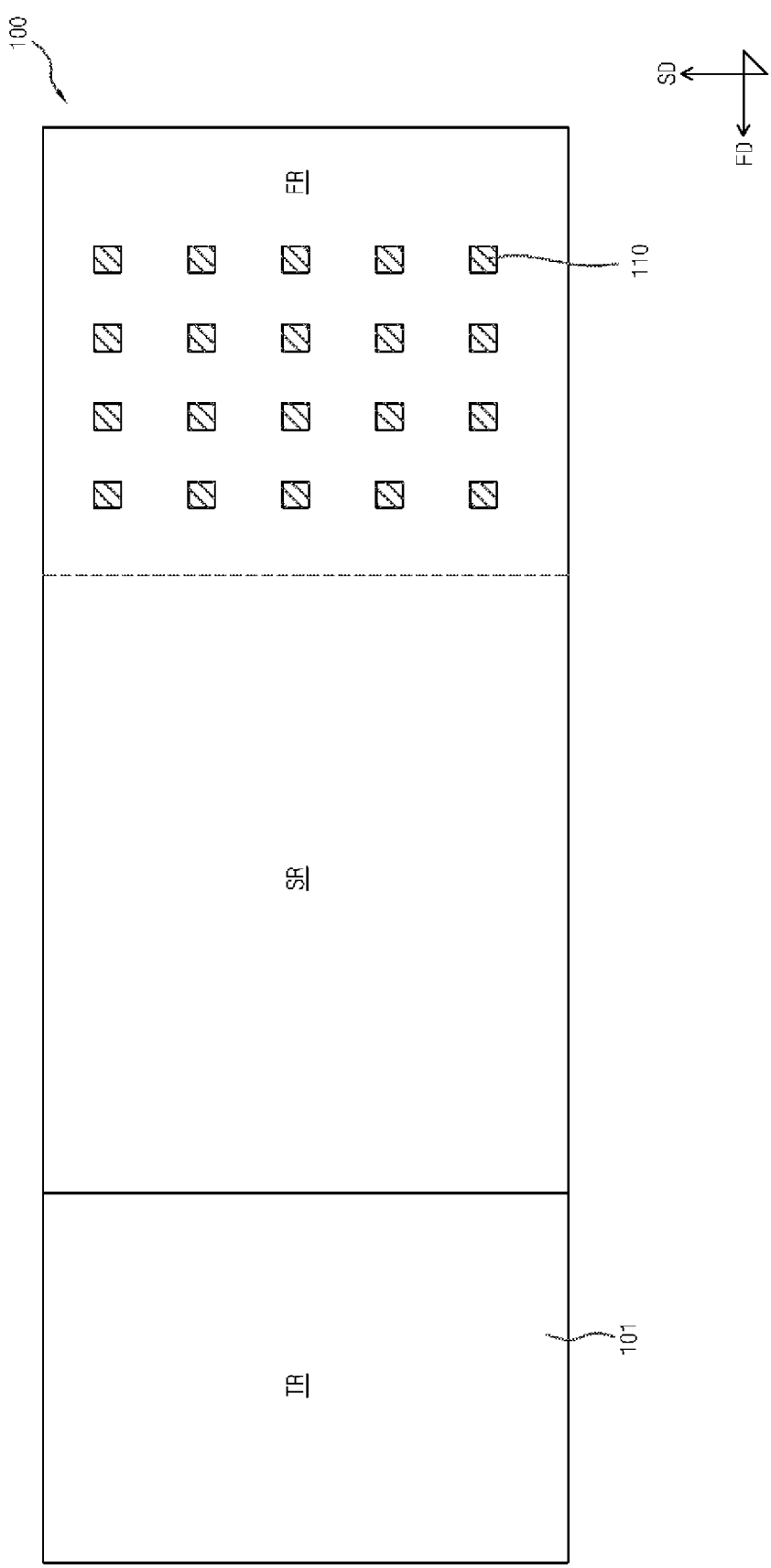
FIG. 24 is a plan view illustrating the substrate shown in FIG. 23.

FIG. 23 is a cross-sectional view illustrating a stacked semiconductor package in accordance with a fifteenth embodiment of the present invention, and FIG. 24 is a plan view illustrating the substrate shown in FIG. 23.

Referring to FIGS. 23 and 24, the stacked semiconductor package in accordance with the fifteenth embodiment of the present invention includes a substrate 100, a support member 200, a semiconductor chip module 300, and an additional semiconductor chip module 900. In addition, the stacked semiconductor package further includes first and second connection members 410 and 420, fixing members 500, a molding part 600, and external connection terminals 700.

The substrate 100 may be, for example, a printed circuit board (PCB). The substrate 100 is divided into a first region FR, a second region SR, and a third region TR, and has an upper surface 101, a lower surface 102, a plurality of connection pads 110, ball lands 120, and circuit wiring lines (not shown).

The first region FR, the second region SR, and the third region TR are sequentially defined along a first direction FD shown in FIGS. 23 and 24.

The upper surface 101 faces away from the lower surface 102, and the plurality of connection pads 110 are formed in the first region FR on the upper surface 101 of the substrate 100. The ball lands 120 are formed on the lower surface 102 of the substrate 100. The circuit wiring lines are formed in the substrate 100 and are electrically connected with the connection pads 110 and the ball lands 120.

Referring to FIG. 23, the support member 200 includes a first support part 210 and a second support part 220.

The first support part 210 is formed in the second region SR on the upper surface 101 of the substrate 100, and has a first height B1. The second support part 220 is formed in the third region TR on the upper surface 101 of the substrate 100, and has a height B2 larger than the first height B1. In the present embodiment, the support member 200 is attached to the substrate 100 by the medium of an adhesive member (not shown) such as, for example, adhesive tape or adhesive paste after being manufactured separately from the substrate 100. Unlike this, the support member 200 may be formed integrally with the substrate 100 when manufacturing the substrate 100, without being manufactured separately from the substrate 100.

The support member 200 may be, for example, any one of a dummy wafer, a glass substrate, a spacer tape, an insulation substrate, and a solder resist. Unlike this, the support member 200 may be an additional semiconductor chip. The first support part 210 may have a thickness different from first semiconductor chips 30 which will be described below.

The semiconductor chip module 300 includes a plurality of first semiconductor chips 30.

Each first semiconductor chip 30 has a first surface 31, a second surface 32, first bonding pads 33, and redistribution lines 34. The first surface 31 faces away from the second surface 32, and the bonding pads 33 are formed near one edge of the first surface 31. The redistribution lines 34 redistribute the first bonding pads 33 to the second surface 32. First ends of the redistribution lines 34 are electrically connected with the first bonding pads 33, and the second ends of the redistribution lines 34, which face away from the first ends, are disposed on the second surface 32.

The first semiconductor chips 30 are stacked on the first support part 210 in a step-like shape such that the first bonding pads 33 of the respective first semiconductor chips 30 face the declining slope of a first region FR of the substrate 100, such that the first bonding pads 33 of the respective first semiconductor chips 30 are electrically connected with the connection pads 110 of the substrate 100.

An angle $\theta 5$ at which the first semiconductor chips 30 are bent is determined depending upon the height B1 of the first support part 210. If the height B1 increases, since the bending angle $\theta 5$ of the first semiconductor chips 30 increases, the area occupied by the semiconductor chip module 300 decreases, and, hence, the area of the stacked semiconductor package decreases. However, if the height B1 increases, the thickness of the stacked semiconductor package increases. Conversely, if the height B1 decreases, although the thickness of the stacked semiconductor package can be reduced, the bending angle $\theta 5$ decreases, and the area occupied by the semiconductor chip module 300 increases. Therefore, it may be desirable to appropriately adjust the height B1 of the first support part 210 in consideration of these factors.

The additional semiconductor chip module 900 includes second semiconductor chips 90. In the present embodiment, the additional semiconductor chip module 900 includes four second semiconductor chips 90.

Each second semiconductor chip 90 has a first surface 91, a second surface 92, and second bonding pads 93. The first surface 91 faces away from the second surface 92, and the second bonding pads 93 are formed near one edge of the first surface 91.

The second semiconductor chips 90 are stacked on the second support part 220 in a step-like shape such that second bonding pads 93 of the respective second semiconductor chips 90 are electrically connected with redistribution lines 34 of the first semiconductor chips 30 which constitute the semiconductor chip module 300.

Although it is explained and illustrated in the present embodiment that the number of the second semiconductor chips 90 is four, it is to be noted that the present invention is not limited to such a number, and may include one or more second semiconductor chips 90.

The first connection members 410 electrically connect the first bonding pads 33 of the first semiconductor chips 30 and the connection pads 110 of the substrate 100, and the second connection pads 420 electrically connect the second bonding pads 93 of the second semiconductor chips 90 and the redistribution lines 34 of the first semiconductor chips 30. The first and second connection members 410 and 420 may include, for example, bumps or solder balls.

The fixing members 500 are formed on the second surfaces 32 of the respective first semiconductor chips 30 including the redistribution lines 34 in such a way as to open portions of the redistribution lines 34 to which the second connection members 420 are to be attached. The fixing members 500 may include, for example, a thermosetting resin. The fixing members 500 set hard by the heat applied when bending the first semiconductor chips 30. Accordingly, the bent first semiconductor chips 30 are fixed by the fixing members 500 and are prevented from returning to their original shapes.

The molding part 600 seals the upper surface 101 of the substrate 100 including the support member 200, the semiconductor chip module 300, and the additional semiconductor chip module 900. The molding part 600 may include, for example, an epoxy molding compound (EMC).

The external connection terminals 700 are mounted to the ball lands 120 of the substrate 100. The external connection terminals 700 may include, for example, solder balls.

Figure 25:
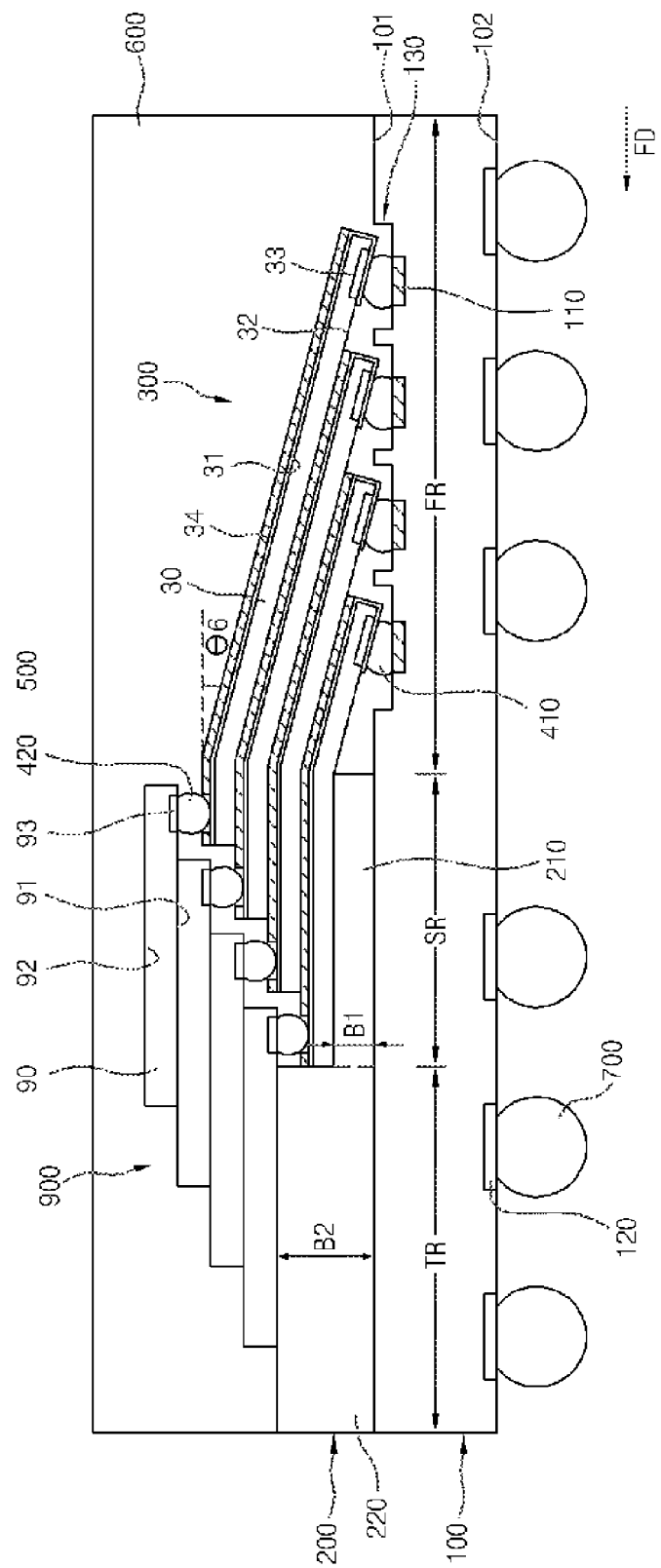
FIG. 25 is a cross-sectional view illustrating a stacked semiconductor package in accordance with a sixteenth embodiment of the present invention.
Figure 26:
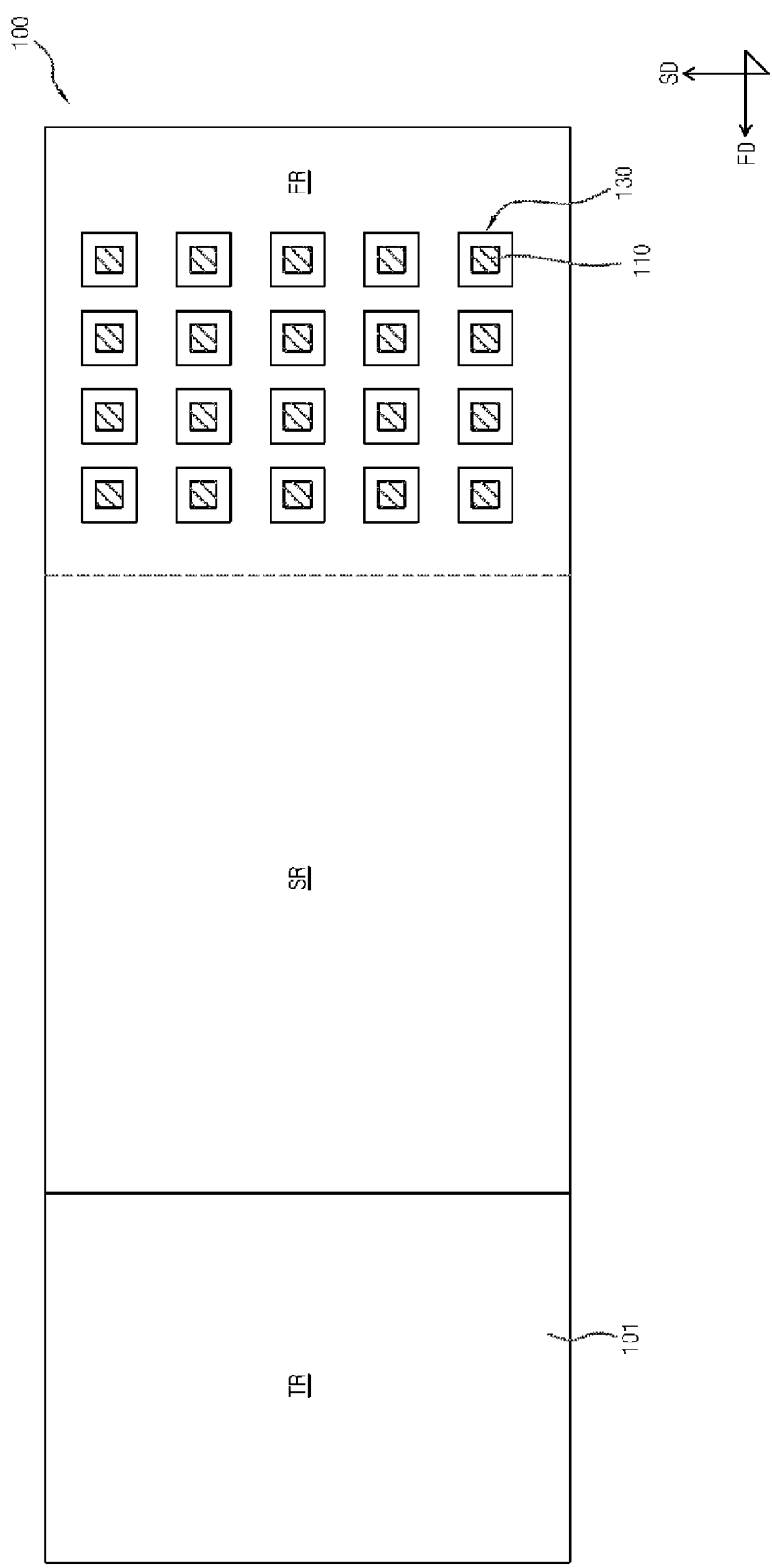
FIG. 26 is a plan view illustrating the substrate shown in FIG. 25.

FIG. 25 is a cross-sectional view illustrating a stacked semiconductor package in accordance with a sixteenth embodiment of the present invention, and FIG. 26 is a plan view illustrating the substrate shown in FIG. 25.

The stacked semiconductor package in accordance with the sixteenth embodiment of the present invention has a configuration in which grooves 130 are additionally defined in the substrate 100 with respect to the stacked semiconductor package according to the fifteenth embodiment of the present invention described above with reference to FIGS. 23 and 24. Hence, the stacked semiconductor package according to the sixteenth embodiment of the present invention has substantially the same configuration as the stacked semiconductor package according to the fifteenth embodiment except for the substrate 100. Therefore, repeated descriptions for the same component elements will be omitted herein, and the same terms and the same reference numerals will be used to refer to the same component parts.

Referring to FIGS. 25 and 26, in the present embodiment, a substrate 100 is divided into a first region FR, a second region SR, and a third region TR, and has an upper surface 101, a lower surface 102, a plurality of connection pads 110, ball lands 120, a plurality of grooves 130, and circuit wiring lines (not shown).

The plurality of grooves 130 are defined in the first region FR on the upper surface 101 of the substrate 100 in such a way as to respectively correspond to the connection pads 110. The connection pads 110 are correspondingly disposed on the bottoms of the respective grooves 130.

In the present embodiment, the connection pads 110 are formed at lower positions than in the fifteenth embodiment. Thus, when assuming that a height B1 of a first support part 210 is constant, a bending angle $\theta 6$ of first semiconductor chips 30 in the present embodiment is larger than the bending angle $\theta 5$ of the first semiconductor chips 30 in the fifteenth embodiment. As a consequence, in the present embodiment, the area occupied by a semiconductor chip module 300 may be reduced without increasing the height B1 of the first support part 210.

Figure 27:
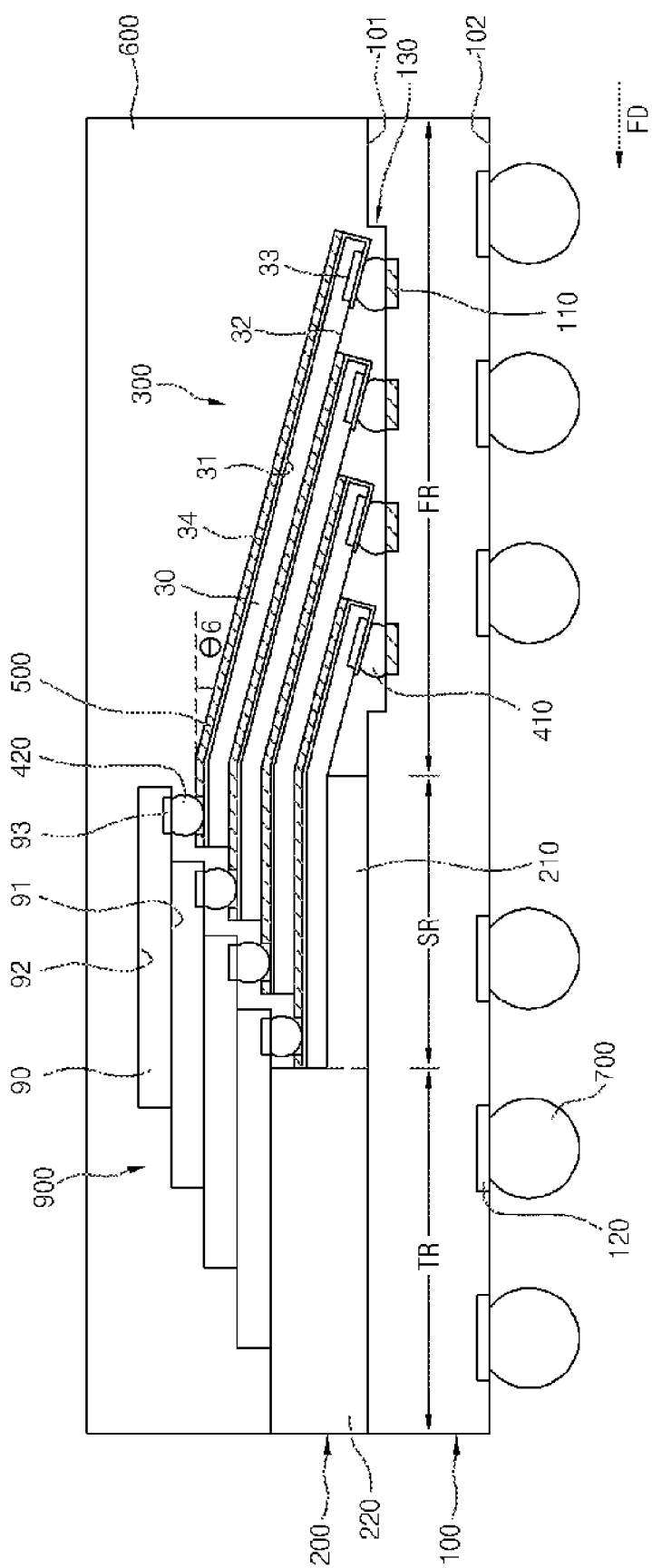
FIG. 27 is a cross-sectional view illustrating a stacked semiconductor package in accordance with a seventeenth embodiment of the present invention.
Figure 28:
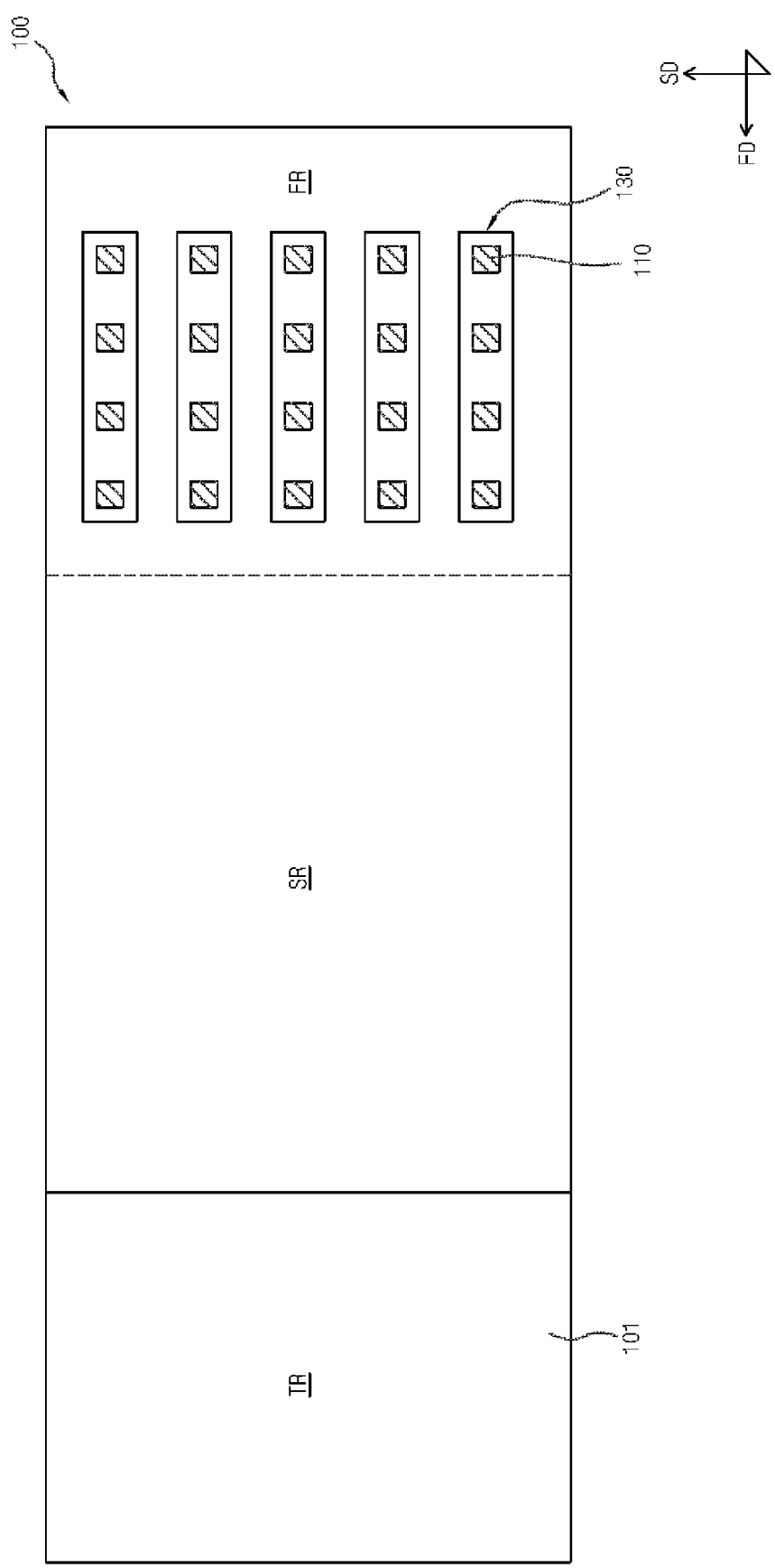
FIG. 28 is a plan view illustrating the substrate shown in FIG. 27.

FIG. 27 is a cross-sectional view illustrating a stacked semiconductor package in accordance with a seventeenth embodiment of the present invention, and FIG. 28 is a plan view illustrating the substrate shown in FIG. 27.

The stacked semiconductor package in accordance with the seventeenth embodiment of the present invention has a structure in which the shapes of the grooves 130 are changed with respect to the stacked semiconductor package according to the sixteenth embodiment of the present invention described above with reference to FIGS. 25 and 26. Hence, the stacked semiconductor package according to the seventeenth embodiment of the present invention has substantially the same configuration as the stacked semiconductor package according to the sixteenth embodiment except for the grooves 130. Therefore, repeated descriptions for the same component elements will be omitted herein, and the same terms and the same reference numerals will be used to refer to the same component parts.

Referring to FIGS. 27 and 28, in the present embodiment, grooves 130 are defined in the shapes of lines extending in a first direction FD, in such a manner that each groove 130 corresponds to a plurality of connection pads 110 arranged along the first direction FD. Connection pads 110 are correspondingly disposed on the bottoms of the grooves 130 in such a way as to be separated from one another.

In the case where a gap between the connection pads 110 is narrow, it is difficult to define the grooves 130 as in the sixteenth embodiment in such a way as to respectively correspond to the connection pads 110. In this regard, unlike the sixteenth embodiment, the present embodiment may be applied even when a gap between the connection pads 110 is narrow, since each groove 130 has the shape of a line to correspond to the plurality of connection pads 110.

Figure 29:
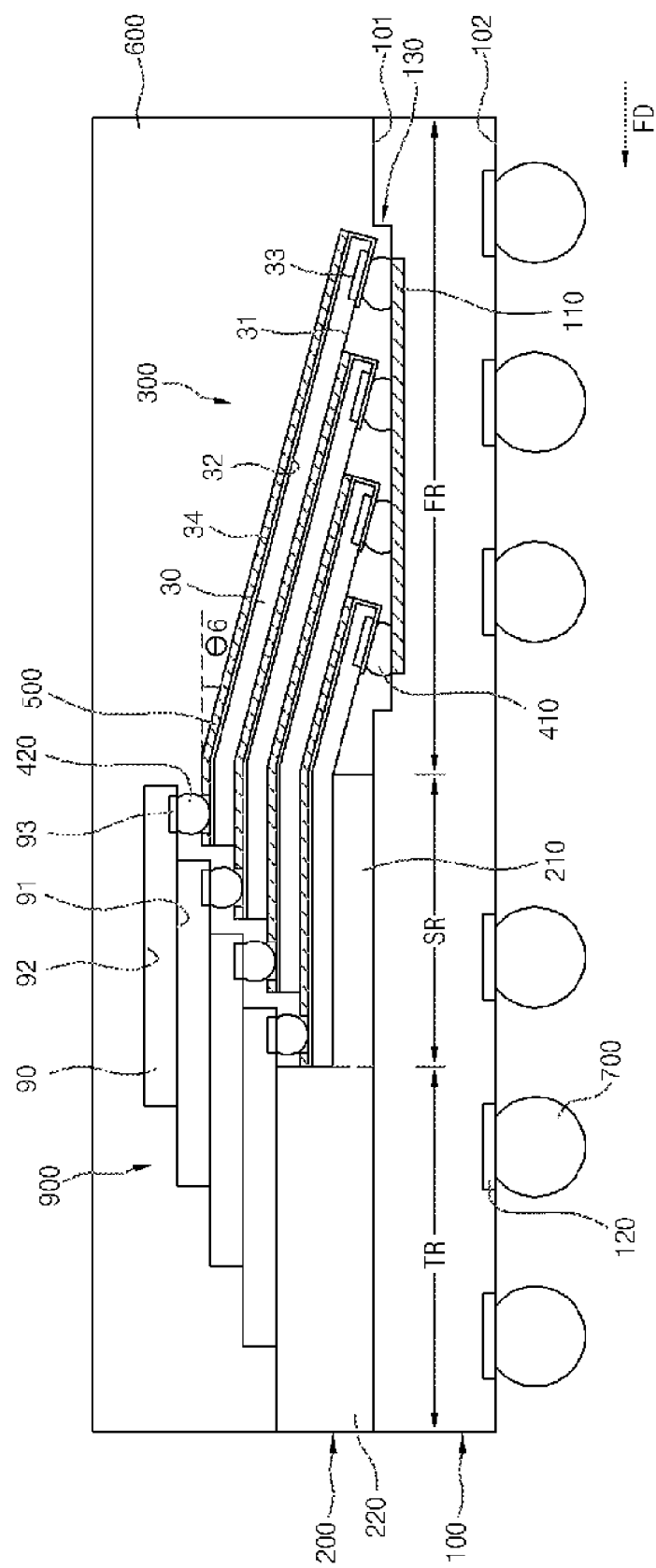
FIG. 29 is a cross-sectional view illustrating a stacked semiconductor package in accordance with an eighteenth embodiment of the present invention.
Figure 30:
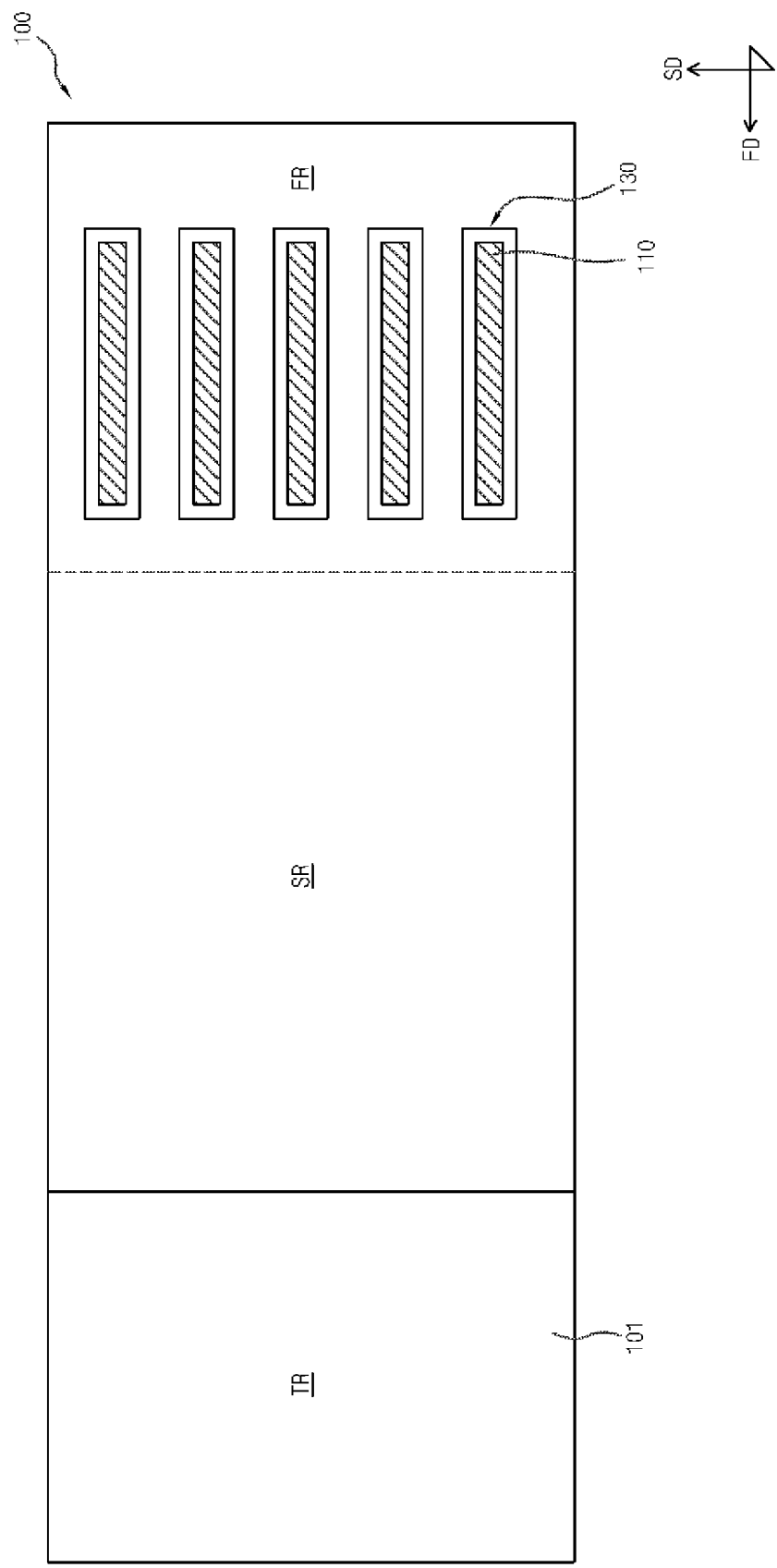
FIG. 30 is a plan view illustrating the substrate shown in FIG. 29.

FIG. 29 is a cross-sectional view illustrating a stacked semiconductor package in accordance with an eighteenth embodiment of the present invention, and FIG. 30 is a plan view illustrating the substrate shown in FIG. 29.

The stacked semiconductor package in accordance with the eighteenth embodiment of the present invention has a structure in which the shapes of the connection pads 110 are changed with respect to the stacked semiconductor package according to the seventeenth embodiment of the present invention described above with reference to FIGS. 27 and 28. Hence, the stacked semiconductor package according to the eighteenth embodiment of the present invention has substantially the same configuration as the stacked semiconductor package according to the seventeenth embodiment except for the connection pads 110. Therefore, repeated descriptions for the same component elements will be omitted herein, and the same terms and the same reference numerals will be used to refer to the same component parts.

Referring to FIGS. 29 and 30, in the present embodiment, connection pads 110 are formed in a first region FR of a substrate 100 in the shapes of lines extending in a first direction FD. Each connection pad 110 is electrically connected with first bonding pads 33 of first semiconductor chips 30.

Grooves 130 are defined in the first region FR on an upper surface 101 of the substrate 100 in the shapes of lines that respectively correspond to the connection pads 110. The connection pads 110 are correspondingly disposed on the bottoms of the respective grooves 130. First connection members 410 electrically connect first bonding pads 33 of the first semiconductor chips 30 and the connection pads 110 of the substrate 100. In the present embodiment, the first connection members 410 are separately formed to respectively correspond to the first bonding pads 33 of the first semiconductor chips 30. For example, the first connection members 410 may include bumps or solder balls.

In the seventeenth embodiment of the present invention described above with reference to FIGS. 27 and 28, since the connection pads 110 are formed as dot types, if the bending angle θ6 of the first semiconductor chips 30 is out of a predetermined range, a failure may be caused in that the first bonding pads 33 of the first semiconductor chips 30 and the connection pads 110 of the substrate 100 are unlikely to be electrically connected with each other. Hence, the bending angle θ6 of the first semiconductor chips 30 should be appropriately controlled. In the present embodiment, since the connection pads 110 are formed in the shapes of lines, even when a bending angle θ6 of the first semiconductor chips 30 is not precisely controlled, the first bonding pads 33 of the first semiconductor chips 30 and the connection pads 110 of the substrate 100 can be electrically connected with each other in a stable manner.

Figure 31:
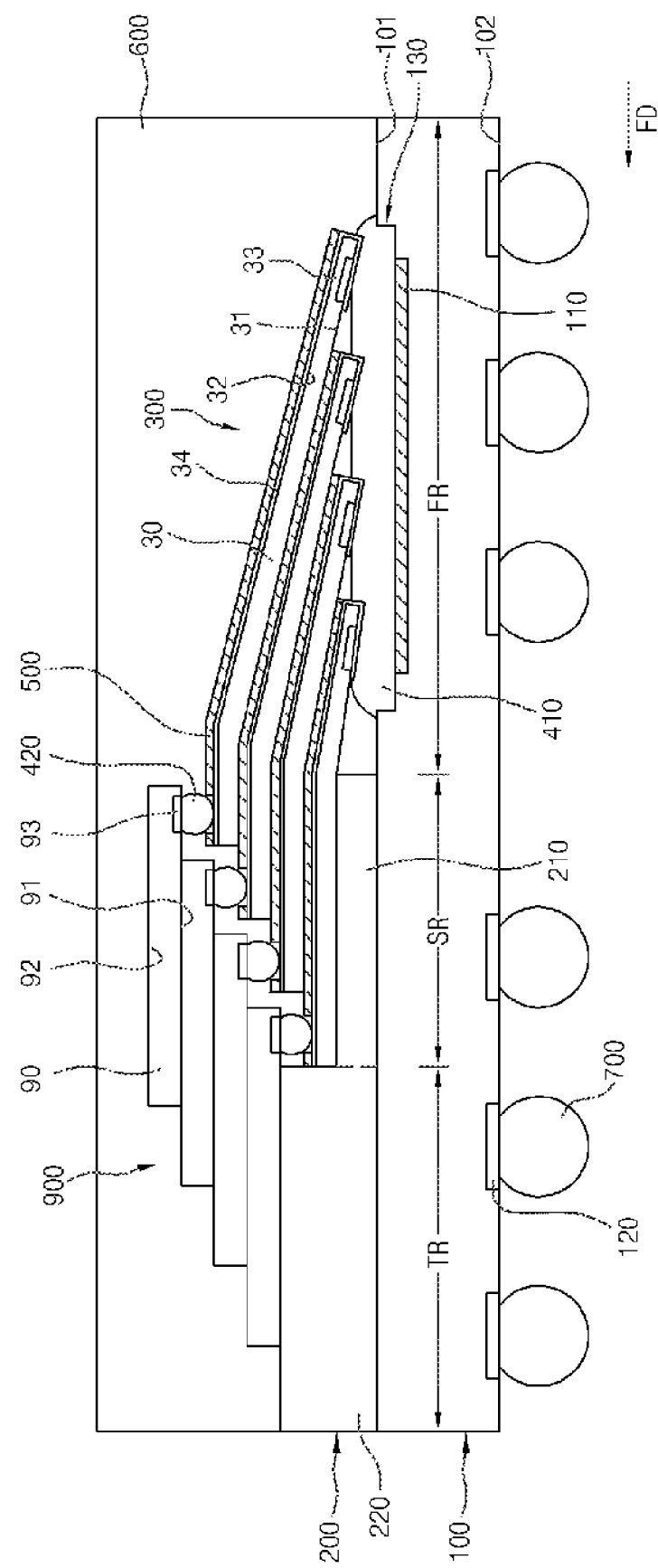
FIG. 31 is a cross-sectional view illustrating a stacked semiconductor package in accordance with a nineteenth embodiment of the present invention.

FIG. 31 is a cross-sectional view illustrating a stacked semiconductor package in accordance with a nineteenth embodiment of the present invention.

The stacked semiconductor package in accordance with the nineteen embodiment of the present invention has a structure in which the shapes of the first connection members 410 are changed with respect to the stacked semiconductor package according to the eighteenth embodiment of the present invention described above with reference to FIGS. 29 and 30. Hence, the stacked semiconductor package according to the nineteenth embodiment of the present invention has substantially the same configuration as the stacked semiconductor package according to the eighteenth embodiment except for the first connection pads 410. Therefore, repeated descriptions for the same component elements will be omitted herein, and the same terms and the same reference numerals will be used to refer to the same component parts.

Referring to FIG. 31, in the present embodiment, first connection members 410 electrically connect first bonding pads 33 of first semiconductor chips 30 and connection pads 110 of a substrate 100, and are continuously formed on the connection pads 110 to correspond to the first bonding pads 33 of the first semiconductor chips 30. For example, the first connection members 410 may include conductive paste or conductive tape.

In the present embodiment, when compared to the eighteenth embodiment, since the areas of the first connection members 410 to contact the substrate 100 and the first semiconductor chips 30 are increased, the junction strengths of the first connection members 410 can be improved.

Figure 32:
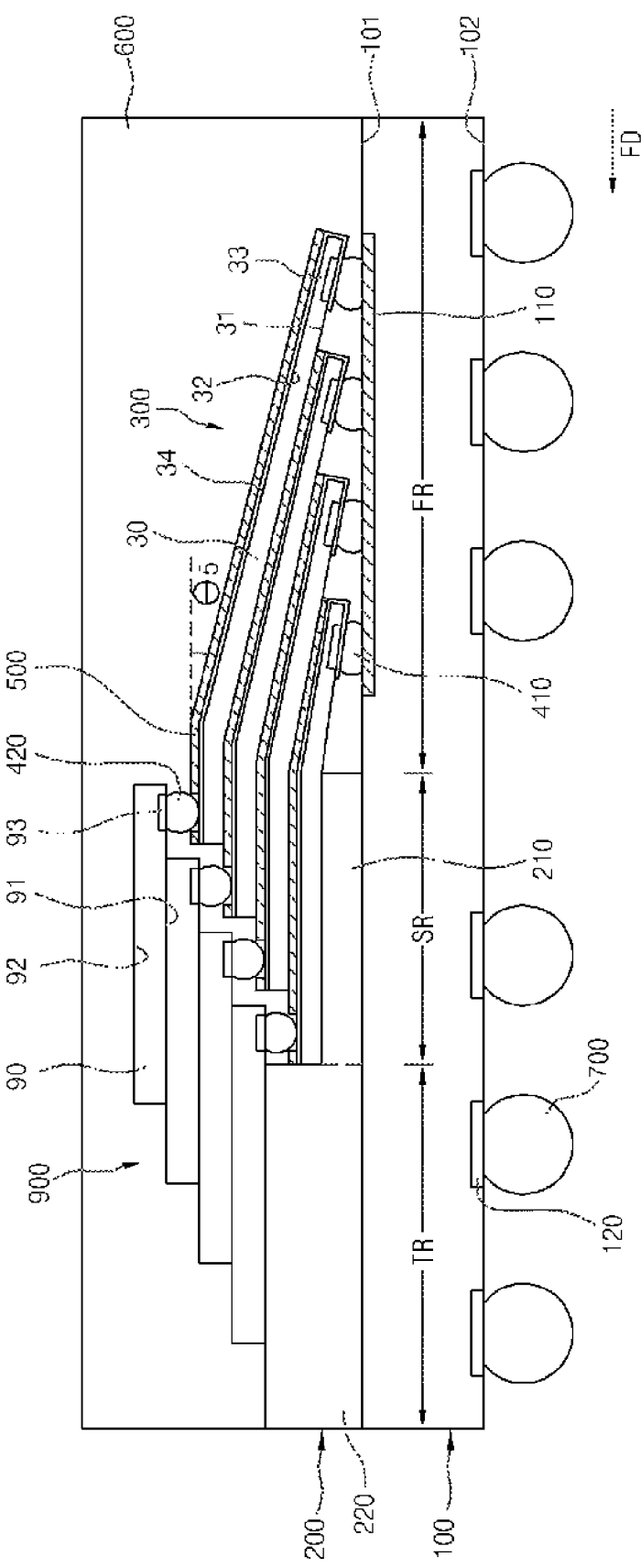
FIG. 32 is a cross-sectional view illustrating a stacked semiconductor package in accordance with a twentieth embodiment of the present invention.

FIG. 32 is a cross-sectional view illustrating a stacked semiconductor package in accordance with a twentieth embodiment of the present invention.

The stacked semiconductor package in accordance with the twentieth embodiment of the present invention has a structure in which the shapes of the connection pads 110 are changed with respect to the stacked semiconductor package according to the fifteenth embodiment of the present invention described above with reference to FIGS. 23 and 24. Hence, the stacked semiconductor package according to the twentieth embodiment of the present invention has substantially the same configuration as the stacked semiconductor package according to the fifteenth embodiment except for the connection pads 110. Therefore, repeated descriptions for the same component elements will be omitted herein, and the same terms and the same reference numerals will be used to refer to the same component parts.

Referring to FIG. 32, in the present embodiment, connection pads 110 are formed in a first region FR of a substrate 100 in the shapes of lines which extend in a first direction FD, and are electrically connected with first bonding pads 33 of first semiconductor chips 30.

First connection members 410 electrically connect the first bonding pads 33 of the first semiconductor chips 30 and the connection pads 110 of the substrate 100. In the present embodiment, the first connection members 410 are separately formed to respectively correspond to the first bonding pads 33 of the first semiconductor chips 30. For example, the first connection members 410 may include bumps or solder balls.

In the fifteenth embodiment of the present invention described above with reference to FIGS. 23 and 24, since the connection pads 110 are formed as dot types, if the bending angle θ5 of the first semiconductor chips 30 is out of a predetermined range, a failure may be caused in that the first bonding pads 33 of the first semiconductor chips 30 and the connection pads 110 of the substrate 100 are unlikely to be electrically connected with each other. Hence, the bending angle θ5 of the first semiconductor chips 30 should be appropriately controlled. In the present embodiment, since the connection pads 110 are formed in the shapes of lines, even when a bending angle θ5 of the first semiconductor chips 30 is not precisely controlled, the first bonding pads 33 of the first semiconductor chips 30 and the connection pads 110 of the substrate 100 can be electrically connected with each other.

Figure 33:
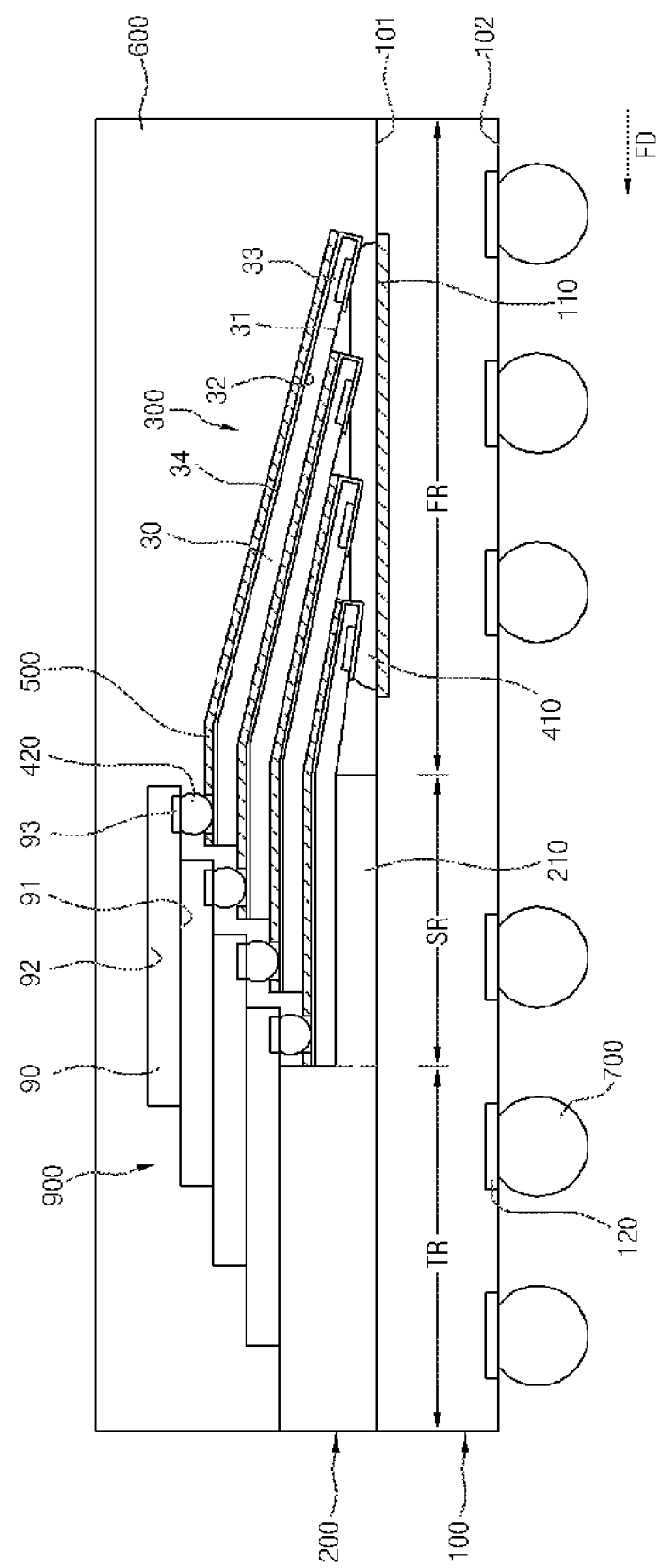
FIG. 33 is a cross-sectional view illustrating a stacked semiconductor package in accordance with a twenty-first embodiment of the present invention.

FIG. 33 is a cross-sectional view illustrating a stacked semiconductor package in accordance with a twenty-first embodiment of the present invention.

The stacked semiconductor package in accordance with the twenty-first embodiment of the present invention has a structure in which the shapes of the first connection members 410 are changed with respect to the stacked semiconductor package according to the twentieth embodiment of the present invention described above with reference to FIG. 32. Hence, the stacked semiconductor package according to the twenty-first embodiment of the present invention has substantially the same configuration as the stacked semiconductor package according to the twentieth embodiment except the first connection members 410. Therefore, repeated descriptions for the same component elements will be omitted herein, and the same terms and the same reference numerals will be used to refer to the same component parts.

Referring to FIG. 33, in the present embodiment, first connection members 410 electrically connect first bonding pads 33 of first semiconductor chips 30 and connection pads 110 of a substrate 100, and are continuously formed on the connection pads 110 to correspond to the first bonding pads 33 of the first semiconductor chips 30. For example, the first connection members 410 may include conductive paste or conductive tape.

In the present embodiment, when compared to the twentieth embodiment described above with reference to FIG. 32, since the areas of the first connection members 410 to contact the substrate 100 and the first semiconductor chips 30 are increased, the junction strengths of the first connection members 410 can be improved.

Figure 34:
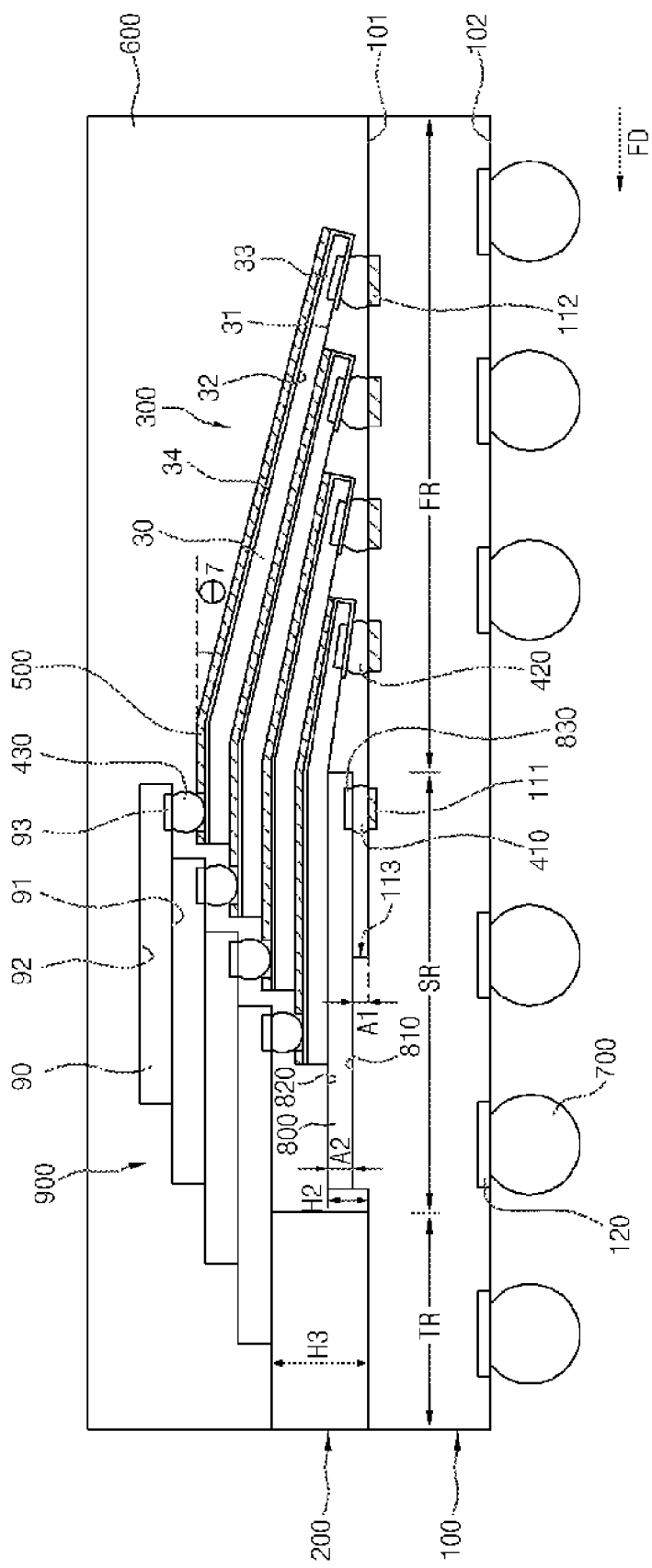
FIG. 34 is a cross-sectional view illustrating a stacked semiconductor package in accordance with a twenty-second embodiment of the present invention.
Figure 35:
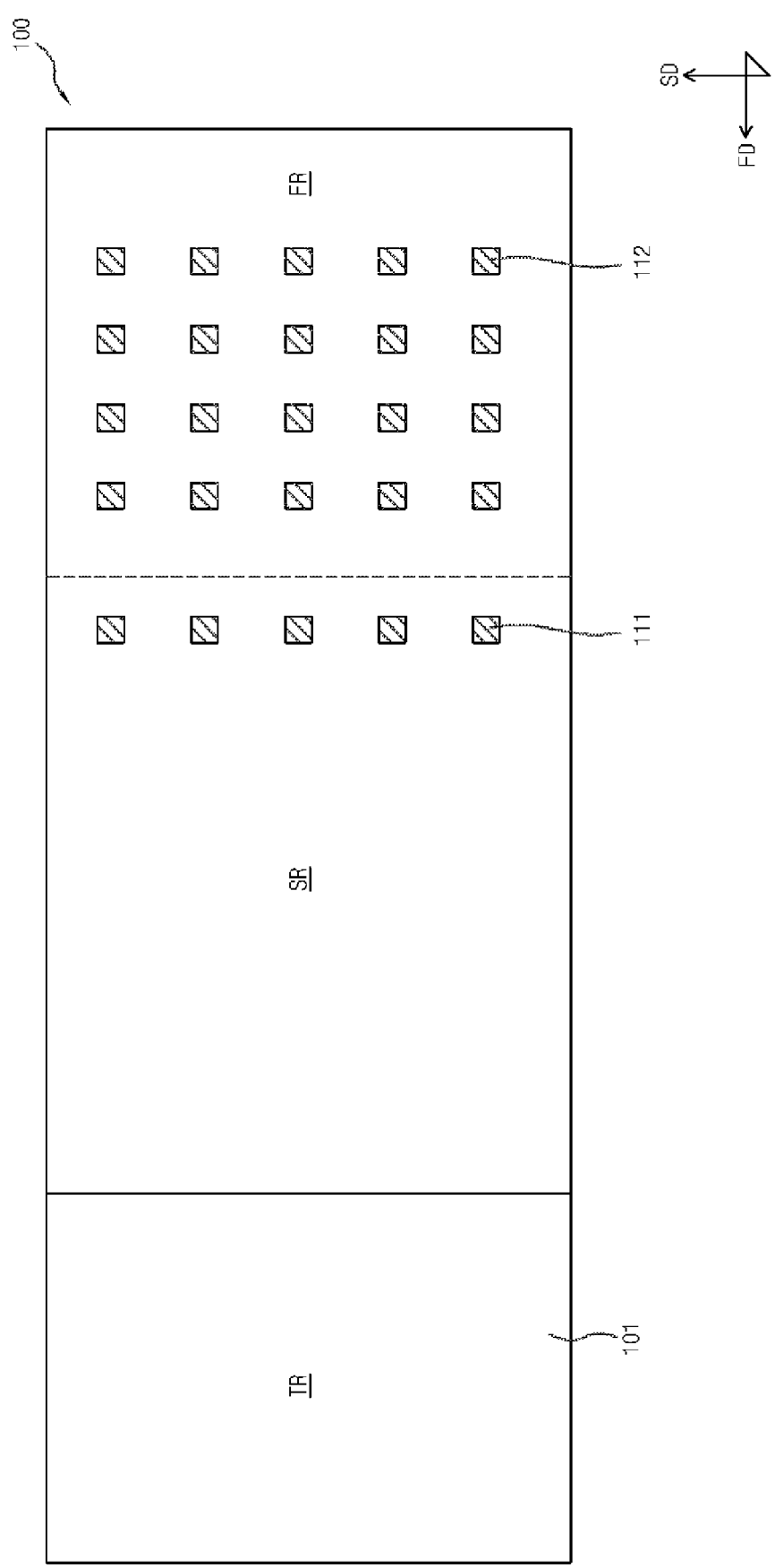
FIG. 35 is a plan view illustrating the substrate shown in FIG. 34.

FIG. 34 is a cross-sectional view illustrating a stacked semiconductor package in accordance with a twenty-second embodiment of the present invention, and FIG. 35 is a plan view illustrating the substrate shown in FIG. 34.

Referring to FIGS. 34 and 35, the stacked semiconductor package in accordance with the twenty-second embodiment of the present invention includes a substrate 100, a support member 200, an additional semiconductor chip 800, a semiconductor chip module 300, and an additional semiconductor chip module 900. In addition, the stacked semiconductor package further includes first, second and third connection members 410, 420 and 430, fixing members 500, a molding part 600, and external connection terminals 700.

The substrate 100 may be, for example, a printed circuit board (PCB). The substrate 100 is divided into a first region FR, a second region SR, and a third region TR, and has an upper surface 101, a lower surface 102, first connection pads 111, a plurality of second connection pads 112, a protruding part 113, ball lands 120, and circuit wiring lines (not shown).

The first region FR, the second region SR, and the third region TR are sequentially defined along a first direction FD shown in FIGS. 34 and 35.

The upper surface 101 faces away from the lower surface 102, and the first connection pads 111 are formed near an edge of the second region SR which adjoins the first region FR, on the upper surface 101 of the substrate 100. The second connection pads 112 are formed in the first region FR on the upper surface 101 of the substrate 100, and the protruding part 113 is formed in the second region SR on the upper surface 101 of the substrate 100 outside the first connection pads 111. The ball lands 120 are formed on the lower surface 102 of the substrate 100. The circuit wiring lines are formed in the substrate 100 and are electrically connected with the first connection pads 111, the second connection pads 112 and the ball lands 120.

Referring again to FIG. 34, the additional semiconductor chip 800 has a first surface 810, a second surface 820, and bonding pads 830. The first surface 810 faces away from the second surface 820, and the bonding pads 830 are formed near an edge of the first surface 810.

The additional semiconductor chip 800 is mounted in the second region SR on the upper surface 101 of the substrate 100. In detail, the additional semiconductor chip 800 is supported by the protruding part 113 and is disposed on the protruding part 113 in such a way as to define the shape of a step in such a manner that the bonding pads 830 face the first connection pads 111 of the substrate 100.

In the present embodiment, the additional semiconductor chip 800 embodies the case in which the first support part according to the fifteenth to twenty-first embodiments described above with reference to FIGS. 23 to 33 is formed as a semiconductor chip.

The first connection members 410 electrically connect the first connection pads 111 of the substrate 100 with the bonding pads 830 of the additional semiconductor chip 800. The first connection members 410 may include, for example, bumps or solder balls.

The support member 200 is formed in the third region TR of the substrate 100. The support member 200 has a thickness H3 larger than a height H2 from the upper surface 101 of the substrate 100 to the second surface 820 of the additional semiconductor chip 800.

In the present embodiment, the support member 200 is attached to the substrate 100 by the medium of an adhesive member (not shown) such as, for example, adhesive tape or adhesive paste after being manufactured separately from the substrate 100. Unlike this, the support member 200 may be formed integrally with the substrate 100 when manufacturing the substrate 100, without being manufactured separately from the substrate 100.

The support member 200 may be, for example, any one of a dummy wafer, a glass substrate, a spacer tape, an insulation substrate and a solder resist. Unlike this, the support member 200 may be, for example, a semiconductor chip.

The semiconductor chip module 300 includes a plurality of first semiconductor chips 30.

Each first semiconductor chip 30 has a first surface 31, a second surface 32, and first bonding pads 33. The first surface 31 faces away from the second surface 32, and the first bonding pads 33 are formed near one edge of the first surface 31.

The first semiconductor chips 30 are stacked on the additional semiconductor chip 800 in a step-like shape such that the first bonding pads 33 of the respective first semiconductor chips 30 face the declining slope of a first region FR of the substrate 100, such that the first bonding pads 33 of the respective first semiconductor chips 30 are electrically connected with the second connection pads 112 of the substrate 100.

An angle θ7 at which the first semiconductor chips 30 are bent is determined depending upon the height H2 from the upper surface 101 of the substrate 100 to the second surface 820 of the additional semiconductor chip 800.

If the height H2 increases, since the bending angle θ7 of the first semiconductor chips 30 constituting the semiconductor chip module 300 increases, the area occupied by the semiconductor chip module 300 decreases, reducing the area of the stacked semiconductor package. However, if the height H2 increases, the thickness of the stacked semiconductor package increases. Conversely, if the height H2 decreases, although the thickness of the stacked semiconductor package can be reduced, the bending angle θ7 at which the first semiconductor chips 30 are bent decreases, and the area occupied by the semiconductor chip module 300 increases. Therefore, it may be desirable to appropriately adjust the height H2 in consideration of these factors.

The height H2 corresponds to the sum of a height A1 of the protruding part 113 of the substrate 100 and a thickness A2 of the additional semiconductor chip 800. Thus, in order to adjust the height H2, A1 or A2 should be adjusted. The pitch of the first connection members 410 changes depending upon the magnitude of A1. If A1 decreases and the pitch of the first connection members 410 decreases, the junction strength of the first connection members 410 deteriorates. Conversely, if A1 increases and the pitch of the first connection members 410 increases, a failure may occur due to a bridge phenomenon in which adjoining first connection members 410 short-circuit to each other. Therefore, limitations exist in adjusting the value of A1. Hence, it may be desirable that the height H2 be adjusted through adjusting the thickness A2 of the additional semiconductor chip 800. For this reason, the additional semiconductor chip 800 may have a thickness different from that of the first semiconductor chips 30.

The second connection members 420 electrically connect the first bonding pads 33 of the first semiconductor chips 30 and the second connection pads 112 of the substrate 100.

While not shown in a drawing, adhesive members are formed between the additional semiconductor chip 800 and the semiconductor chip module 300 and between the first semiconductor chips 30. The adhesive members may include, for example, adhesive tape or adhesive paste.

The additional semiconductor chip module 900 includes second semiconductor chips 90. In the present embodiment, the additional semiconductor chip module 900 includes four second semiconductor chips 90.

Each second semiconductor chip 90 has a first surface 91, a second surface 92, and second bonding pads 93. The first surface 91 faces away from the second surface 92, and the second bonding pads 93 are formed near one edge of the first surface 91.

The second semiconductor chips 90 are stacked on the support member 200 in a step-like shape such that the second bonding pads 93 of the respective second semiconductor chips 90 are electrically connected with redistribution lines 34 of the first semiconductor chips 30.

Although it is explained and illustrated in the present embodiment that the number of the second semiconductor chips 90 is four, it is to be noted that the present invention is not limited to such and may include one or more second semiconductor chips 90.

The third connection members 430 electrically connect the second bonding pads 93 of the second semiconductor chips 90 and the redistribution lines 34 of the first semiconductor chips 30. The third connection members 430 may include, for example, bumps or solder balls.

The fixing members 500 are formed on the second surfaces 32 of the respective first semiconductor chips 30 including the redistribution lines 34 in such a way as to open portions of the redistribution lines 34 to which the third connection members 430 are to be attached. The fixing members 500 may include, for example, a thermosetting resin. The fixing members 500 are set hard by the heat applied when bending the first semiconductor chips 30. Accordingly, the bent first semiconductor chips 30 are fixed by the fixing members 500 and are prevented from returning to their original shapes.

The molding part 600 seals the upper surface 101 of the substrate 100 including the support member 200, the semiconductor chip module 300, the additional semiconductor chip 800, and the additional semiconductor chip module 900. The molding part 600 may include, for example, an epoxy molding compound (EMC).

The external connection terminals 700 are mounted to the ball lands 120 of the substrate 100. The external connection terminals 700 may include, for example, solder balls.

Figure 36:
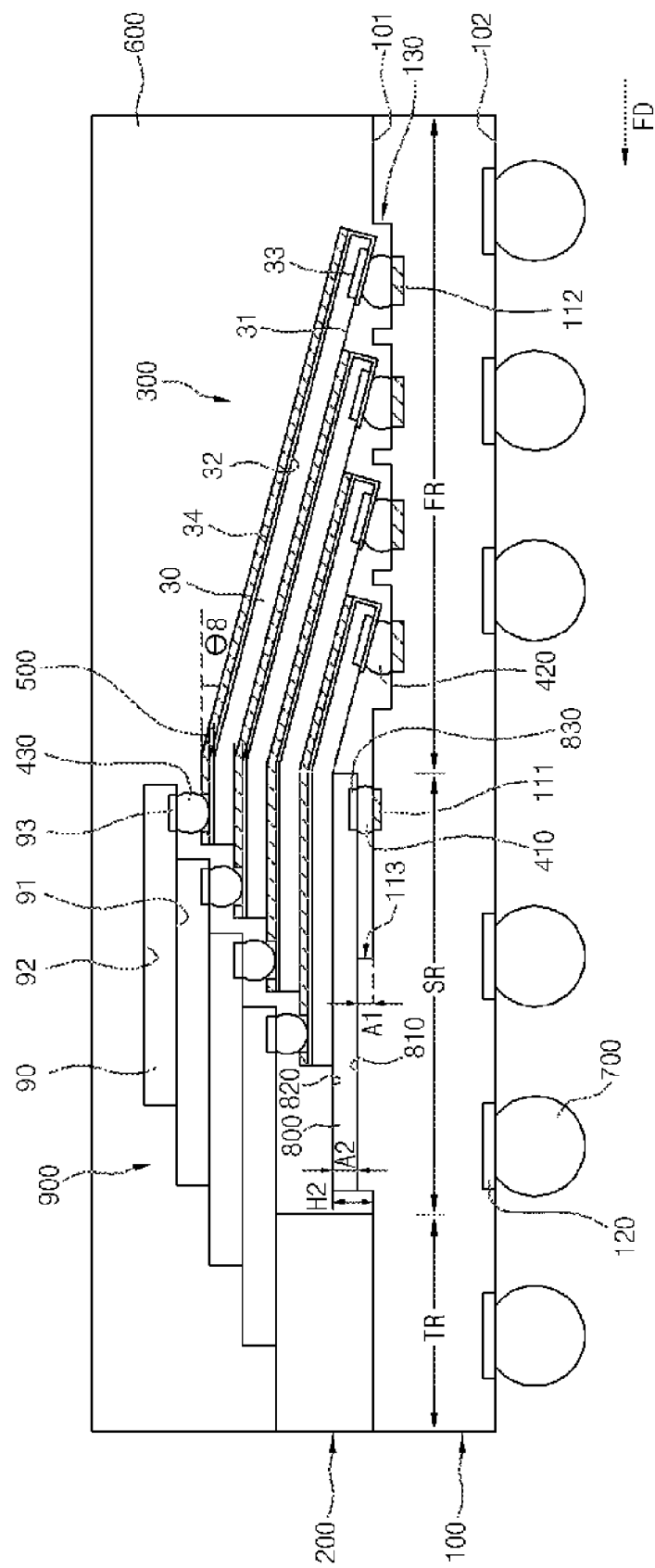
FIG. 36 is a cross-sectional view illustrating a stacked semiconductor package in accordance with a twenty-third embodiment of the present invention.
Figure 37:
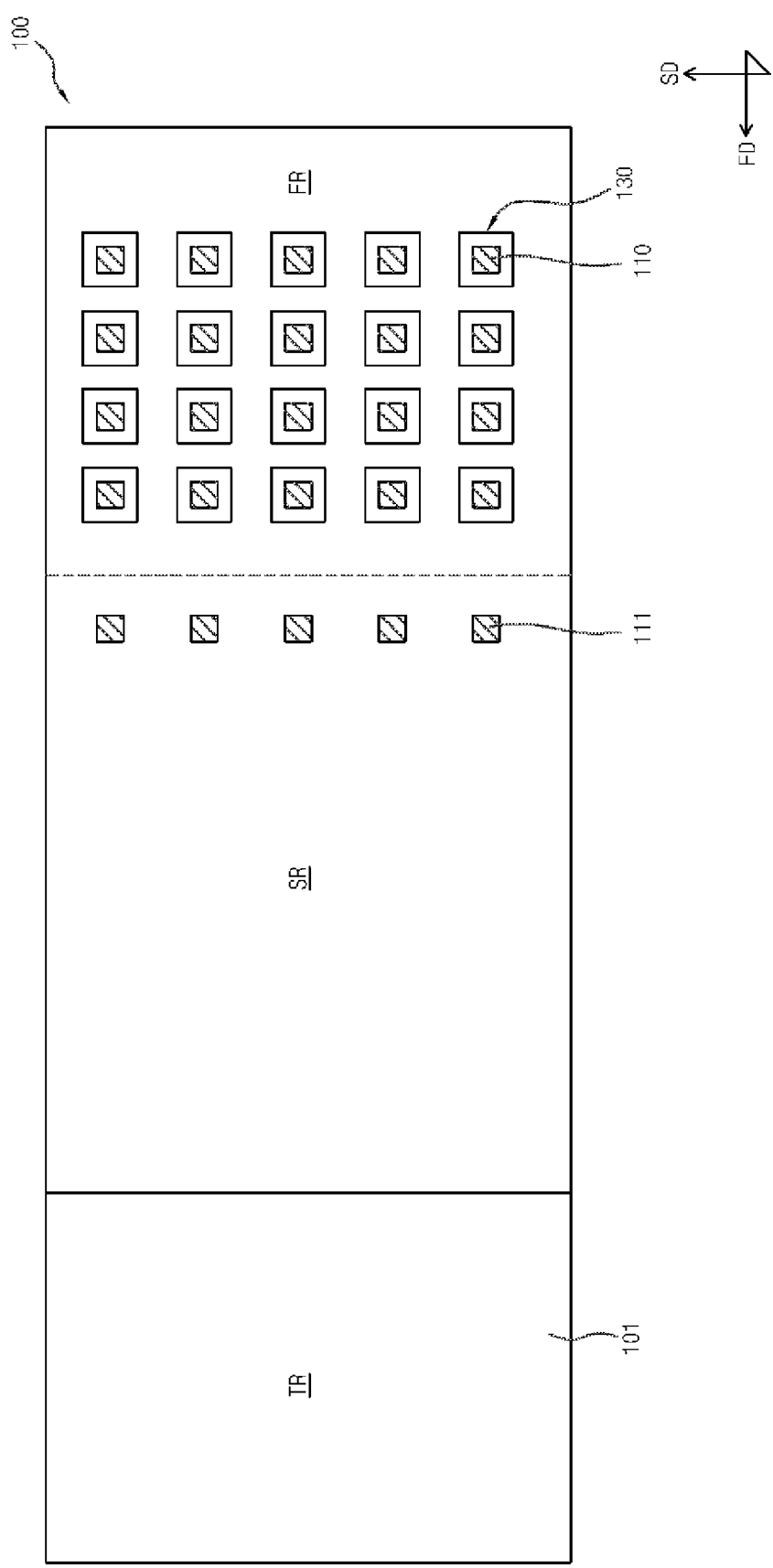
FIG. 37 is a plan view illustrating the substrate shown in FIG. 36.

FIG. 36 is a cross-sectional view illustrating a stacked semiconductor package in accordance with a twenty-third embodiment of the present invention, and FIG. 37 is a plan view illustrating the substrate shown in FIG. 36.

The stacked semiconductor package in accordance with the twenty-third embodiment of the present invention has a configuration in which grooves 130 are additionally defined in the substrate 100 with respect to the stacked semiconductor package according to the twenty-second embodiment of the present invention described above with reference to FIGS. 34 and 35. Hence, the stacked semiconductor package according to the twenty-third embodiment of the present invention has substantially the same configuration as the stacked semiconductor package according to the twenty-second embodiment except for the substrate 100. Therefore, repeated descriptions for the same component elements will be omitted herein, and the same terms and the same reference numerals will be used to refer to the same component parts.

Referring to FIGS. 36 and 37, in the present embodiment, a substrate 100 is divided into a first region FR, a second region SR, and a third region TR, and has an upper surface 101, a lower surface 102, first connection pads 111, a plurality of second connection pads 112, a protruding part 113, ball lands 120, a plurality of grooves 130, and circuit wiring lines (not shown).

The plurality of grooves 130 are defined in the first region FR on the upper surface 101 of the substrate 100 in such a way as to respectively correspond to the second connection pads 112. The second connection pads 112 are correspondingly disposed on the bottoms of the respective grooves 130.

Unlike the twenty-second embodiment in which the second connection pads 112 are formed on the upper surface 101 of the substrate 100, in the present embodiment, the second connection pads 112 are formed on the bottoms of the grooves 130, that is, at lower positions than the upper surface 101 of the substrate 100. Thus, when assuming that a height H2 from the upper surface 101 of the substrate 100 to a second surface 820 of an additional semiconductor chip 800 is constant, a bending angle θ8 of first semiconductor chips 30 constituting a semiconductor chip module 300 in the present embodiment is larger than the bending angle θ7 of the first semiconductor chips 30 in the twenty-second embodiment. As a consequence, in the present embodiment, the area occupied by the semiconductor chip module 300 may be reduced without increasing the height H2.

Figure 38:
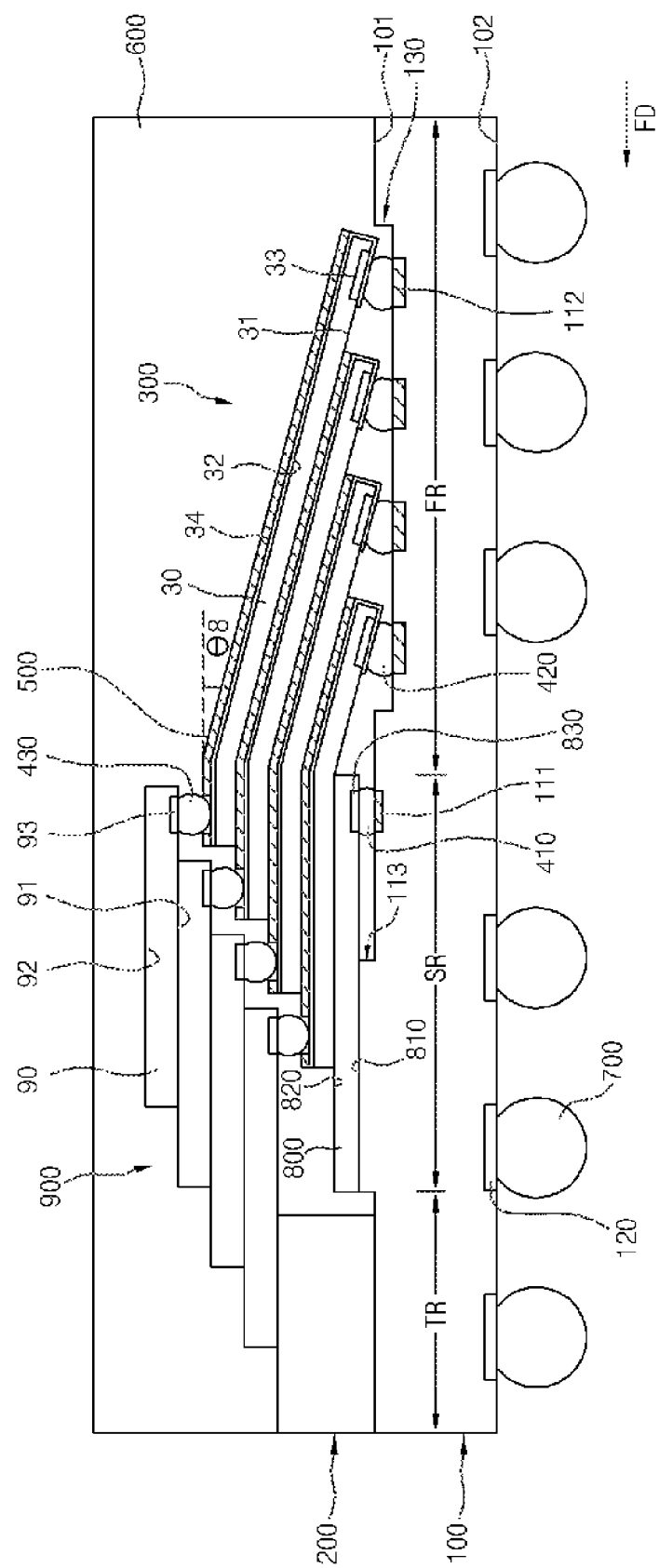
FIG. 38 is a cross-sectional view illustrating a stacked semiconductor package in accordance with a twenty-fourth embodiment of the present invention.
Figure 39:
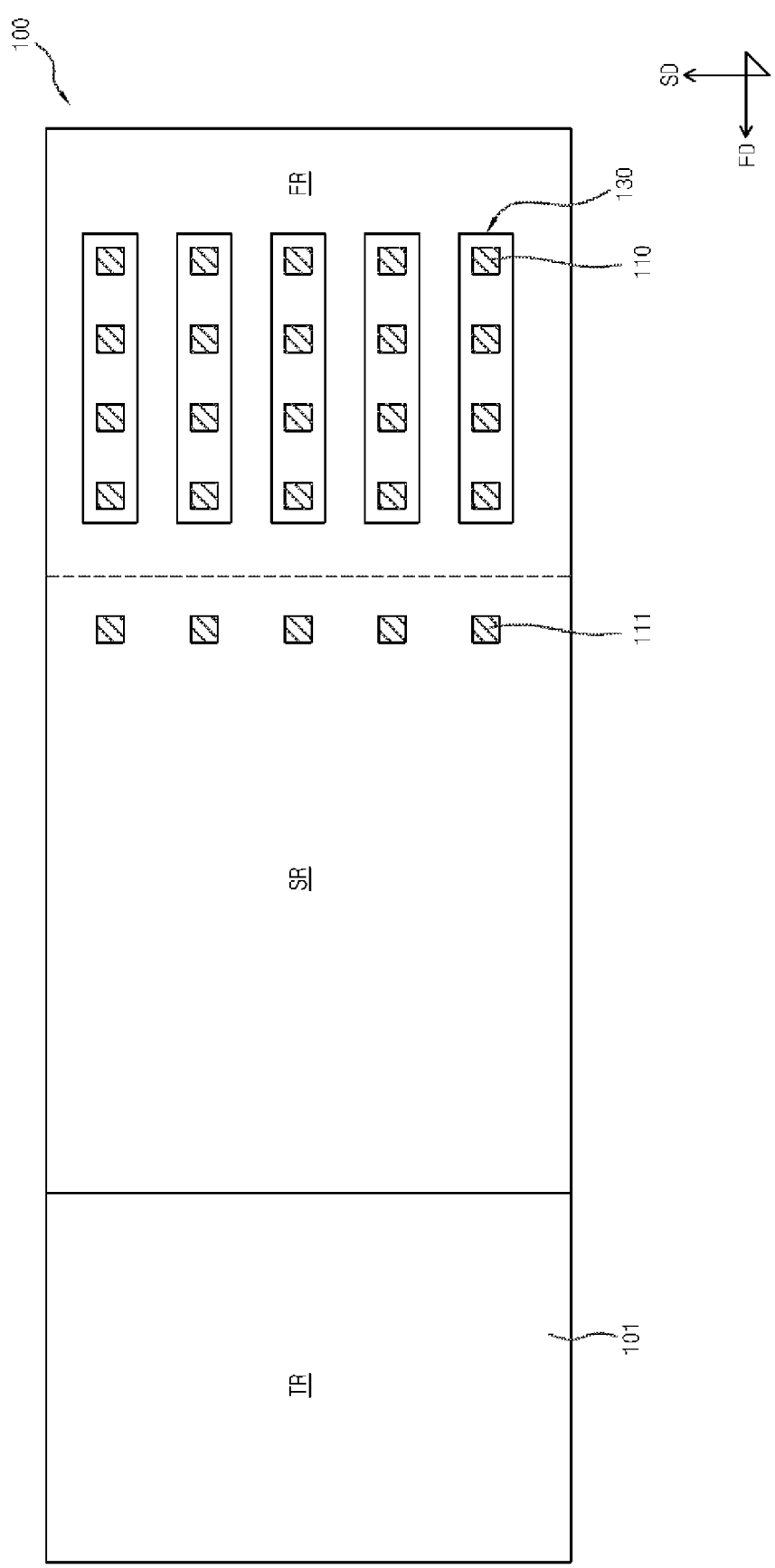
FIG. 39 is a plan view illustrating the substrate shown in FIG. 38.

FIG. 38 is a cross-sectional view illustrating a stacked semiconductor package in accordance with a twenty-fourth embodiment of the present invention, and FIG. 39 is a plan view illustrating the substrate shown in FIG. 38.

The stacked semiconductor package in accordance with the twenty-fourth embodiment of the present invention has a structure in which the shapes of the grooves 130 are changed with respect to the stacked semiconductor package according to the twenty-third embodiment of the present invention described above with reference to FIGS. 36 and 37. Hence, the stacked semiconductor package according to the twenty-fourth embodiment of the present invention has substantially the same configuration as the stacked semiconductor package according to the twenty-third embodiment except for the grooves 130. Therefore, repeated descriptions for the same component elements will be omitted herein, and the same terms and the same reference numerals will be used to refer to the same component parts.

Referring to FIGS. 38 and 39, in the present embodiment, grooves 130 are defined in the shapes of lines extending in a first direction FD, in such a manner that each groove 130 corresponds to a plurality of second connection pads 112 arranged along the first direction FD. Second connection pads 112 are correspondingly disposed on the bottoms of the grooves 130 in such a way as to be separated from one another.

In the case where a gap between the second connection pads 112 is narrow, it is difficult to define the grooves 130 as in the twenty-third embodiment in such a way as to respectively correspond to the second connection pads 112. In this regard, unlike the twenty-third embodiment, the present embodiment may be applied even when a gap between the second connection pads 112 is narrow, since each groove 130 has the shape of a line to correspond to the plurality of second connection pads 112.

Figure 40:
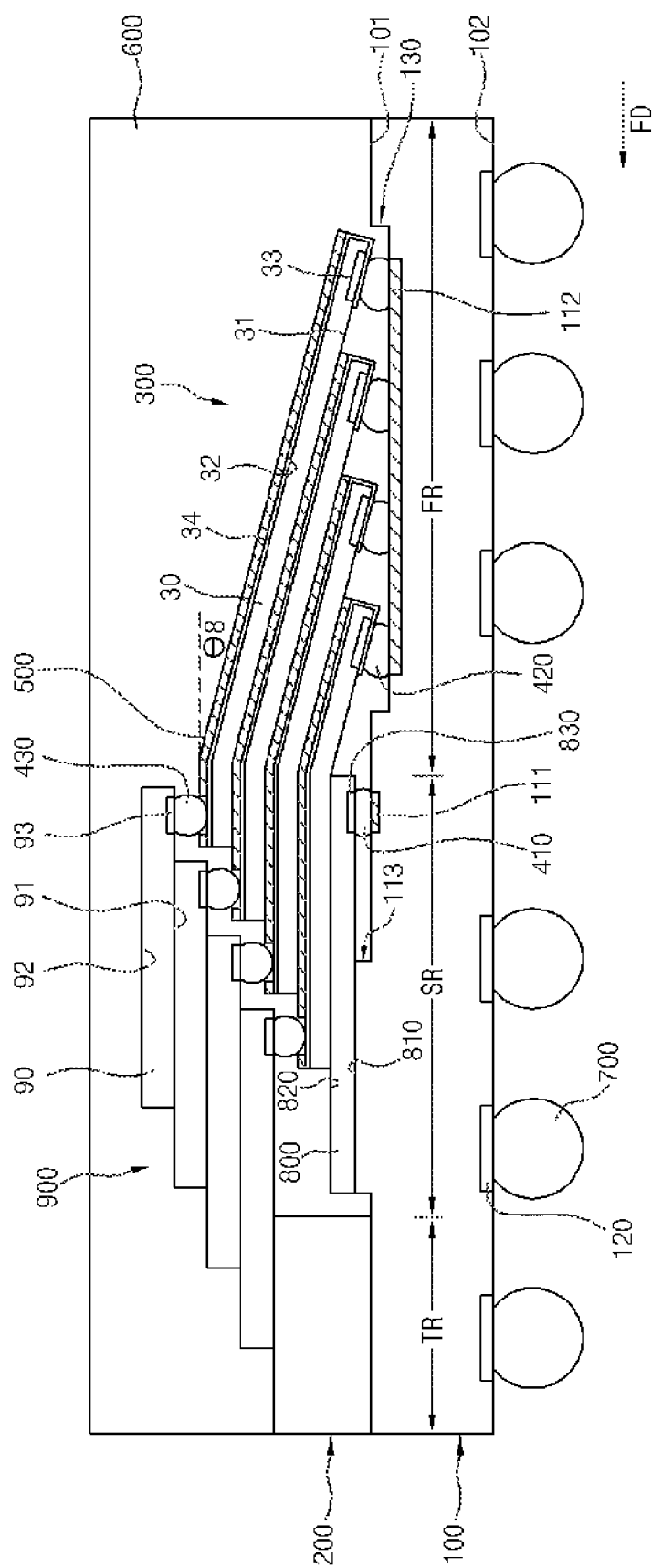
FIG. 40 is a cross-sectional view illustrating a stacked semiconductor package in accordance with a twenty-fifth embodiment of the present invention.
Figure 41:
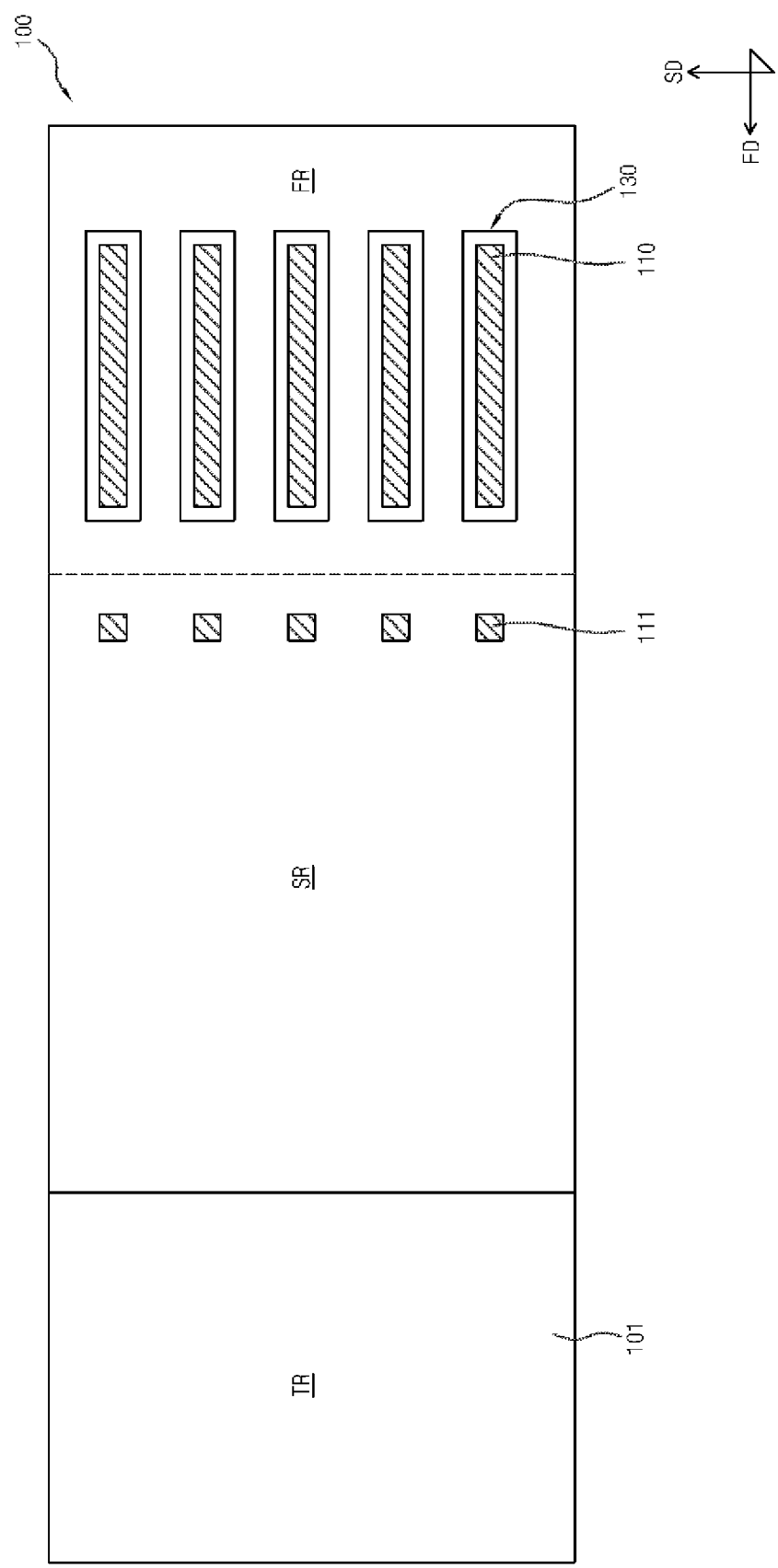
FIG. 41 is a plan view illustrating the substrate shown in FIG. 40.

FIG. 40 is a cross-sectional view illustrating a stacked semiconductor package in accordance with a twenty-fifth embodiment of the present invention, and FIG. 41 is a plan view illustrating the substrate shown in FIG. 40.

The stacked semiconductor package in accordance with the twenty-fifth embodiment of the present invention has a structure in which the shapes of the second connection pads 112 are changed with respect to the stacked semiconductor package according to the twenty-fourth embodiment of the present invention described above with reference to FIGS. 38 and 39. Hence, the stacked semiconductor package according to the twenty-fifth embodiment of the present invention has substantially the same configuration as the stacked semiconductor package according to the twenty-fourth embodiment except for the second connection pads 112. Therefore, repeated descriptions for the same component elements will be omitted herein, and the same terms and the same reference numerals will be used to refer to the same component parts.

Referring to FIGS. 40 and 41, in the present embodiment, second connection pads 112 are formed in a first region FR of a substrate 100 in the shapes of lines extending in a first direction FD. Each second connection pad 112 is electrically connected with first bonding pads 33 of a plurality of first semiconductor chips 30.

Grooves 130 are defined in the first region FR on an upper surface 101 of the substrate 100, in the shapes of lines that respectively correspond to the second connection pads 112. The second connection pads 112 are correspondingly disposed on the bottoms of the respective grooves 130. Second connection members 420 electrically connect first bonding pads 33 of the first semiconductor chips 30 and the second connection pads 112 of the substrate 100. In the present embodiment, the second connection members 420 are separately formed to respectively correspond to the first bonding pads 33 of the first semiconductor chips 30. For example, the second connection members 420 may include bumps or solder balls.

In the twenty-fourth embodiment of the present invention described above with reference to FIGS. 38 and 39, since the second connection pads 112 are formed as dot types, if the bending angle θ8 of the first semiconductor chips 30 is out of a predetermined range, a failure may be caused in that the first bonding pads 33 of the first semiconductor chips 30 and the second connection pads 112 of the substrate 100 are unlikely to be electrically connected with each other. Hence, the bending angle θ8 of the first semiconductor chips 30 should be appropriately controlled. In the present embodiment, since the second connection pads 112 are formed in the shapes of lines, even when a bending angle θ8 of the first semiconductor chips 30 is not precisely controlled, the first bonding pads 33 of the first semiconductor chips 30 and the second connection pads 112 of the substrate 100 can be electrically connected with each other in a stable manner.

Figure 42:
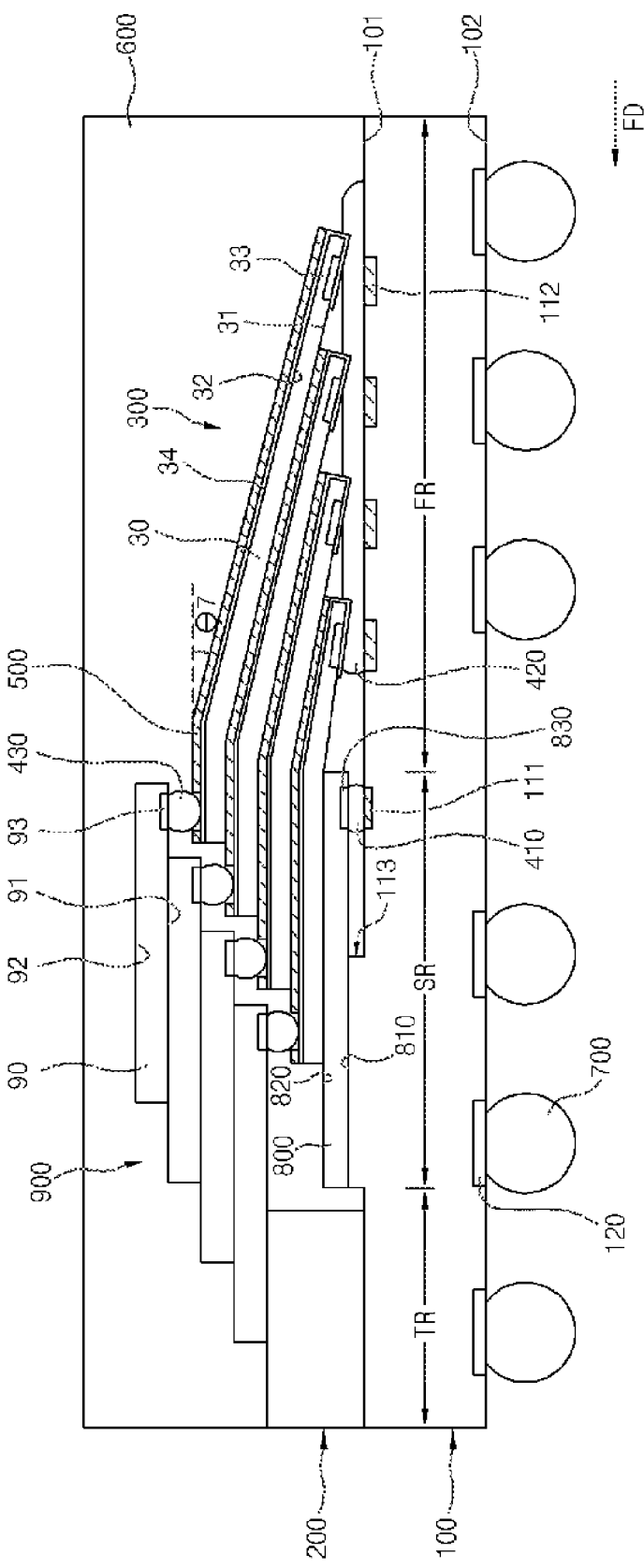
FIG. 42 is a cross-sectional view illustrating a stacked semiconductor package in accordance with a twenty-sixth embodiment of the present invention.

FIG. 42 is a cross-sectional view illustrating a stacked semiconductor package in accordance with a twenty-sixth embodiment of the present invention.

The stacked semiconductor package in accordance with the twenty-sixth embodiment of the present invention has a structure in which the shapes of the second connection members 420 are changed with respect to the stacked semiconductor package according to the twenty-fifth embodiment of the present invention described above with reference to FIGS. 40 and 41. Hence, the stacked semiconductor package according to the twenty-sixth embodiment of the present invention has substantially the same configuration as the stacked semiconductor package according to the twenty-fifth embodiment except for the second connection members 420. Therefore, repeated descriptions for the same component elements will be omitted herein, and the same terms and the same reference numerals will be used to refer to the same component parts.

Referring to FIG. 42, in the present embodiment, second connection members 420 electrically connect first bonding pads 33 of first semiconductor chips 30 and second connection pads 112 of a substrate 100, and are continuously formed on the second connection pads 112 to correspond to the first bonding pads 33 of the first semiconductor chips 30. For example, the second connection members 420 may include, for example, conductive paste or conductive tape.

In the present embodiment, when compared to the twenty-fifth embodiment, since the areas of the second connection members 420 to contact the substrate 100 and the first semiconductor chips 30 are increased, the junction strengths of the second connection members 420 can be improved.

Figure 43:
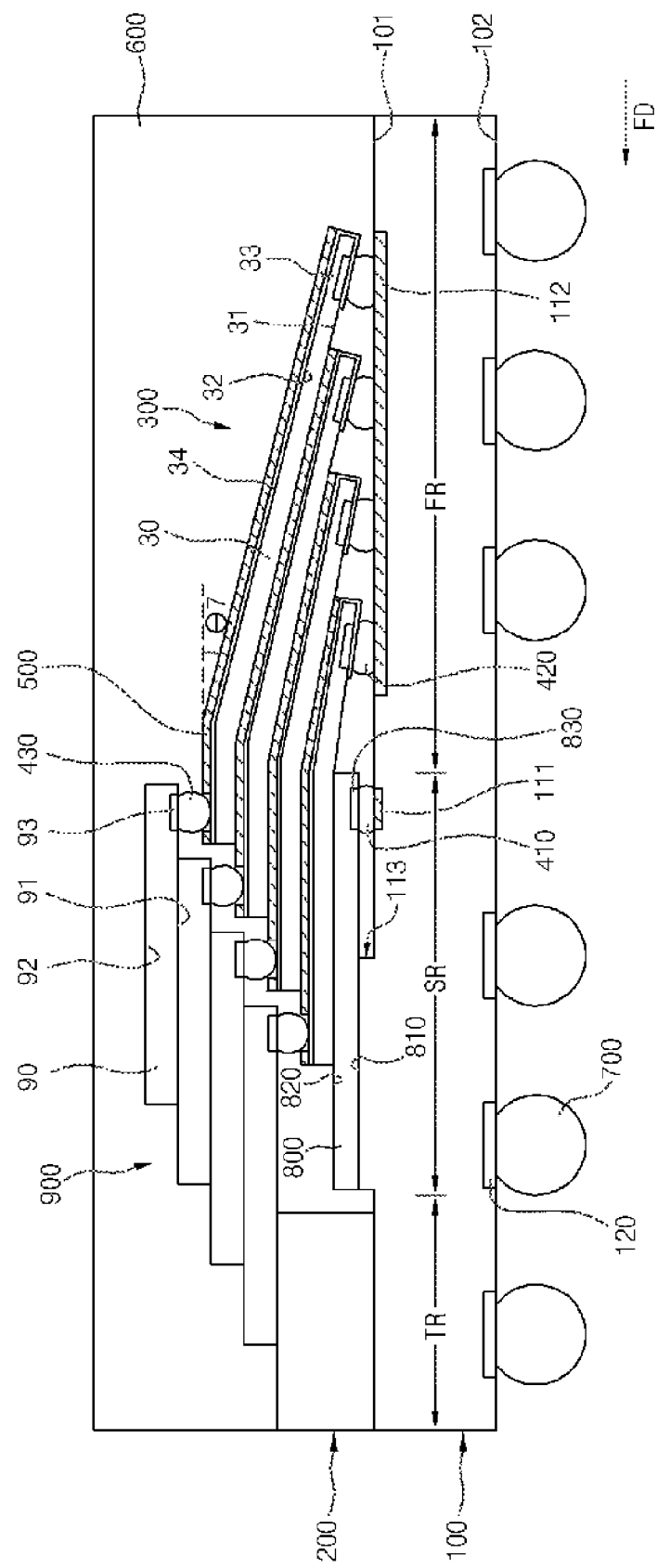
FIG. 43 is a cross-sectional view illustrating a stacked semiconductor package in accordance with a twenty-seventh embodiment of the present invention.

FIG. 43 is a cross-sectional view illustrating a stacked semiconductor package in accordance with a twenty-seventh embodiment of the present invention.

The stacked semiconductor package in accordance with the twenty-seventh embodiment of the present invention has a structure in which the shapes of the second connection pads 112 are changed with respect to the stacked semiconductor package according to the twenty-second embodiment of the present invention described above with reference to FIGS. 34 and 35. Hence, the stacked semiconductor package according to the twenty-seventh embodiment of the present invention has substantially the same configuration as the stacked semiconductor package according to the twenty-second embodiment except for the second connection pads 112. Therefore, repeated descriptions for the same component elements will be omitted herein, and the same terms and the same reference numerals will be used to refer to the same component parts.

Referring to FIG. 43, in the present embodiment, second connection pads 112 are formed in a first region FR of a substrate 100 in the shapes of lines extending in a first direction FD, and are electrically connected with first bonding pads 33 of a plurality of first semiconductor chips 30 which constitute a semiconductor chip module 300.

In the twenty-second embodiment of the present invention described above with reference to FIGS. 34 and 35, since the second connection pads 112 are formed as dot types, if the bending angle θ7 of the first semiconductor chips 30 is out of a predetermined range, a fail may be caused in that the first bonding pads 33 of the first semiconductor chips 30 and the second connection pads 112 of the substrate 100 are unlikely to be electrically connected with each other. Hence, the bending angle θ7 of the first semiconductor chips 30 should be appropriately controlled. In the present embodiment, since the second connection pads 112 are formed in the shapes of lines, even when a bending angle θ7 of the first semiconductor chips 30 is not precisely controlled, the first bonding pads 33 of the first semiconductor chips 30 and the second connection pads 112 of the substrate 100 can be electrically connected with each other.

Figure 44:
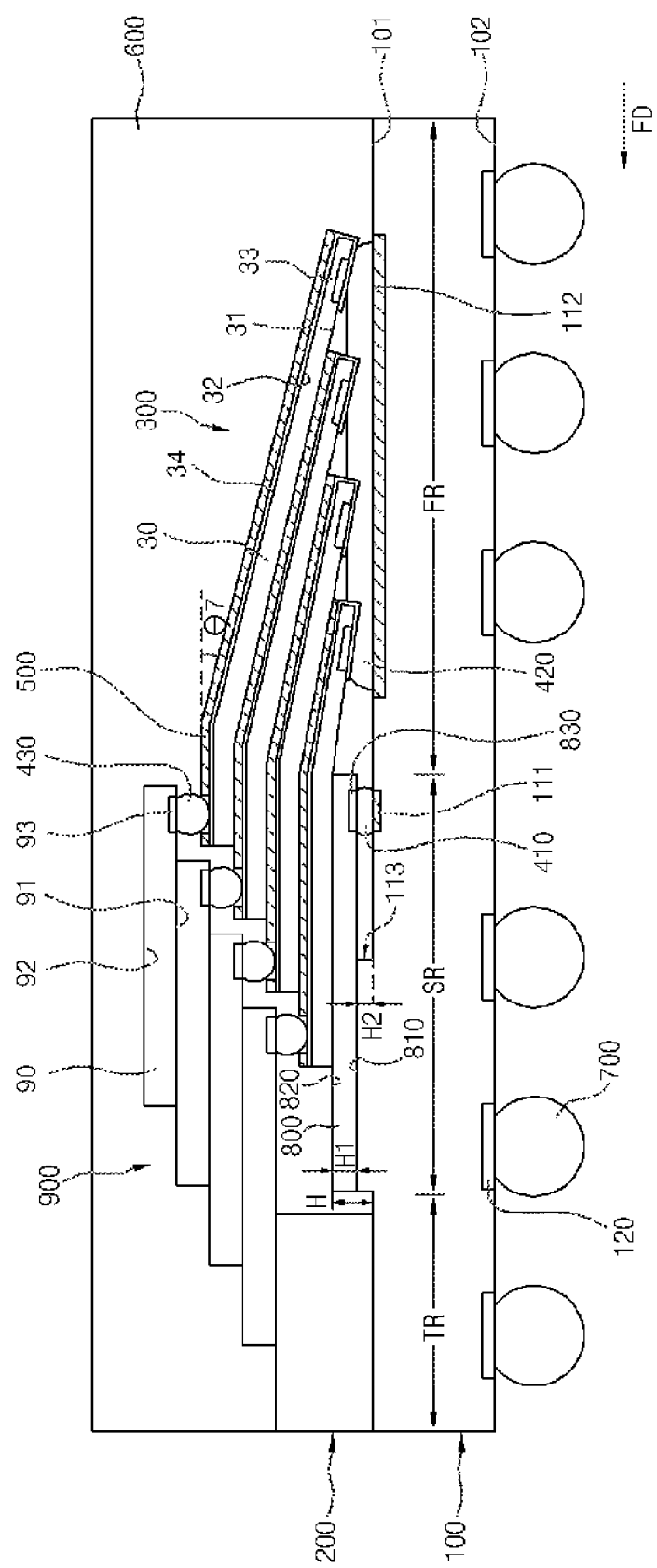
FIG. 44 is a cross-sectional view illustrating a stacked semiconductor package in accordance with a twenty-eighth embodiment of the present invention.

FIG. 44 is a cross-sectional view illustrating a stacked semiconductor package in accordance with a twenty-eighth embodiment of the present invention.

The stacked semiconductor package in accordance with the twenty-eighth embodiment of the present invention has a structure in which the shapes of the second connection members 420 are changed with respect to the stacked semiconductor package according to the twenty-seventh embodiment of the present invention described above with reference to FIG. 43. Hence, the stacked semiconductor package according to the twenty-eighth embodiment of the present invention has substantially the same configuration as the stacked semiconductor package according to the twenty-seventh embodiment except for the second connection members 420. Therefore, repeated descriptions for the same component elements will be omitted herein, and the same terms and the same reference numerals will be used to refer to the same component parts.

Referring to FIG. 44, in the present embodiment, second connection members 420 electrically connect first bonding pads 33 of first semiconductor chips 30 and second connection pads 112 of a substrate 100, and are continuously formed on the second connection pads 112 to correspond to the first bonding pads 33 of the first semiconductor chips 30. For example, the second connection members 420 may include conductive paste or conductive tape.

In the present embodiment, when compared to the twenty-seventh embodiment, since the areas of the second connection members 420 to contact the substrate 100 and the first semiconductor chips 30 are increased, the junction strengths of the second connection members 420 can be improved.

Although it was explained and illustrated in the twenty-second to twenty-eighth embodiments of the present invention described above with reference to FIGS. 34 to 44 that the substrate 100 includes the protruding part 113, it is conceivable that the substrate 100 may not include the protruding part 113 and an additional support member may be used in place of the protruding part 113.

The aforementioned stacked semiconductor packages may be applied to various package modules.

Figure 45:
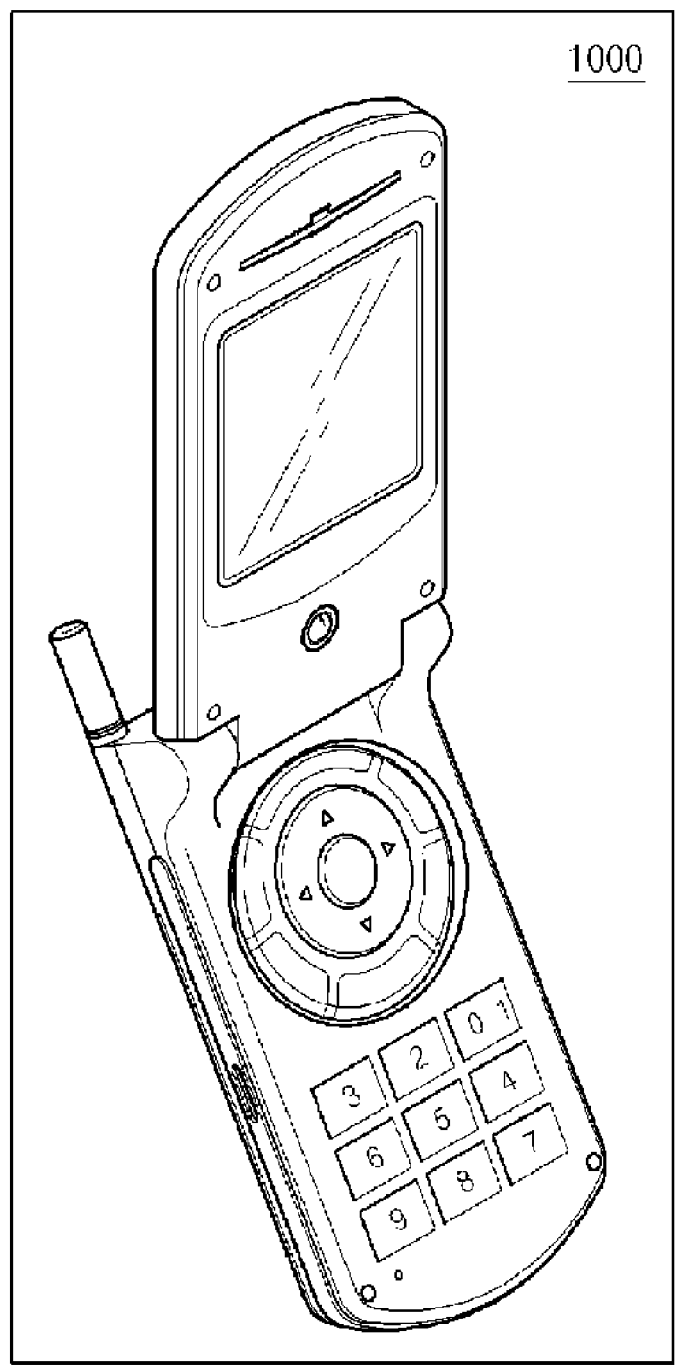
FIG. 45 is a perspective view illustrating an electronic appliance with a stacked semiconductor package according to an embodiment of the present invention.

FIG. 45 is a perspective view illustrating an electronic appliance with a stacked semiconductor package according to an embodiment of the present invention. Referring to FIG. 45, the stacked semiconductor packages according to the embodiments of the present invention may be applied to an electronic appliance 1000 such as a mobile phone. Since the stacked semiconductor packages according to the embodiments of the present invention are advantageous in terms of size reduction and electrical characteristics, benefits are provided in the light of lightweight, thinness, compactness and miniaturization of the electronic appliance 1000 in which various functions are realized together. The electronic appliance 1000 is not limited to the mobile phone as shown in FIG. 45, and may include various electronic appliances such as, for example, a mobile electronic appliance, a laptop computer, a notebook computer, a portable multimedia player (PMP), an MP3 player, a camcorder, a web tablet, an wireless phone, a navigator, and a personal digital assistant (PDA).

Figure 46:
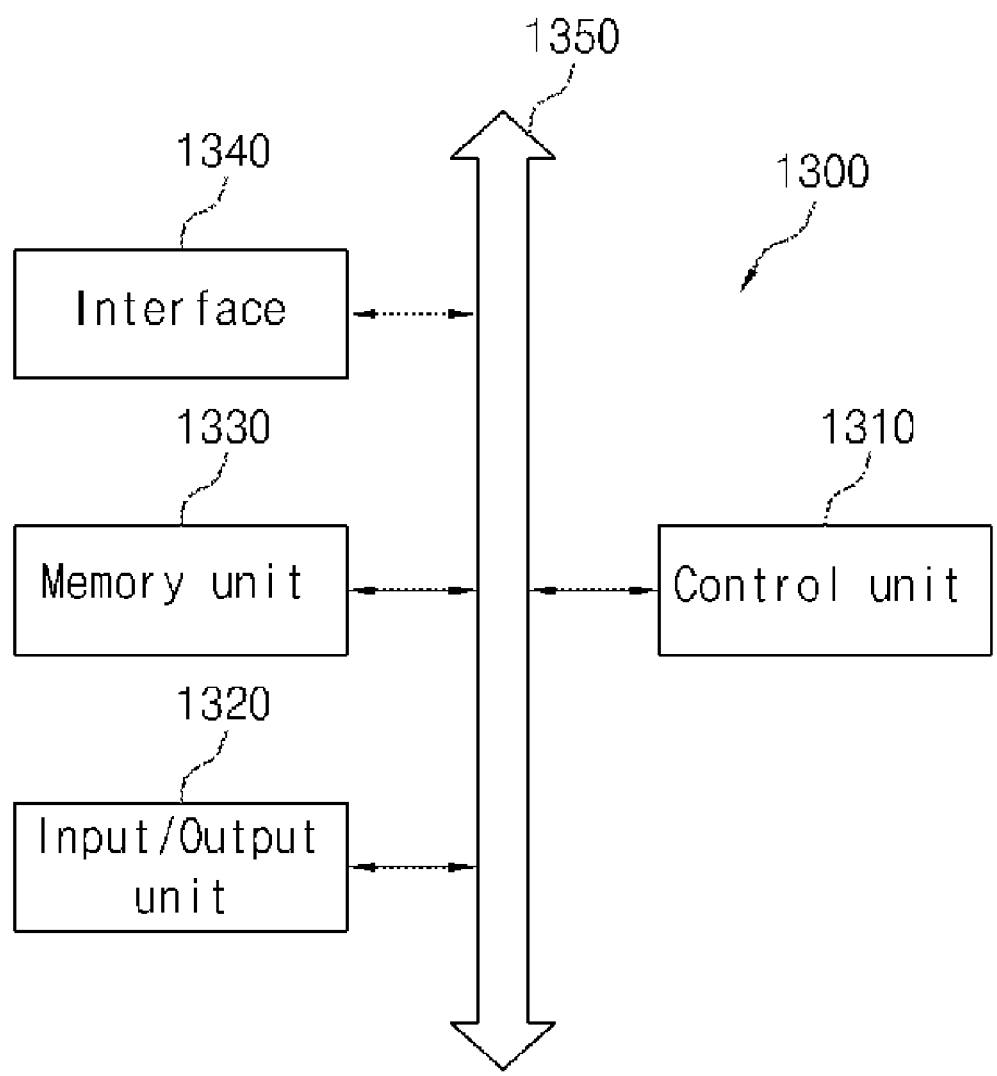
FIG. 46 is a system block diagram illustrating an electronic appliance to which a stacked semiconductor package according to an embodiment of the present invention is applied.

FIG. 46 is a system block diagram illustrating an electronic appliance to which a stacked semiconductor package according to an embodiment of the present invention is applied. Referring to FIG. 46, an electronic system 1300 may include a controller 1310, an input/output unit 1320, and a memory unit 1330. The controller 1310, the input/output unit 1320 and the memory unit 1330 may be coupled with one another through a bus 1350. The bus 1350 may be a path through which data may be transmitted. For example, the controller 1310 may include at least any one of a microprocessor, a digital signal processor, a microcontroller, and a logic device capable of performing the same function as these devices. The controller 1310 and the memory unit 1330 may include a stacked semiconductor package according to an embodiment of the present invention. The input/output unit 1320 may include at least one selected among a keypad, a keyboard and a display device. The memory unit 1330 is a unit for storing data. The memory unit 1330 may store data and/or instructions to be executed by the controller 1310. The memory unit 1330 may include a volatile memory device and/or a nonvolatile memory device. The memory unit 1330 may be formed of, for example, flash memory. For example, a flash memory to which the technology of the present invention is applied may be mounted to an information processing system such as a mobile terminal or a desktop computer. Such a flash memory may constitute a solid state disk (SSD). In this case, the electronic system 1300 may store a large amount of data in the flash memory system. The electronic system 1300 may further include an interface 1340 configured to transmit and receive data to and from a communication network. The interface 1340 may have a wired or wireless form. For example, the interface 1340 may include an antenna or a wired or wireless transceiver. Further, while not shown in a drawing, a person having ordinary knowledge in the art may appreciate that an application chipset, a camera image processor (CIS) and an input/output unit may be additionally provided to the electronic system 1300.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package comprising:
   a substrate having an upper surface and a lower surface, and comprising a first region adjoining a second region;
   a support member formed in the second region on the upper surface of the substrate; and
   a semiconductor chip module including a plurality of semiconductor chips, each of which is bent and has bonding pads near one lower edge of a declining slope of a first surface thereof and which are stacked on the support member in a step-like shape such that their bonding pads face the first region and are electrically connected with the substrate.

2. The stacked semiconductor package according to claim 1, wherein the substrate further has a plurality of connection pads formed on the upper surface in the first region in such a manner that the connection pads are respectively connected with the bonding pads of the semiconductor chips.

3. The stacked semiconductor package according to claim 2, wherein the substrate further has a plurality of grooves defined on the upper surface in the first region in such a manner that the grooves respectively correspond to the connection pads, and the respective connection pads are disposed on bottoms of corresponding grooves.

4. The stacked semiconductor package according to claim 2, wherein the substrate further has a plurality of grooves defined on the upper surface in the first region in such a manner that each groove corresponds to several connection pads, and the respective connection pads are disposed on bottoms of the grooves to be separated from one another.

5. The stacked semiconductor package according to claim 2, further comprising:
connection members electrically connecting the bonding pads of the semiconductor chips and the connection pads of the substrate.

6. The stacked semiconductor package according to claim 1, wherein the substrate further has a plurality of connection pads formed on the upper surface in the first region in such a manner that each connection pad is connected with bonding pads of the respective semiconductor chips.

7. The stacked semiconductor package according to claim 6, wherein the substrate has a plurality of grooves defined on the upper surface in the first region in such a manner that the grooves correspond to the connection pads, and the connection pads are disposed on bottoms of the grooves.

8. The stacked semiconductor package according to claim 6, further comprising:
connection members electrically connecting the bonding pads of the semiconductor chips and the connection pads of the substrate.

9. The stacked semiconductor package according to claim 8, wherein the connection members are formed to be separated from one another in such a manner that the connection members respectively correspond to the bonding pads of the semiconductor chips.

10. The stacked semiconductor package according to claim 8, wherein the connection members are continuously formed in such a manner that each connection member corresponds to bonding pads of the respective semiconductor chips.

11. The stacked semiconductor package according to claim 1, further comprising:
fixing members formed on second surfaces of the respective semiconductor chips that face the first surfaces of the respective semiconductor chips, to fix the bent semiconductor chips.

12. The stacked semiconductor package according to claim 1, wherein the support member comprises any one of a dummy wafer, a glass substrate, a spacer tape, and a solder resist.

13. The stacked semiconductor package according to claim 1, wherein the support member comprises an additional semiconductor chip.

14. The stacked semiconductor package according to claim 13, wherein the additional semiconductor chip has a thickness different from that of the semiconductor chips.

15. The stacked semiconductor package according to claim 13, wherein the substrate has connection pads formed on the upper surface in the second region and are electrically connected with the additional semiconductor chip.

16. The stacked semiconductor package according to claim 15, wherein the substrate has a protruding part that supports the additional semiconductor chip on the upper surface in the second region outside the connection pads.

17. The stacked semiconductor package according to claim 15, further comprising:
an additional support member formed on the upper surface in the second region of the substrate outside the connection pads, and supporting the additional semiconductor chip.

* * * * *